United States Patent
Nakamura

(10) Patent No.: US 6,576,527 B2
(45) Date of Patent: *Jun. 10, 2003

(54) SEMICONDUCTOR DEVICE AND METHOD FOR FABRICATING THE SAME

(75) Inventor: Shunji Nakamura, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/965,010

(22) Filed: Nov. 5, 1997

(65) Prior Publication Data

US 2001/0044181 A1 Nov. 22, 2001

(30) Foreign Application Priority Data

Nov. 6, 1996 (JP) .............................. 8-293593
Jul. 10, 1997 (JP) .............................. 9-185263

(51) Int. Cl.⁷ ............................................. H01L 21/20
(52) U.S. Cl. ..................... 438/396; 438/253; 438/241; 257/300; 257/306
(58) Field of Search ................. 438/239, 240, 438/243, 250, 253, 396, 637, 638, 675, 241; 257/296, 300, 306, 307

(56) References Cited

U.S. PATENT DOCUMENTS

| | | | | |
|---|---|---|---|---|
| 4,961,165 A | * | 10/1990 | Ema | 365/182 |
| 5,401,681 A | * | 3/1995 | Dennison | 257/296 |
| 5,408,114 A | * | 4/1995 | Kinoshita et al. | 257/296 |
| 5,539,230 A | * | 7/1996 | Cronin | 257/306 |
| 5,668,412 A | * | 9/1997 | Kim | 257/773 |
| 5,739,068 A | * | 4/1998 | Jost et al. | 438/637 |
| 5,773,314 A | * | 6/1998 | Jiang et al. | 438/3 |
| 5,792,681 A | * | 8/1998 | Chang et al. | 438/210 |
| 5,828,092 A | * | 10/1998 | Tempel | 257/295 |
| 5,828,097 A | * | 10/1998 | Tanigawa | 257/306 |
| 5,895,947 A | * | 4/1999 | Lee et al. | 257/303 |
| 6,144,056 A | * | 11/2000 | Manning | 257/303 |
| 6,214,727 B1 | * | 4/2001 | Parekh | 438/618 |
| 6,232,169 B1 | * | 5/2001 | Widemann et al. | 438/243 |

* cited by examiner

Primary Examiner—Amir Zarabian
Assistant Examiner—Jeff Vockrodt
(74) Attorney, Agent, or Firm—Armstrong, Westerman & Hattori, LLP

(57) ABSTRACT

The semiconductor device including a memory cell region and a peripheral circuit region on a semiconductor substrate 10 comprises a transfer transistor formed in the memory cell region, a capacitor constituted by a storage electrode 46 connected to one of diffused layers 20 of the transfer transistor and formed of a first conducting layer, a dielectric film 52 covering a sidewall of the storage electrode 46, and an opposed electrode 56 formed on the dielectric film 52; a conducting plug formed of the first conducting layer and connected to the peripheral circuit region of the semiconductor substrate 10; and a first interconnection 62 electrically connected to the conducting plug 48.

34 Claims, 53 Drawing Sheets

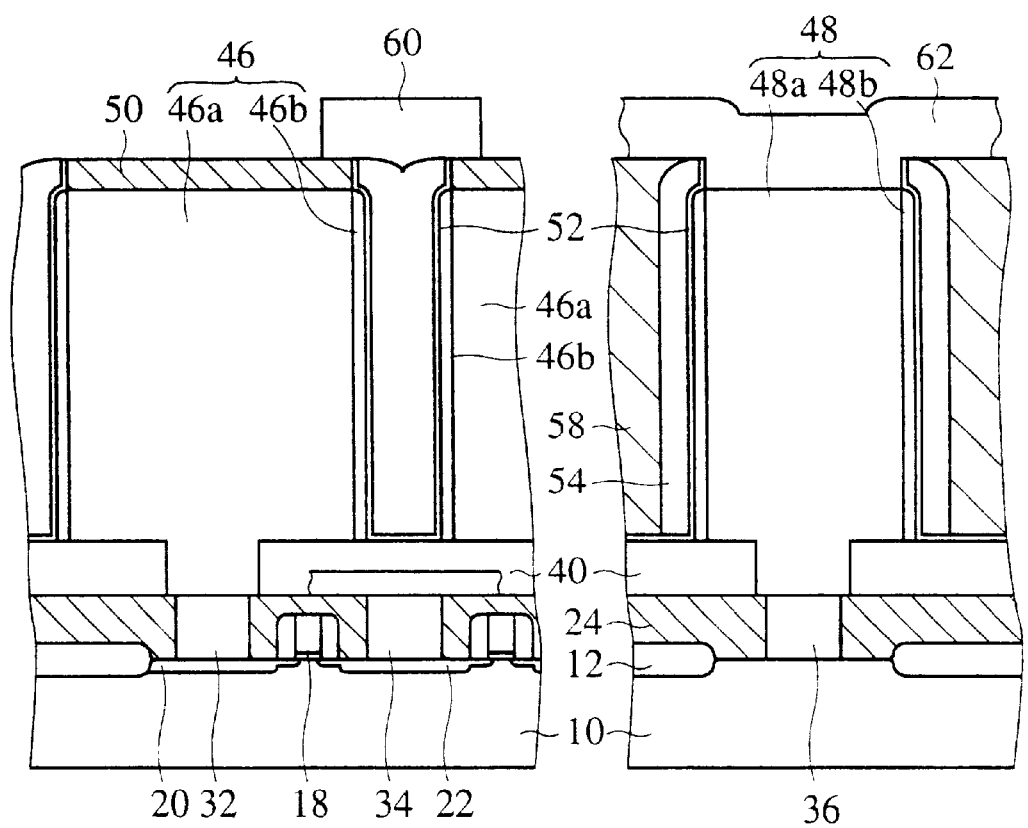

MEMORY CELL REGION          PERIPHERAL CIRCUIT

SEMICONDUCTOR DEVICE AND METHOD FOR FABRICATING THE SAME

BACKGROUND OF THE INVENTION

The present invention relates to a fabrication technology of a semiconductor device, more specifically to a semiconductor device having a DRAM-type memory device and a method for fabricating the same.

A DRAM is a semiconductor memory device which can be formed by one transistor and one capacitor. Various structures for DRAMs of higher density and higher integration, and methods for fabricating DRAMs of such structures have been conventionally studied.

Recently in the field of the fabrication of the DRAM-type semiconductor device the competition among makers has become severe, and it is an important subject how to fabricate DRAM-type semiconductor devices of higher integration and higher achievement at low costs.

To this end, the capacitor requires a simpler structure. Structures which are simple and can secure sufficient capacities are studied. One of such structures of the capacitor uses a pillar-shaped conductor as the storage electrode.

A semiconductor device using the pillar-shaped conductor as the storage electrode will be explained with reference to FIG. 52.

On a semiconductor substrate 10 there are formed source/drain diffused layers independent of each other. A gate electrode 18 is formed on the semiconductor substrate 10 between the source/drain diffused layers 20, 22 through a gate oxide film. Thus a memory cell transistor comprising a gate electrode 18, the source/drain diffused layers 20, 22 is formed.

An inter-layer insulation film 24 with a through-hole formed in above the source/drain diffused layer 20 is formed on the semiconductor substrate 10 with the memory cell transistor formed on.

In the through-hole a storage electrode 46 is formed with the bottom connected to the source/drain diffused layer 20 and protruded onto the inter-layer insulation film 24. An opposed electrode 56 is formed on the upper surface and the sidewalls of the storage electrode 46 through a dielectric film 52, and the storage electrode 46, the dielectric film 52 and the opposed electrode 56 constitute a capacitor.

On the semiconductor substrate 10 with the memory cell transistor and the capacitor interconnections 60, 62 are formed trough an inter-layer insulation film 68. The interconnection 60 is connected to the opposed electrode 56, and the interconnection 62 is connected to the semiconductor substrate 10 in a peripheral circuit region.

Thus a DRAM comprising one transistor and 1 capacitor is formed.

As described above, the conventional semiconductor device shown in FIG. 52 has the storage electrode 46 constituting the capacitor in the simple pillar-shaped structure, which can be easily formed by one film forming step and one patterning step. Thus the capacitor forming step can be drastically simplified, and the forming costs can be accordingly lower.

However, in the conventional semiconductor device using the pillar-shaped storage electrode 46 the memory cell region is higher than the peripheral circuit region by a height of the storage electrode 46, which makes it difficult to open a contact hole for connecting the interconnection 62 to a peripheral circuit.

That is, usually a contact hole for connecting the interconnection to the peripheral circuit is formed through the inter-layer insulation film 48 formed on the storage electrode 46 (FIG. 52). However because of a large height difference of the inter-layer insulation film 68 between the memory cell region and the peripheral region, in simultaneously forming the contact hole to be opened on the opposed electrode 56 and the contact hole to be opened in the peripheral region, a sufficient depth of focus cannot be obtained in the contact hole opening step and the metallization step, which required micronized processing precision. Neither of the two contact holes cannot be correctly formed.

To ensure a sufficient depth of focus, the inter-layer insulation film 68 is planarized by, e.g., CMP (chemical mechanical polishing) method. However, the contact hole in the peripheral circuit region has a very high aspect ration, which makes it difficult to open the contact hole. It also makes it difficult to bury the interconnection in the contact-hole (FIG. 53).

To the semiconductor device fabrication process it is important for lower fabrication costs how to decrease lithography steps, and semiconductor structures and methods for fabricating the same which can decrease lithography steps are needed.

Each lithography step needs a pattern layout which considers a alignment allowance. For micronization of the devices, new means which enables the pattern layout to be conducted without considering the alignment allowance is needed.

SUMMARY OF THE INVENTION

An object of the present invention is to provide a semiconductor device and a method for fabricating the same which can form a memory cell in a simple structure and by a simple fabrication process, and which are superior in alignment with a process for forming a contact hole in a peripheral circuit region.

The above-descried object is achieved by a semiconductor device including a memory cell region and a peripheral circuit region of a semiconductor substrate, comprising: a transfer transistor formed in the memory cell region; a capacitor connected to one of diffused layers of the transfer transistor and including a storage electrode formed of a first conducting layer, a dielectric film covering a sidewall of the storage electrode and an opposed electrode formed on the dielectric film; a first conducting plug formed of the first conducting layer and connected to the peripheral circuit region of the semiconductor substrate; and a first interconnection electrically connected to the first conducting plug. This structure of the semiconductor device allows the region interconnecting the first interconnection and the semiconductor substrate to be raised by the first conducting plug, which makes it unnecessary to open the contact hole deep enough to reach the semiconductor substrate so as to bury the first interconnection, with the result that the etching step and the interconnection forming step can be simple. Also in forming the interconnection connected to the opposed electrode simultaneously with the first interconnection, because the opposed electrode and the first conducting plug are substantially on the same level, the contact hole and the interconnection can be patterned irrespective of depth of focus. Because the first conducting plug can be formed of the same conducting layer as the storage electrode, the first conducting plug can be formed without making fabrication process complicated.

In the above-described semiconductor device, it is preferable that the storage electrode includes a second conducting layer on a surface thereof contacting the dielectric film. This structure of the semiconductor device makes it possible to maintain an operational speed of the semiconductor device without degrading characteristics of the capacitor. That is, it is preferred that the first conducting plug interconnecting the first interconnection and the semiconductor substrate has smaller resistance value because a resistance value of the first conducting plug influences the operational speed of the semiconductor device. On the other hand, it is required that a storage electrode have good compatibility with a dielectric film, and to this end, because the dielectric film and the first conducting plug are formed of the same material, a material thereof must be selected based on both conditions. However, this structure makes it possible to select a material low resistance as a material of the first conducting plug without considering a material of the storage electrode. Thus, without degrading characteristics of the capacitor, the semiconductor device can retain an operational speed.

In the above-described semiconductor device, it is preferable that a plurality of the storage electrodes are provided, and the opposed electrode is buried between said a plurality of the storage electrodes. This structure of the semiconductor device makes it possible to form the opposed electrode by self-alignment with the storage electrode. A lithography step for patterning the opposed electrode is not necessary.

In the above-described semiconductor device, it is preferable that the semiconductor device further comprises, on a sidewall of the first conducting plug, a first insulation film formed of the same insulation layer as the dielectric film, and a sidewall film formed of the same conducting layer as the opposed electrode.

In the above-described semiconductor device, it is preferable that the first conducting plug is crown-shaped.

In the above-described semiconductor device, it is preferable that a second conducting layer is buried in the crown-shaped first conducting plug.

In the above-described semiconductor device, it is preferable that the semiconductor device further comprises a dummy electrode formed of the first conducting layer and insulated from the semiconductor substrate; and a second interconnection connected to the opposed electrode, wherein the opposed electrode is extended on a sidewall of the dummy electrode or on the dummy electrode, and the second interconnection is connected to the opposed electrode at a region where the dummy electrode is provided. This structure of the semiconductor device facilitates connection of the second interconnection to the opposed electrode without short-circuiting with the storage electrode.

In the above-described semiconductor device, it is preferable that the first interconnection is a buried interconnection buried in a second insulation film formed on the first conducting plug. The first interconnection can be a buried interconnection.

In the above-described semiconductor device, it is preferable that a cavity is formed in a peripheral part of the first conducting plug. This structure of the semiconductor device makes it possible to reduce parasitic capacitance between the interconnections.

In the above-described semiconductor device, it is preferable that the semiconductor device further comprises: a second conducting plug connected to the other diffused layer of the transfer transistor and formed of the first conducting layer; and a bit line electrically connected to the second conducting plug. This structure allows the second conducting plug to be used for the connection between the second conducting plug and the transfer transistor.

In the above-described semiconductor device, it is preferable that the semiconductor device further comprises: an annular dummy electrode provided around the memory cell region and surrounding the same.

In the above-described semiconductor device, it is preferable that the annular dummy electrode is formed of the first conducting layer.

In the above-described semiconductor device, it is preferable that the semiconductor device further comprises: a third insulation film selectively covering a surface of the opposed electrode; and a third interconnection arranged on the capacitor, the third interconnection being insulated from the opposed electrode by the third insulation film. This structure of the semiconductor device keeps the interconnection of the capacitor from connecting to the opposed electrode, which permits the interconnection for connecting to the peripheral circuit region can be extended on the memory cell region. Thus, the layout of the interconnection of a peripheral circuit can have high freedom degree, and accordingly the semiconductor device can have improved integration.

The above-described object can be also achieved by a method for fabricating a semiconductor device comprising: a storage electrode forming step of forming a plurality of storage electrodes on a base substrate; a dielectric film forming step of forming a dielectric film covering said a plurality of storage electrodes; and an opposed electrode forming step of depositing and etching back a first conducting film on the base substrate with the dielectric film formed on to form an opposed electrode filled between said a plurality of storage electrodes covered with the dielectric film and formed of the first conducting film. This fabrication of the semiconductor device makes it possible to form the opposed electrode by self-alignment with the storage electrode, which allows a lithography step required to form an opposed electrode by the conventional semiconductor device fabrication method to be omitted.

The above-described object can be also achieved by a method for fabricating a semiconductor device comprising: a storage electrode forming step of forming a plurality of storage electrodes in a first region of a base substrate and forming a first pillar-shaped conductor formed of the same conducting layer as the storage electrodes in a second region of the base substrate; a dielectric film forming step of forming a dielectric film covering said a plurality of storage electrodes; an opposed electrode forming step of depositing and etching back a first conducting film on the base substrate with the dielectric film formed on to form an opposed electrode filled between said a plurality of storage electrodes covered with the dielectric film and formed of the first conducting film; and an interconnection forming step of forming a first interconnection on the first pillar-shaped conductor and connected to the base substrate in the second region through the first pillar-shaped conductor. This fabrication of the semiconductor device allows the region interconnecting the first interconnection and the semiconductor substrate to be raised by the first pillar-shaped conductor. Because the pillar-shaped conductor can be formed of the same conducting layer as the storage electrode, the pillar-shaped conductor can be formed without making fabrication process complicated. Because the opposed electrode can be formed by self-alignment with the storage electrode, a lithography step for patterning the opposed electrode is not necessary.

In the above-described method for fabricating a semiconductor device, it is preferable that in the opposed electrode forming step, a sidewall film formed of the first conducting film and formed on a sidewall of the first pillar-shaped conductor is further formed.

In the above-described method for fabricating a semiconductor device, it is preferable that the method further comprises after the opposed electrode forming step: a first insulation film forming step of depositing a first insulation film; and a first insulation film removing step of removing the first insulation film until top surfaces of the storage electrodes and of the pillar-shaped conductor are exposed. This fabrication of the semiconductor device exposes by self-alignment the first pillar-shaped conductor on the surface of the first insulation film, which makes it unnecessary to open by lithography a new contact hole which reaches the first pillar-shaped conductor, and makes it possible to form the interconnection connected to the base substrate without disalignment.

In the above-described method for fabricating a semiconductor device, it is preferable that in the storage electrode forming step, the storage electrodes and the first pillar-shaped conductor having the top surfaces covered with a cap film are formed; and in the first insulation film removing step, the first insulation film is removed until a top surface of the cap film is exposed. This fabrication exposes self-alignment the opposed electrode on the surface of the first insulation film, which makes it possible to for the interconnection connected to the base substrate without forming a new contact hole.

In the method for fabricating a semiconductor device, it is preferable that the method further comprises after the first insulation film removing step: a cap film removing step of removing the cap film on the first pillar-shaped conductor to expose the first pillar-shaped conductor. This fabrication of the semiconductor device makes it possible to form by self-alignment the contact hole exposing the first pillar-shaped conductor. The cap film is formed of an insulating material, and the cap film in the memory cell-region is selectively left on, whereby the opposed electrode alone can be exposed in the memory cell region. Thus, the interconnection formed in the memory cell region can be connected only to the opposed electrode without interposing the interlayer insulation film.

In the above-described method for fabricating a semiconductor device, it is preferable that the method further comprises after the first insulation film removing step: a second insulation film forming step of depositing a second insulation film; and an opening forming step of forming a first opening opened on the first pillar-shaped conductor in the second insulation film. This fabrication of the semiconductor device makes it also possible that the first interconnection is connected to the first pillar-shaped conductor through the first opening formed in the second insulation film.

In the above-described method for fabricating a semiconductor device, it is preferable that in the storage electrode forming step, a second pillar-shaped conductor which is not electrically connected to the base substrate and spaced from the storage electrodes by a prescribed interval, and are formed of the same conducting layer as the first pillar-shaped conductor is formed in a third region adjacent to the first region; and in the opening forming step, a second opening formed in the second insulation film on the opposed electrode near the second pillar-shaped conductor. This fabrication of the semiconductor device can prevents the second opening formed in the second insulation film from extending on the storage electrode. Thus, the lithography step for forming the second opening can be simplified.

In the above-described method for fabricating a semiconductor device, it is preferable that the method further comprises after the first insulation film removing step: a second insulation film forming step of depositing a second insulation film; and an opening forming step of forming a second opening opened on the opposed electrodes in the second insulation film.

In the above-described method for fabricating a semiconductor device, it is preferable that the method further comprises after the first insulation film removing step: a second insulation film forming step of chemically or thermally treating a surface of the opposed electrode to form a second insulation film on the surface of the opposed electrode. This fabrication of the semiconductor device makes it possible the interconnection can be formed on the memory cell region, insulated from the opposed electrode.

In the method for fabricating a semiconductor device, it is preferable that in the storage electrode forming step, a second pillar-shaped conductor formed of the same conducting layer as the first pillar-shaped conductor, and spaced from the storage electrodes at a prescribed interval and not connected electrically to the base substrate is further formed in a third region adjacent to the first region; and which further comprises after the second insulation film forming step, an opening forming step of forming a second opening formed in the second insulation film on the opposed electrode near the second pillar-shaped conductor. This fabrication of the semiconductor device can prevent the second opening for forming the insulation film from extending on the storage electrode. Thus, the lithography step for forming the second opening can be made simple.

In the method for fabricating the semiconductor device, it is preferable that the first opening is an interconnection groove for burying an interconnection in the insulation film. The first interconnection is a buried interconnection buried in the second insulation film.

In the method for fabricating the semiconductor device, it is preferable that the method further comprises after the storage electrode forming step: a conducting film forming step of forming a second conducting film on sidewalls of the storage electrodes. Because by providing the second conducting film on the sidewalls of the storage electrode, a material of the storage electrode does not influence characteristics of the dielectric film, the storage electrode can be formed of a material having a desirable low resistance which is suitable for the first pillar-shaped conductor.

The above-described object can be also achieved by a method for fabricating a semiconductor device comprising: a pillar-shaped conductor forming step of forming a pillar-shaped body formed in a first region of a base substrate and formed of a first conducting layer and a second conducting layer laid the latter on the former, and forming a first pillar-shaped conductor connected to a second region of the base substrate and formed of a first conducting layer and a second conducting layer laid the latter on the former; a sidewall film forming step of forming a sidewall film formed of a third conducting film on a sidewall of the pillar-shaped body and the first pillar-shaped conductor; a storage electrode forming step of selectively removing the second conducting film forming the pillar-shaped body and forming a crown-shaped storage electrode of the first conducting film and the sidewall in the first region; a dielectric film forming step of forming a dielectric film for covering the storage electrodes; an opposed electrode forming step of depositing and patterning a fourth conducting film on the base substrate with the dielectric film formed on and forming an opposed electrode covering the storage electrodes through the dielectric film; and an interconnection forming step of forming a first interconnection on the first pillar-shaped conductor and connected to the base substrate in the second region through the first pillar-shaped conductor. This fabrication of the semiconductor device can raise the region interconnecting the first interconnection and the base substrate by the first pillar-shaped conductor, which makes it unnecessary to make the contact hole deep enough to reach the semiconductor substrate to bury the first interconnection. Accordingly the etching step and the interconnection forming step can be simplified. The crown-shaped storage electrode can be formed simultaneously with the formation of the first pillar-shaped conductor, which makes it possible to form the pillar-shaped conductor without complicating fabrication process. By using the crown-shaped capacitor, a height of the storage electrode and the first pillar-shaped conductor can be reduced to about a half, and accordingly the first pillar-shaped conductor can have reduced electric resistance.

The above-described object can be also achieved by a method for fabricating a semiconductor device comprising: a pillar-shaped conductor forming step of depositing and patterning a first conducting film on a base substrate and forming the first conducting film having an opening on a first region of the base substrate and having a first pillar-shaped conductor on a second region of the base substrate; a second conducting film forming step of forming a second conducting film on the first conducting film and the base substrate; a second conducting film removing step of removing the second conducting film, leaving the second conducting film on a inside wall and a bottom surface of the opening and on a sidewall of the first pillar-shaped conductor, and forming a storage electrode extended from the bottom surface of the opening to the inside wall of the opening, and a sidewall film formed on the sidewall of the first pillar-shaped conductor; a first conducting film removing step of removing the first conducting film except the first conducting film formed in the second region; a dielectric film forming step of forming a dielectric film covering a surface of the storage electrode; an opposed electrode forming step of depositing and patterning a fourth conducting film on the base substrate with the dielectric film formed on, and forming an opposed electrode covering the storage electrode through the dielectric film; and an interconnection forming step of forming a first interconnection formed on the first pillar-shaped conductor, and connected to the base substrate in the second region through the first pillar-shaped conductor. This fabrication of the semiconductor device can raise the region interconnecting the first interconnection and the base substrate by the first pillar-shaped conductor, which makes it unnecessary to make the contact hole deep enough to reach the semiconductor substrate to bury the first interconnection. Accordingly the etching step and the interconnection forming step can be simplified. The crown-shaped storage electrode can be formed simultaneously with the formation of the first pillar-shaped conductor, which makes it possible to form the pillar-shaped conductor without complicating fabrication process. By using the crown-shaped capacitor, a height of the storage electrode and the first pillar-shaped conductor can be reduced to about a half, and accordingly the first pillar-shaped conductor can have reduced electric resistance.

In the above-described method for fabricating a semiconductor device, it is preferable in which in the pillar-shaped conductor forming step, the first pillar-shaped conductor having a top surface covered with a cap film is formed; and the method further comprises after the opposed electrode forming step: a first insulation film forming step of depositing a first insulation film; a fist insulation film removing step of removing the first insulation film until a top surface of the cap film is exposed; and a cap film removing step of removing the cap film on the first pillar-shaped conductor to expose the first pillar-shaped conductor. This fabrication of the semiconductor device makes it possible to form by self-alignment the contact hole for exposing the first pillar-shaped conductor.

In the above-described method for fabricating a semiconductor device, it is preferable that in the pillar-shaped conductor forming step, the cap film is formed of a fifth conducting film having substantially the same etching characteristics as the first conducting film, and a mask film to be a mask for processing the second conducting film formed on the fifth conducting film; and in the cap film removing step, the mask film is removed to expose the fifth conducting film on the first pillar-shaped conductor. This fabrication of the semiconductor device makes it possible that even in a case that the second conducting film is formed of a material which is difficult to have a selective ratio with respect to the resist film, the second conducting film can be processed stably to form the storage electrode and the first pillar-shaped conductor. Because the fifth conducting film is formed of a film having substantially the same etching characteristics as the first conducting film, the storage electrode and the first conducting film forming the first pillar-shaped conductor can be processed simultaneously with the removal of the fifth conducting film ont eh storage electrode.

In the above-described method for fabricating a semiconductor device, it is preferable that the method further comprises after the first insulation film removing step: a second insulation film forming step of depositing a second insulation film; and an opening forming step of forming in the second insulation film a first opening formed on the first pillar-shaped conductor, in the cap film removing step, the cap film exposed in the first opening is removed. This fabrication of the semiconductor device makes it possible to connect the first interconnection to the first pillar-shaped conductor through the second insulation film.

In the above-described method for fabricating a semiconductor device, it is preferable that in the pillar-shaped conductor forming step, a second pillar-shaped conductor formed of the same conducting layer as the first pillar-shaped conductor, and spaced from the storage electrode by a prescribed interval and not connected electrically to the base substrate is formed in a third region adjacent to the first region; and in the opening forming step, a second opening opened on the opposed electrode near the second pillar-shaped conductor is formed in the second insulation film. This fabrication of the semiconductor device makes it possible that the second opening for connecting the interconnection to the opposed electrode is opened easily and simultaneously with the first opening.

In the method for fabricating a semiconductor device, it is preferable that the formation of the first opening and the second opening in the opening forming step and the removal of the cap film in the cap film removing step are conducted with one resist pattern as a mask. This fabrication of the semiconductor device makes it possible that the formation of the first opening and the second opening, and the removal of the cap film can be conducted with one resist pattern as a mask. Accordingly the contact hole for exposing the opposed electrode and the first pillar-shaped conductor can be formed without complicating fabrication process.

In the above-described method for fabricating a semiconductor device, it is preferable that in the interconnection forming step, a second interconnection connected to the opposed electrode is further formed.

The above-described object can be also achieved by a method for fabricating a semiconductor device comprising: an insulation film forming step of forming an insulation film on a base substrate; a storage electrode forming step of forming a storage electrode buried in the insulation film and buried in a first opening formed in a first region, and a first pillar-shaped conductor buried in the insulation film and buried in a second opening formed in a second region; an insulation film removing step of selectively removing the insulation film in the first region to expose a sidewall of the storage electrode; a dielectric film forming step of forming a dielectric film for covering a surface of the storage electrode; a opposed electrode forming step of forming an opposed electrode on the surface of the storage electrode through the dielectric film; and an interconnection forming step of forming a first interconnection disposed on the first pillar-shaped conductor and connected to the base substrate in the second region through the first pillar-shaped conductor. The storage electrode and the first pillar-shaped conductor are formed by forming openings in the insulation film having good global flatness and burying the conducting film in the opening, so that the surface flatness of the insulation film can be more improved than in the case that the storage electrode and the first pillar-shaped conductor are formed before forming the insulation film.

In the above-described method for fabricating a semiconductor device, it is preferable that in the storage electrode forming step, an annular dummy electrode disposed around the first region and surrounding the same, and buried in a third opening formed in the insulation film is further formed; and in the insulation film removing step, the insulation film in the first region is selectively removed with the annular dummy electrode as a stopper. As in the case that the insulation film is formed prior to the formation of the storage electrode and the pillar-shaped conductor, a space for burying the opposed electrode can be selectively formed in the insulation film, because the annular dummy electrode is disposed around the first region and surrounding the same.

In the above-described method for fabricating a semiconductor device, it is preferable that in the storage electrode forming step, the first opening, the second opening and the third opening are concurrently formed, and the storage electrode, the first pillar-shaped conductor and the annular dummy electrode are formed of the same conducting layer. The storage electrode, first pillar-shaped conductor and annular dummy electrode can be formed simultaneously so that the fabrication process can be rationalized.

In the above-described method for fabricating a semiconductor device, it is preferable that in the storage electrode forming step, the first opening, the second opening and the third opening are formed at different times, and the storage electrode, the first pillar-shaped conductor and the annular dummy electrode are formed of conducting layers different form each other, whereby the storage electrode and the first pillar-shaped conductor can be formed by different materials each other.

In the above-described method for fabricating a semiconductor device, it is preferable that in the insulation film removing step, the insulation film is removed with a mask member, as a mask, for exposing at least a partial region of the insulation film in the first region, whereby the alignment precision of the lithography step can made rough. Thus, the lithography step can be simplified.

In the above-described method for fabricating a semiconductor device, it is preferable that in the insulation film removing step, the insulation film is removed by wet etching, in which etching isotropically advances, whereby all the insulation film in the first region can be selectively etched by using the mask for exposing at least a partial region of the insulation film in the first region.

In the above-described method for fabricating a semiconductor device, it is preferable that the method further comprising after the storage electrode forming step: a first conducting film replacing step of replacing the first conducting film forming the first pillar-shaped conductor by a third conducting film of lower resistance value by the time when the processing arrives at the interconnection forming step. This fabrication of the semiconductor device makes it possible that the first pillar-shaped conductor is selectively replaced by a low-resistance material in a later step even in a case that the storage electrode and the first pillar-shaped conductor are formed of a high-resistance material having good compatibility with the dielectric film.

In the above-described method for fabricating a semiconductor device, it is preferable that in the first conducting film replacing step, the first conducting film of polycrystalline silicon film is exposed to $WF_6$ gas to replace the first conducting film with a third conducting film formed of tungsten film.

In the above-described method for fabricating a semiconductor device, it is preferable that in the interconnection forming step, the second interconnection connected to the opposed electrode is further formed. This fabrication of the semiconductor device makes it possible that the second interconnection connected to the opposed electrode is formed simultaneously with the first interconnection connected to the first pillar-shaped conductor.

In the above-described method for fabricating a semiconductor device, it is preferable that the first opening is an interconnection groove for burying the interconnection in the second insulation film. This fabrication of the semiconductor device makes it possible that the first interconnection is a buried interconnection buried in the second insulation film.

In the above-described method for fabricating a semiconductor device, it is preferable that the method further comprises after the first insulation film forming step: a sidewall film removing step of removing the sidewall film and forming a cavity between the first insulation film and the first pillar-shaped conductor. This fabrication of the semiconductor device makes it possible that the cavity is formed in a peripheral part of the first pillar-shaped conductor. This reduce parasitic capacitance between the interconnections.

BRIEF DESCRIPTION OF THE DRAWINGS

FIG. 7 is a diagrammatic sectional view of the semiconductor device according to a second embodiment of the present invention.

DETAILED DESCRIPTION OF THE INVENTION

[A First Embodiment]

The semiconductor device according to a first embodiment and the method for fabricating the same will be explained with reference to FIGS. 1A–1C, 2A–2E, 3A–3C and 4A–4B.

Figure 1A:
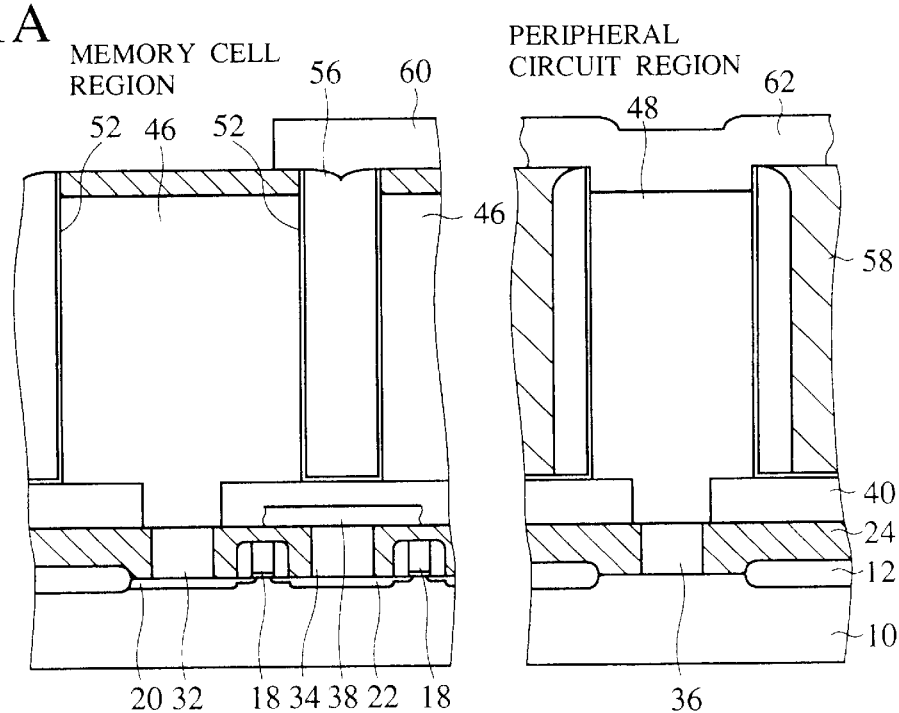
FIGS. 1A and 1B are sectional views of the semiconductor device according to a first embodiment of the present invention, which show a structure of the semiconductor device.
Figure 1B:
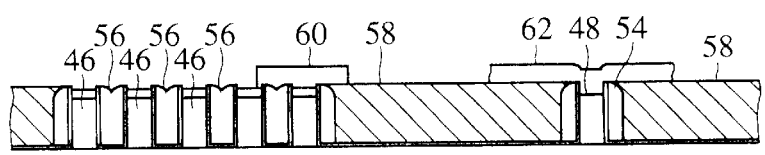
Figure 1C:
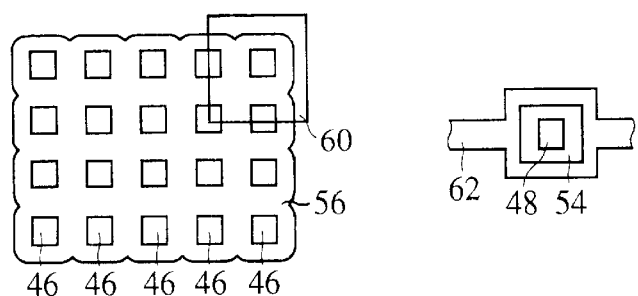
FIG. 1C is a plan view of the semiconductor device according to a first embodiment of the present invention, which show a structure of the semiconductor device.

FIGS. 1A–1C show a plan view and sectional views of the semiconductor device according to the present embodiment, which explain a structure thereof. FIGS. 2A–2E, 3A–3C and 4A–4B are sectional views of the semiconductor device according to the present embodiment at the steps of the method for fabricating the semiconductor device, which explain the method.

First, the structure of the semiconductor memory device according to the present embodiment will be explained with reference to FIGS. 1A–1C. FIG. 1A is an enlarged sectional view of the semiconductor device according to the present embodiment, which shows the structure thereof. FIG. 1B is a sectional view of the semiconductor device according to the present embodiment over a large area. FIG. 1C is a plan view of the semiconductor device according to the present embodiment, which shows the structure thereof.

Source/drain diffused layers 20, 22 are formed independent of each other in set regions on a semiconductor substrate 10 defined by a device isolation film 12. A gate electrode 18 is formed on the semiconductor substrate 10 through a gate oxide film between the source/drain diffused layers 20, 22. Thus a memory cell transistor comprising the gate electrode 18 and the source/drain diffused layers 20, 22 is formed. The gate electrode 18 is arranged in a direction normal to the device region and functions as a word line which functions as the gate electrodes of the memory cell transistors of the rest plural memory cells.

On the semiconductor substrate 10 on which the memory cell transistor is formed on an inter-layer insulation film 24 with a plug 32 buried in on the source/drain diffused layer 20 and a plug 34 buried in on the source/drain diffused layer 22.

In the actual device structure, however, the plug 32 and the plug 34 sometimes are not present on one section cleaved in plane, but for the convenience of explanation, in the specification the plugs are shown in one sectional view.

A bit line 38 is formed on the plug 34 and is connected to the source/drain diffused layer 22 through the plug 34. In FIG. 1A only the contact portion of the bit line 38 is shown, but in a prescribed region perpendicular to the sheet is extended in the direction of intersection with the gate electrode (word line) 18.

An inter-layer insulation film 40 is formed on the semiconductor substrate 10 with the bit line 38 formed on. On the inter-layer insulation film 40 a pillar-shaped storage electrode 46 which is connected to the plug 32 through the inter-layer insulation film 40 and is protruded onto the inter-layer insulation film 40 is formed. An opposed electrode 56 is formed on the sidewalls of the storage electrode 46 through a dielectric film 52. The opposed electrodes 56 bury gaps between adjacent storage electrodes 46. Thus a capacitor comprising the storage electrode 46, the dielectric film 52 and the opposed electrode 56 is formed.

An interconnection 60 connected to the opposed electrode 60 is formed on the opposed electrode 56. Thus a DRAM comprising one transistor and one capacitor is formed.

This unit cells are provided adjacent to each other in a memory cell region (FIG. 1B). The opposed electrodes 56 forms a mesh structure enclosing the storage electrodes 46 (FIG. 1C). To simplify the drawing, FIG. 1B shows only the structure upper of the storage electrode 46.

On the other hand, in a peripheral circuit region adjacent to the memory cell region, a pillar-shaped conductor 48 connected to the semiconductor substrate 10 through the plug 36 is formed on the inter-layer insulation film 40 to function to electrically connect an interconnection 62 formed on the pillar-shaped conductor 48 to the semiconductor substrate 10. The pillar-shaped conductor 48 is formed of the same conductor layer as the storage electrode 46.

Next, the method for fabricating the semiconductor device according to the present embodiment will be explained with reference to FIGS. 2A–2E, 3A–3C and 4A–4B.

First, the device isolation film 12 is formed on the primary surface of the semiconductor substrate 10 by, e.g., the usual LOCOS (LOCal Oxidation of Silicon) method to define the device regions 14, 16. Here the device region 14 indicates the memory cell region where the memory cells are formed, and the device region 16 indicates the peripheral circuit region where a peripheral circuit is formed.

Figure 2A:
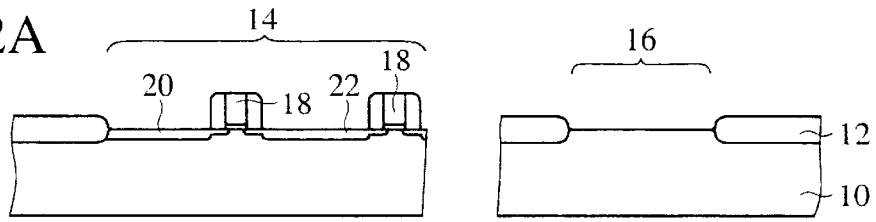
FIGS. 2A–2E, 3A–3C and 4A–4B are sectional views of the semiconductor device according to the first embodiment of the present invention in the steps of the method for fabricating the same, which explain the method.

Then, the memory cell transistors are formed in the device region 14 by, e.g., the usual MOS transistor forming method. The gate electrodes 18 of the memory cell transistors function as word lines connected to the gate electrodes of the adjacent memory cell transistors (not shown) (FIG. 2A).

In FIG. 2, no devices, such as transistors, are formed in the device region 16, but the present embodiment is applicable to a case that devices are formed in the device region 16. The device regions 14, 16 may be provided in wells formed in the semiconductor substrate 10, and the source/drain diffused layers 20, 22 do not have essentially the shown LDD structure.

Figure 2B:
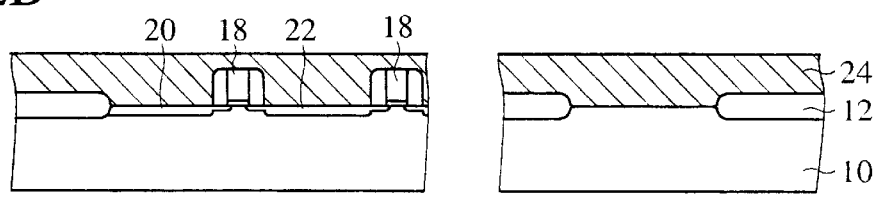

Subsequently, an about 300 nm-thick silicon oxide film is deposited by, e.g., CVD (Chemical Vapor Deposition) method, and the surface of the silicon oxide film is polished by CMP method. Thus the inter-layer insulation film 24 having the surface planarized is formed (FIG. 2B). The inter-layer insulation film 24 may be deposited by other methods. The surface of the inter-layer insulation film 24 may be planarized by the use of SOG film, reflow or other means.

Figure 2C:
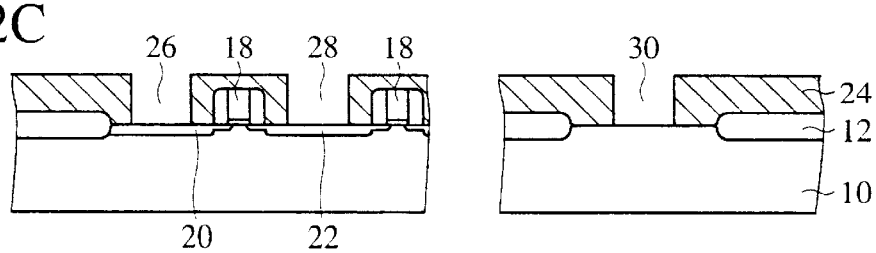

Then, the through-holes 26, 28 opened on the source/drain diffused layers 20, 22, and the through-hole 30 on the device region 16 are formed by the usual lithography and etching (FIG. 2C).

Figure 2D:
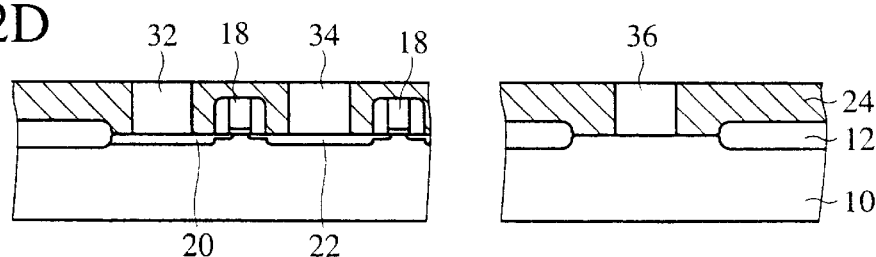

Then, the plugs 32, 34, 36 are buried respectively in the through-holes 26, 28, 30 opened in the inter-layer insulation film 24 (FIG. 2D). For example, polycrystalline silicon film is deposited by CVD method and etched back to leave the polycrystalline silicon only in the through-holes 26, 28, 30, and then the polycrystalline silicon film is doped by ion implantation to lower the resistance. Thus the plugs 32, 34, 36 are formed. The plugs 32, 34, 36 are not essentially formed, and are formed as required by a device structure or processing conditions.

Etching-back is generally a technique for etching the entire surface of a deposited film to planarize the surface of the film or bury a conducting film. In the specification of the present application etching-back is inclusive of even means for removing the entire surface to thereby produce the same effect. That is, the etching-back in the present specification includes the technique for dry-etching the entire surface, the technique for polishing the entire surface by CMP or others, and other techniques.

Figure 2E:
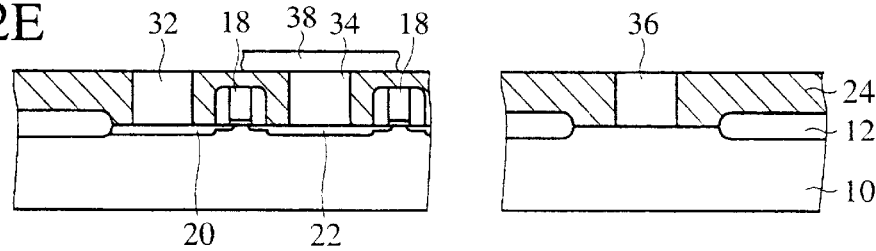

Then, the bit line 38 connected to the source/drain diffused layer 22 through the plug 34 is formed on the inter-layer insulation film 24 (FIG. 2E). FIG. 2E shows the contact portion of the bit line 38 connected to the source/drain diffused layer 22, but in a prescribed region perpendicular to the sheet the bit line 38 is extended in the direction of intersection with the word line.

Figure 3A:
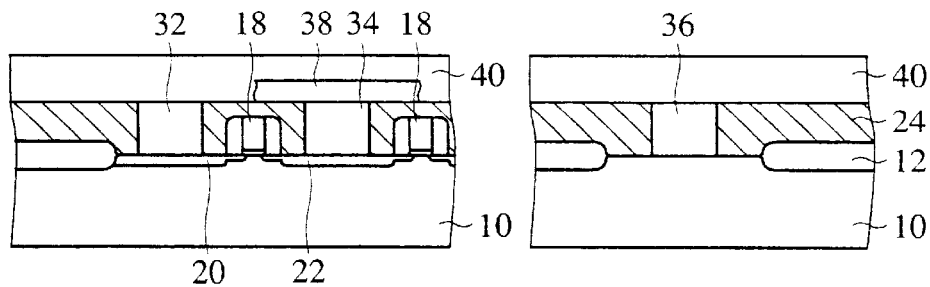

Then, an about 300 nm-thick silicon oxide film is deposited by, e.g., CVD method, and the surface of the silicon oxide film is polished by CMP method. Thus the inter-layer insulation film 40 having the surface planarized is formed (FIG. 3A). The inter-layer insulation film 40 may be deposited by other means. The surface of the inter-layer insulation film 40 may be planarized by SOG film, reflow or other means.

Figure 3B:
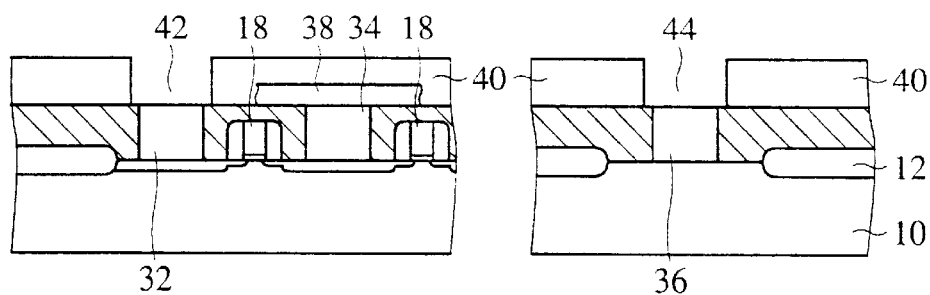
Figure 3C:
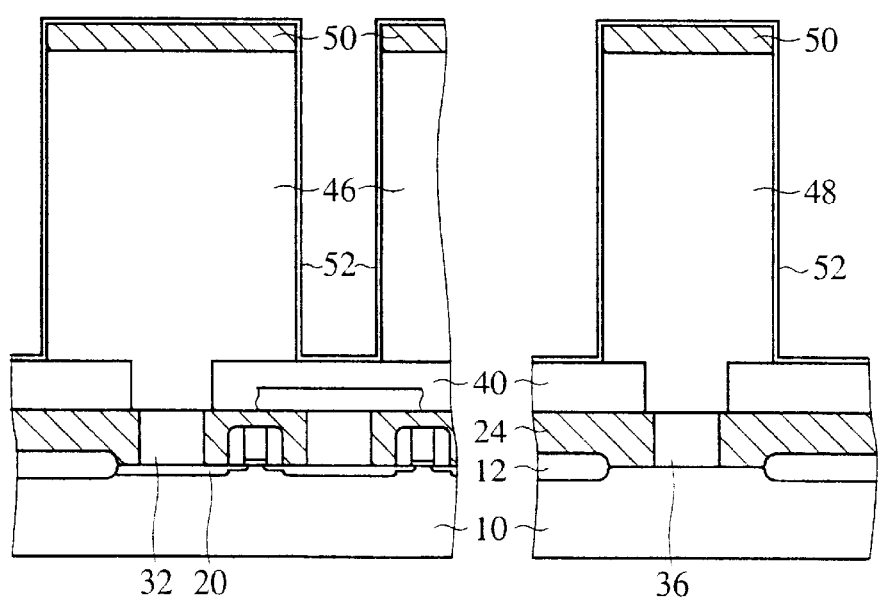

Then, the through-hole 42 opened on the plug 32 and the through-hole 44 opened on the plug 36 are formed by the usual lithography and etching (FIG. 3B).

In the present embodiment, the plugs 32, 36 are in advance buried in the through-holes 26, 30, but the inter-layer insulation film 24 may be etched concurrently with opening the through-holes 42, 44. That is, the inter-layer insulation film 40 and the inter-layer insulation film 24 are continuously etched to open the through-hole 42 down to the source/drain diffused layer 20 and the through-hole 44 down to the device region 16.

Then, an about 1.5 $\mu$m-thick doped polycrystalline silicon film is deposited by, e.g., CVD method. The polycrystalline silicon film is to patterned in a later step to be the storage electrode. It is preferable that an thickness of the polycrystalline silicon film is adjusted suitably corresponding to a required capacitance of the capacitor.

A silicon nitride film is deposited on the polycrystalline silicon film by, e.g., CVD method.

The silicon nitride film and the polycrystalline silicon film are processed in the same pattern by the usual lithography and etching to form the pillar-shaped storage electrode 46 connected to the plug 32 and the pillar-shaped conductor 48 connected to the plug 36. The tops of the thus-formed storage electrode 46 and of the pillar-shaped conductor 48 are covered with a cap film 50 of the silicon nitride film. A gap between the storage electrodes 46 is, e.g., 0.15 $\mu$m, and a gap of, e.g., above 0.3 $\mu$m is ensured between the pillar-shaped conductors 48.

Next, a silicon nitride film is formed by, e.g., CVD method, and the surface of the silicon nitride film is oxidized in a pyrogenic atmosphere to form the dielectric film 52 in, e.g., an about 0.1–4 nm-thick converted to an oxide film. The storage electrodes 46 and the pillar-shaped conductors 48 are covered with the dielectric film 52.

In the present embodiment, the dielectric film 52 is the silicon oxynitride film but may be other dielectric films. Especially by using a film having a higher dielectric constant than the silicon oxynitride film, a larger capacitance per a unit area is obtained, which makes it possible to reduce a height of the storage electrode 46. This facilitates patterning of the storage electrode 46. A height of the pillar-shaped conductor 48 is reduced, which can reduce resistance of the interconnection in the peripheral circuit region.

Then, an about 100 nm-thick doped polycrystalline silicon film is deposited by, e.g., CVD method and is anisotropically etched to form the sidewall films 54 of the polycrystalline silicon film on the sidewalls of the storage electrode 46 and the pillar-shaped conductor 48.

In the memory cell region where a gap between the storage electrodes 46 is as small as about 0.15 $\mu$m, the sidewall films 54 formed between the adjacent storage electrodes 46 are connected to each other, whereby the conductor buried in the storage electrodes 46 in a mesh structure is formed. Thus the opposed electrodes 56 of the mesh structure are formed (see FIG. 1C).

Thus, the sidewall films 54 are left only on the sidewalls of the structures of the storage electrode 46, the pillar-shaped conductor 48, etc., and accordingly the sidewall films 54 are absent in regions remote from the structures by a distance larger than a width of the sidewall films. Accordingly it is not necessary to separately pattern the opposed electrode 56 after the formation of the sidewall films 54. That is, the opposed electrode 56 can be formed in such a manner as self-alignment with respect to the storage electrode 46 without a lithography step for patterning the opposed electrode 56. No lithography with a large depth of focus for a high aspect ratio is unnecessary.

To thus form the opposed electrode 56 by self-alignment, it is preferable to adjust a gap of the storage electrodes 46 and a film thickness of the polycrystalline silicon film so that the sidewall films 54 are completely buried in the gaps between the adjacent storage electrodes 46.

On the other hand, in the peripheral circuit region, the pillar-shaped conductors 48 are arranged at a gap larger than a width of the sidewall films 54, so that the sidewall films 54 are formed, surrounding the pillar-shaped conductors 48, but the sidewall films 54 surrounding each pillar-shaped conductor 48 are not connected to the sidewall films (not shown) of its adjacent pillar-shaped conductor 48.

In the present embodiment, the pillar-shaped conductors 48 are arranged, spaced from each other by a prescribed gap because there is a risk that the sidewall films 54 buried between the adjacent pillar-shaped conductors 48 may cause capacitance-coupling between the pillar-shaped conductors 48 through the dielectric films 52 and the sidewall films 54 and cause adverse influences, such as interconnection delay, etc.

Figure 4A:
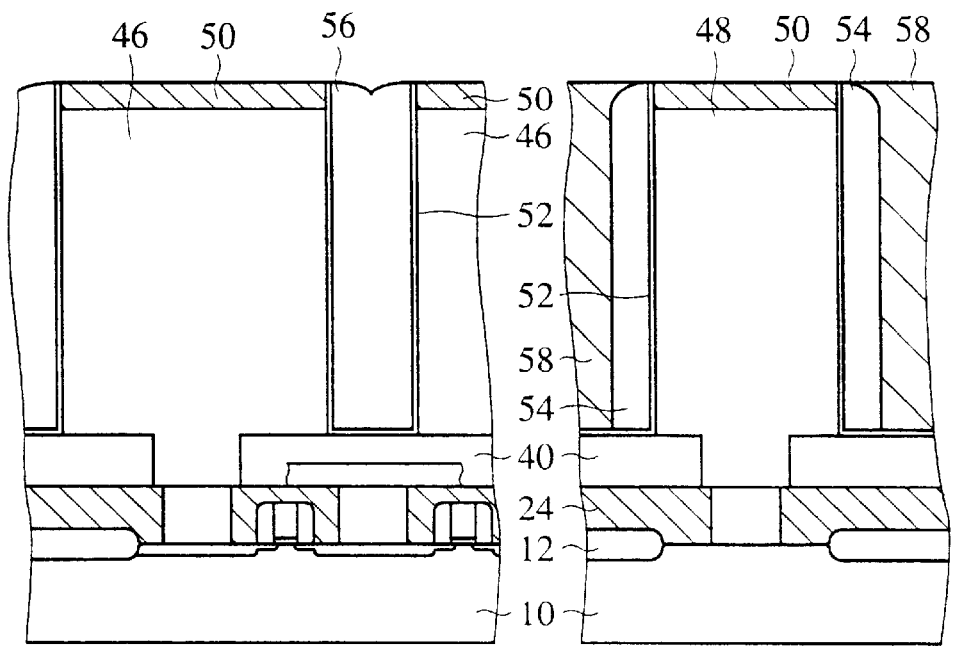

Then an about 0.2 $\mu$m-thick silicon oxide film is deposited by, e.g., CVD method, and the surface of the silicon oxide film is polished by CMP method. Thus the inter-layer insulation film 58 having the surface planarized is formed (FIG. 4A). The cap film 50 of the silicon nitride film formed on the storage electrode 46 and the pillar-shaped conductor 48 is used as the etching stopper for the etching to finish the polishing with good controllability.

The cap film 50 on the pillar-shaped conductor 48 is selectively removed by the usual lithography and etching, and the opposed electrode 56 and the pillar-shaped conductor 48 are exposed on the surface of the substrate. The cap film 50 of silicon nitride film is immersed in, e.g., boiled phosphoric acid to be etched.

In etching using phosphoric acid, a resist film used as a mask is sometimes solved together. In such case, thin silicon oxide film is deposited directly below the resist film and is processed in the same pattern as the resist film, whereby the cap film 50 can be etched with the silicon oxide film as a mask.

In the conventional fabrication method for semiconductor devices, the contact hole in the peripheral circuit region is opened in alignment with the planarized surface by the polishing. However, the planarized surface by the polishing makes it difficult to read alignment marks of a ground pattern. Accordingly contact holes cannot be opened with good precision with respect to the ground pattern.

However, in the method for fabricating the semiconductor device according to the present embodiment, a rough alignment of covering the entire memory cell region with a resist is sufficient, which allows the resist to be patterned even on the planarized surface without difficulty.

In the method for fabricating the semiconductor device according to the present embodiment, the cap film 50 is simply etched to thereby open the contact holes by self-alignment with respect to the ground pattern. In the conventional semiconductor device shown in FIG. 43, it is difficult due to the depth of focus problem that the contact holes in the memory cell region and the contact hole in the peripheral region are concurrently opened. However, the semiconductor device according to the present embodiment has no step between the memory cell region and the peripheral circuit region, and is free from the depth of focus problem. In addition, the contact hole in the peripheral circuit region can be opened without lithography step, and the fabrication process can be much simplified.

Figure 4B:
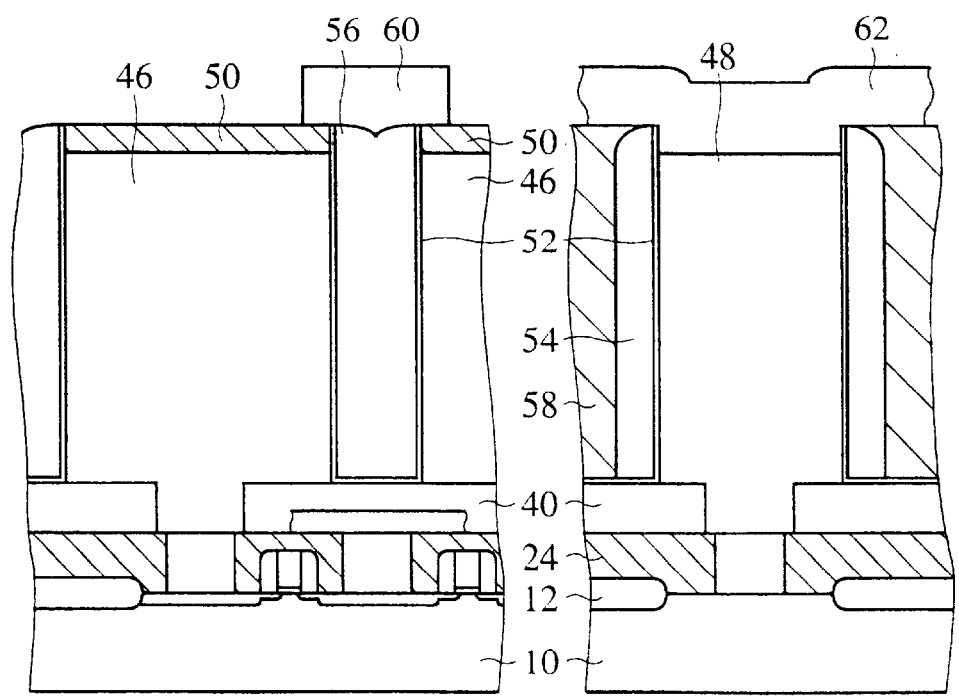

Subsequently, a conducting film of a metal is deposited on the thus-formed base substrate, and the interconnection connected to the opposed electrode 56 and the interconnection 62 connected to the peripheral circuit are formed (FIG. 4B).

Thus a DRAM comprising one transistor and one capacitor can be fabricated.

As described above, according to the present embodiment, the storage electrode 46 and the contact plug (the pillar-shaped conductor 48) connected to the peripheral circuit are formed of one and the same conducting layer by one and the same processing step, whereby the interconnection 60 connected to the memory cell region and the interconnection 62 connected to the peripheral circuit region can be formed without making the contact holes deep, whereby the fabrication process for the semiconductor device can be much simplified.

The opposed electrode 56 is formed by self-alignment with the storage electrode 46, whereby it is unnecessary to pattern the opposed electrode 56. Lithography steps, which much affect TAT, can be reduced.

Figure 5A:
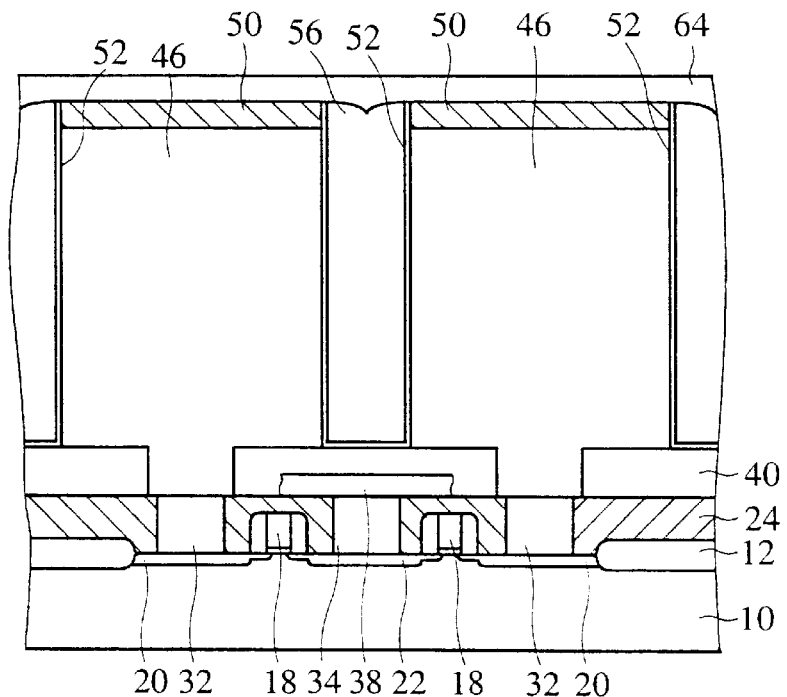
FIGS. 5A–5B and 6A–6B are sectional views of the semiconductor device according to a modification of the first embodiment of the present invention in the steps of the method for fabricating the same, which explain the method.
Figure 5B:
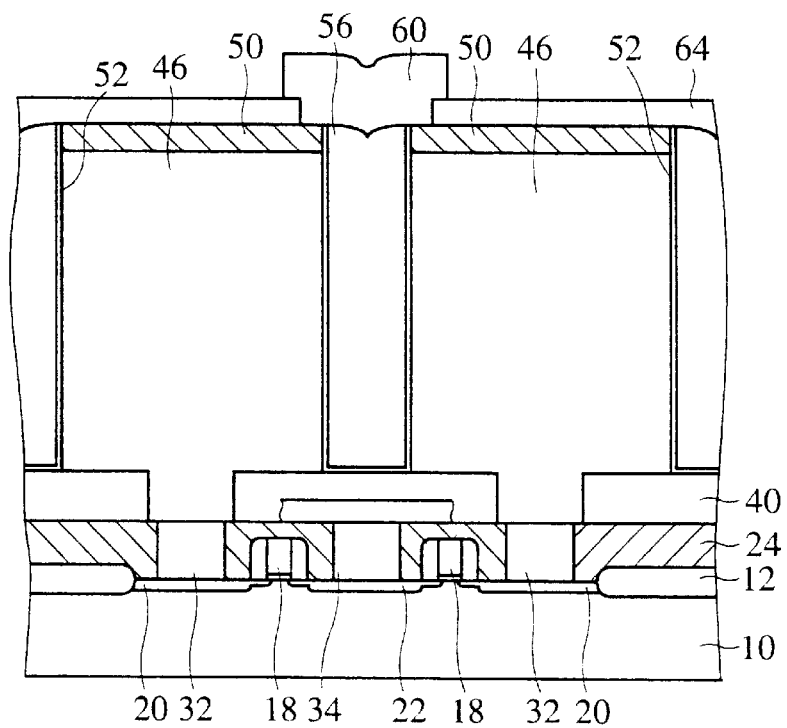

In the present embodiment, the inter-layer insulation film 58 is planarized with the cap film 50 as the etching stopper, and the interconnection 60 is formed on the opposed electrode 56 exposed on the surface, but it is possible that after the inter-layer insulation film 58 is planarized, the inter-layer insulation film 64 of, eg., silicon oxide film, is deposited (FIG. 5A), and the interconnection 60 is connected through an opening formed in the inter-layer insulation film 64 (FIG. 5B).

Owing to this, as etching conditions for opening the opening for connecting the interconnection 60, conditions which make the silicon oxide film vulnerable and the silicon nitride film invulnerable to the etching are selected, whereby the cap film 50 of the silicon nitride film functions as the etching stopper. Even when the opening in the inter-layer insulation film 64 is rough, the contact for the opposed electrode 54 can be accurately formed. The top of the storage electrode 46 is protected by the cap film 50, whereby short-circuit between the storage electrode 46 and the interconnection 60 does not take place.

In the present embodiment, the sidewall film 54 formed on the sidewall of the pillar-shaped conductor 48 remains to the end but may be removed in the fabrication process. For example, after the opposed electrode 56 and the sidewall film 54 are formed, the sidewall film 54 can be removed by isotropical etching, as of wet etching or others, with a memory cell region alone covered with a resist film or others.

Such removal of the sidewall film 54 adds to a number of the fabrication steps, but without the sidewall film 54 on the sidewall of the pillar-shaped conductor 48, a gap between the pillar-shaped conductors 48 can be the more reduced. This more improves integration around the contact than the semiconductor device shown in FIGS. 1A–1C.

In the present embodiment, the etching for forming the opposed electrode 56 is anisotropic, but the opposed electrode 56 may be formed by isotropic etching, such as wet etching or others.

Figure 6A:
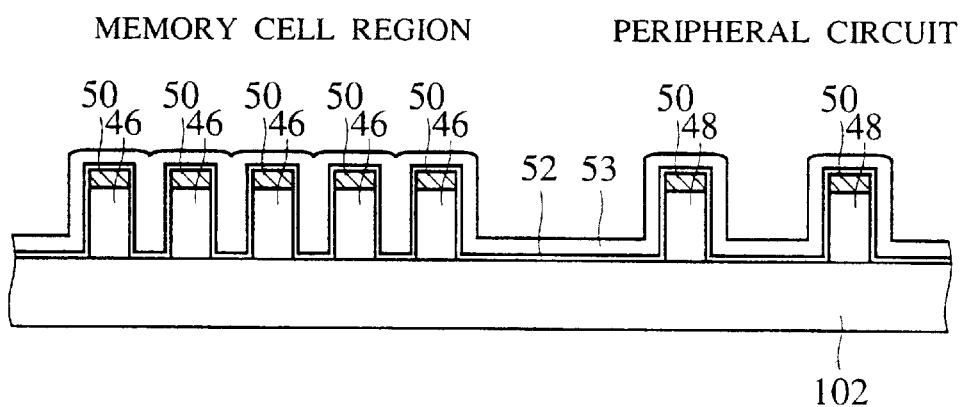
Figure 6B:
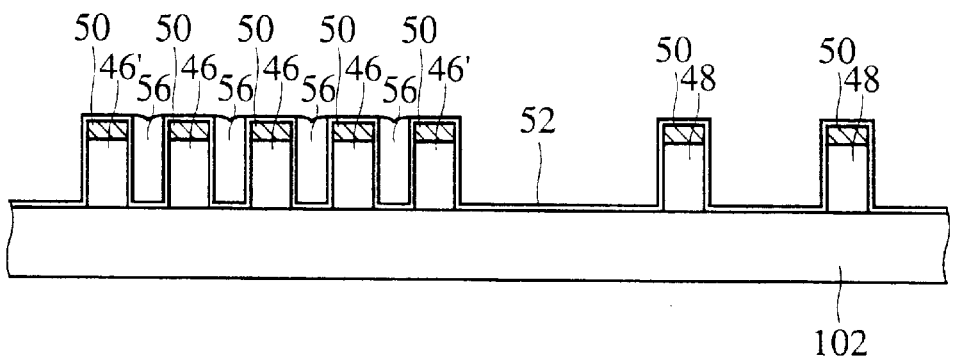

That is, the polycrystalline silicon film 53 to be the opposed electrode 56 is deposited (FIG. 6A) after the step of FIG. 3B), and a required amount of the polycrystalline silicon film is etched by isotropic etching, such as wet etching or others, whereby the opposed electrodes 56 are left in the mesh structure in the memory cell region, but no sidewall film is formed on the pillar-shaped conductor 48 in the peripheral circuit region (FIG. 6B).

Accordingly, even in a case that a plurality of the pillar-shaped conductors 48 are formed adjacent to each other, the pillar-shaped conductors 48 do not short-circuit with each other through the sidewall films 54. This improves integration around the contact than in the semiconductor device shown in FIGS. 1A–1C.

In the present embodiment, the cap film 50 covering the storage electrode 46 and the pillar-shaped conductor 48 is silicon nitride film, but other insulation films, as of $Al_2O_3$, etc., may be used. The cap film is not essential. Conducting films, such as polycrystalline silicon film, chrome (Cr) film, etc., may be used in place of silicon nitride film. This enables the contact of the peripheral circuit region to be exposed without removing the cap film 50.

In this case, the cap film 50 connected to the storage electrode 46, and the opposed electrode 56 are exposed on the memory cell region, which makes it difficult to form the interconnection 60 connected to the opposed electrode 56, electrically isolated from the storage electrode 46. However, by the use of the method for fabricating the semiconductor device according to, e.g., a ninth embodiment of the present invention which will be described later, the interconnection 60 can be connected to the opposed electrode 56.

In the present embodiment, the storage electrode 46, the pillar-shaped conductor 48, the sidewall films 54 and the opposed electrode 56 are formed of doped polycrystalline silicon film but may be formed of other materials, e.g., metal materials, such as amorphous silicon, tungsten (W), titanium (Ti), aluminum (Al), ruthenium (Ru), palladium (Pd), cobalt (Co), copper (Cu), silver (Ag), chrome (Cr), platinum (Pt), nickel (Ni), molybdenum (Mo) and iridium (Ir); metal nitrides, such as WN, TiN, etc., metal oxides, such as $RuO_2$, etc.; metal silicides, such as Wsi, CoSi, TiSi, etc.; composite metal materials, such as W/TiN/Ti, Ru/TiN/Ti, etc. Preferably these materials are selected in consideration of their compatibility with an insulation material used as the dielectric film 52 and their resistance values. It is also preferable that these materials are selected in consideration of a heat treatment amount required by the process.

[A Second Embodiment]

The semiconductor device according to a second embodiment of the present invention and a method for fabricating the semiconductor device will be explained with reference to FIGS. 7, 8A–8B and 9. The same members of the semiconductor device according to the present embodiment as those of the semiconductor device according to the first embodiment are represented by the same reference numerals not to repeat or simplify their explanation.

Figure 8A:
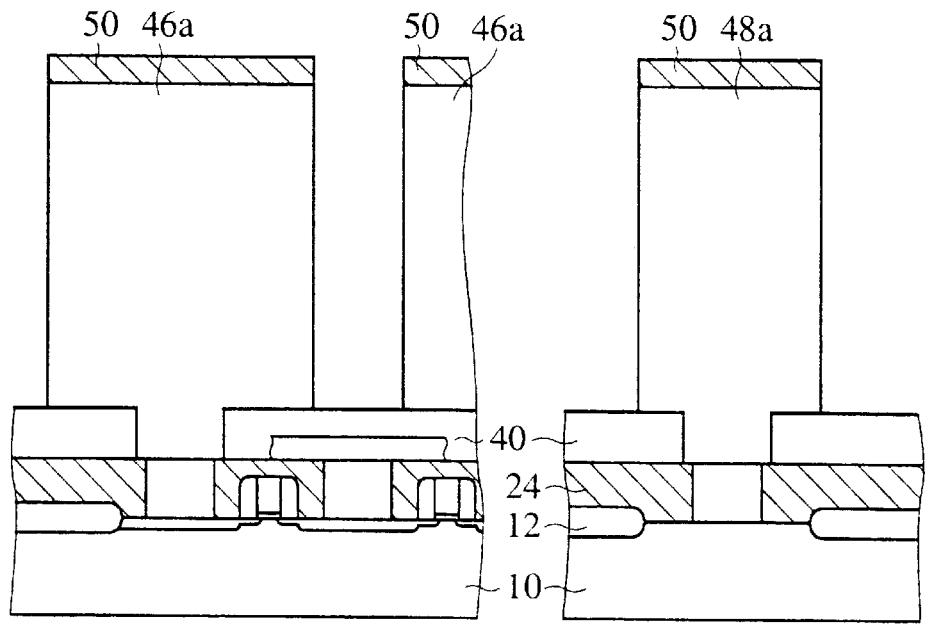
FIGS. 8A–8B and 9 are sectional views of the semiconductor device according to the second embodiment of the present invention in the steps of the method for fabricating the same, which explain the method.
Figure 8B:
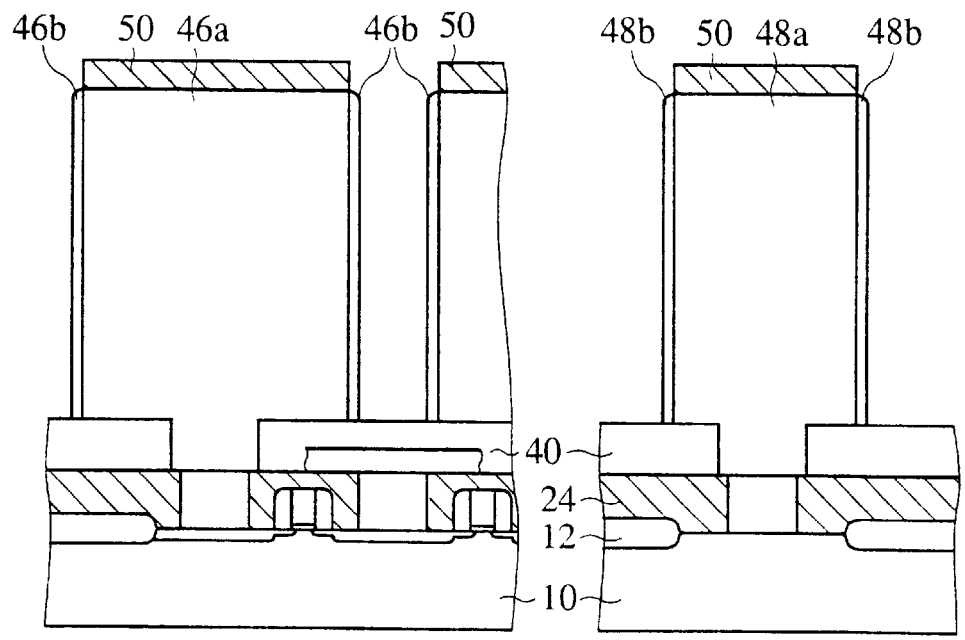
Figure 9A:
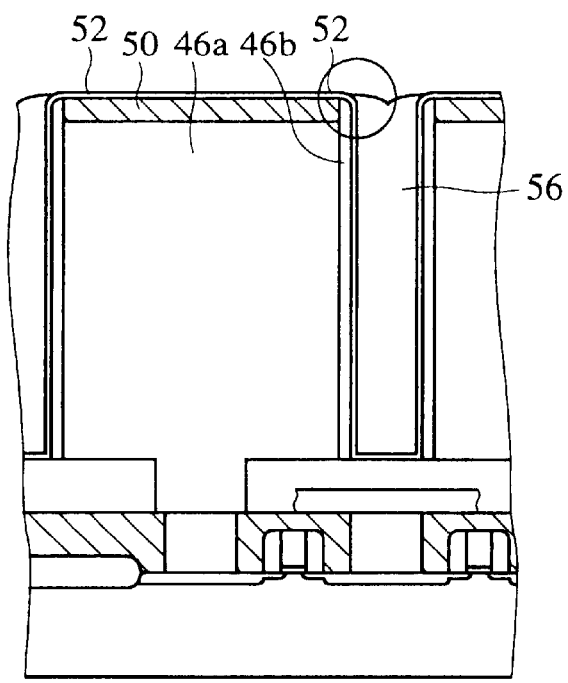
Figure 9B:
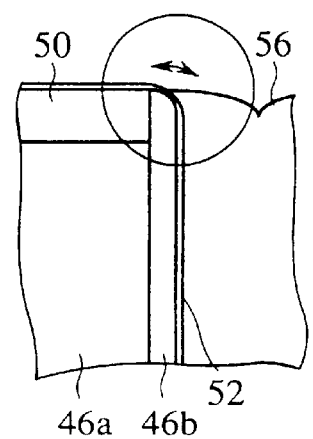

FIG. 7 is a diagrammatic sectional view of the semiconductor device according to the present embodiment, which shows a structure thereof. FIGS. 8A–8B and 9 are sectional views of the semiconductor device according to the present embodiment in the steps of the method for fabricating the same, which explain the method.

In the semiconductor device according to the first embodiment the pillar-shaped conductor 48 is formed of polycrystalline silicon film. However, because polycrystalline silicon film has a resistance value about two orders larger than metal materials, it is preferable to operate the peripheral circuit at high speed that polycrystalline silicon film is replaced by a low resistance material, e.g., tungsten film. In this case, because the pillar-shaped conductor 48 is formed of the same material as the storage electrode 46, when the material of the pillar-shaped conductor is replaced by tungsten film, the storage electrode 46 is formed of the pillar-shaped conductor 48 as well is formed of the tungsten film.

However, silicon oxynitride film widely used as the dielectric film 52 has poor compatibility with certain materials, such as tungsten film, etc., and a film of good quality cannot be sometimes formed on the surface of tungsten film depending on film forming conditions and conditions, such as processing temperatures, etc. Other materials having high dielectric constant, e.g., $Al_2O_3$, $Ta_2O_5$, $(Ba_xSr_{1-x})TiO_3$, PZT, etc. have compatibility with electrode materials, and it is necessary to select an electrode material corresponding to a dielectric film.

In place of forming the dielectric film on the surface of the storage electrode, the dielectric film may be formed by oxidizing or nitridizing the storage electrode itself. For example, the surface of the storage electrode formed of tantalum (Ta) is oxidized to form $Ta_2O_5$ film.

The present embodiment shows the semiconductor device and the method for fabricating the same can make the contact plug for the peripheral circuit less resistance, and form an electrode having good compatibility with a dielectric film of a capacitor.

The semiconductor device according to the present embodiment is characterized in that a storage electrode 46 comprises a pillar-shaped conductor 46a of tungsten film, and a conducting film 46b formed on the sidewall of the pillar-shaped conductor 46a and having good compatibility with the dielectric film 52, and a pillar-shaped conductor 48 comprises a pillar-shaped conductor 48a of tungsten film and a conductor film 48b formed on the sidewall of the pillar-shaped conductor 48a.

This structure of the semiconductor device can make the contact plug for the peripheral circuit less resistance and can form the capacitor without degrading characteristics of the dielectric film 52.

Then, the method for fabricating the semiconductor device according to the present embodiment will be explained with reference to FIGS. 8A–8B and 9.

First, the pillar-shaped conductor 46a connected to the plug 32 and the pillar-shaped conductor 48a connected to the plug 36 are formed in the same way as in, e.g., the method for fabricating the semiconductor device according to the first embodiment shown in FIGS. 2A to 3C. In the present embodiment, tungsten film is used in place of polycrystalline silicon film to form the pillar-shaped conductors 46a, 48a of tungsten (FIG. 8A). The pillar-shaped conductor 46a corresponds to the storage electrode 46 of the first embodiment.

Then, polycrystalline silicon film is selectively grown by CVD method on regions of the sidewalls of the pillar-shaped conductors 46a, 48a where the tungsten is exposed. The technique for selectively growing polycrystalline silicon film on tungsten is already established, and polycrystalline silicon film can be easily selectively grown under the conventionally known growth conditions. Thus, the conducting films 46b, 48b covering the sidewalls of the pillar-shaped conductors 46a, 48a are formed (FIG. 8B). The pillar-shaped conductor 46a and the conducting film 46b constitute the storage electrode 46, and the pillar-shaped conductor 48a and the conducting film 48b constitute the pillar-shaped conductor 48.

In the present embodiment, the conducting films 46b, 48b are formed only on the sidewalls of the pillar-shaped conductors 46a, 48a and is not formed on the sidewall of the cap film 50. This is because the dielectric film 52 is sometimes abraded on the corners by the etching in burying the opposed electrode 56, and in a case that the conducting films 46b, 48b are provided even on the sidewall of the cap film 50, there is a risk that leak current may flow between the opposed electrode 56 and the conducting film 46b (see FIG. 9).

Accordingly, in a case that the etching for burying the opposed electrode 56 is conducted with a selective ratio sufficient not to abrade the dielectric film 52, the conducting films 46a. 48b may be extended onto the sidewall of cap film 50.

Even when the dielectric film 52 is abraded, the surface is a little oxidized to decrease leak current.

Then, the dielectric film 52 and the opposed electrode 56, etc. are formed in the same way as in, e.g., the method for fabricating the semiconductor device according to the first embodiment shown in FIGS. 3C to 4B, whereby a DRAM can be fabricated, making the contact plug for the peripheral circuit less resistance.

As described above, according to the present embodiment, the contact plug for the peripheral circuit is provided by the pillar-shaped conductor 48a having low resistance value, and the surface of the pillar-shaped conductor 46a is covered with the conducting film 46b having good compatibility with the dielectric film 52, whereby the dielectric film 52 of the capacitor can be formed stable.

In the present embodiment, the selective growth of the polycrystalline silicon film on tungsten is used to form the conducting films 46b, 48b but can be formed by the following method.

First, polycrystalline silicon film is deposited by, e.g., CVD method and is heat-treated at about 800–850° C. This heat-treatment causes silicidation reaction in a region where the polycrystalline silicon film and the pillar-shaped conductors 46a, 48a contact each other, and the conducting films 46b, 48b of tungsten silicide film are formed.

Subsequently the polycrystalline silicon film which has not contributed to the silicidation reaction is selectively removed. Thus, the conducting films 46b, 48b are formed selectively only on the sidewalls of the pillar-shaped conductors 46a, 48a.

The polycrystalline silicon film which has not reacted is etched off, or the polycrystalline silicon film alone is selectively replaced by the oxide film by the use of a difference in oxidation rate between the tungsten silicide film and the polycrystalline silicon film.

Thus, the conducting films 46b, 48b can be selectively left only on the sidewalls of the pillar-shaped conductors 46a, 48a.

It is also possible that as shown in FIG. 8A, the pillar-shaped conductors 46a, 48a are formed and are subjected to heat-treatment of, e.g., 600–850° C. in a nitrogen atmosphere or an ammonium atmosphere to nitridize the surfaces of the pillar-shaped conductors 46a, 48a into thin tungsten nitride (WN) films. The tungsten nitride film is selectively formed only on the sidewalls of the tungsten film and, in addition, has conductivity, and can be used as the conducting films 46b, 48b.

It is possible that the pillar-shaped conductors 46a, 48a are formed of titanium and have the surfaces nitridized to form the conductor films 46b, 48b of titanium nitride (TiN) film.

In the present embodiment, the pillar-shaped conductors 46a, 48a are formed of tungsten film but may be formed of other low-resistance materials.

The conductor films 46b, 48b covering the sidewalls of the pillar-shaped conductors 46a, 48b can be formed of any material that functions as the electrodes of a required dielectric film. For example, doped polycrystalline silicon film, metal silicide films, such as tungsten silicide film, titanium silicide film, metal nitride films, such as TiN film, WN film, etc., may be used.

[A Third Embodiment]

The method for fabricating the semiconductor device according to a third embodiment of the present invention will be explained with reference to FIGS. 10A–10C. The same members of the present embodiment as those of the semiconductor device according to the first or the second embodiment are represented by the same reference numerals not to repeat or simplify their explanation.

Figure 10A:
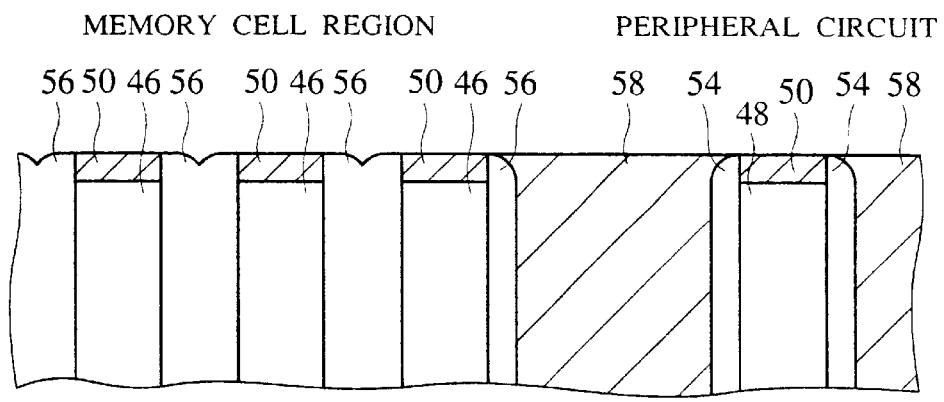
FIGS. 10A–10C are sectional views of the semiconductor device according to a third embodiment of the present invention in the steps of the method for fabricating the same, which explain the method.
Figure 10B:
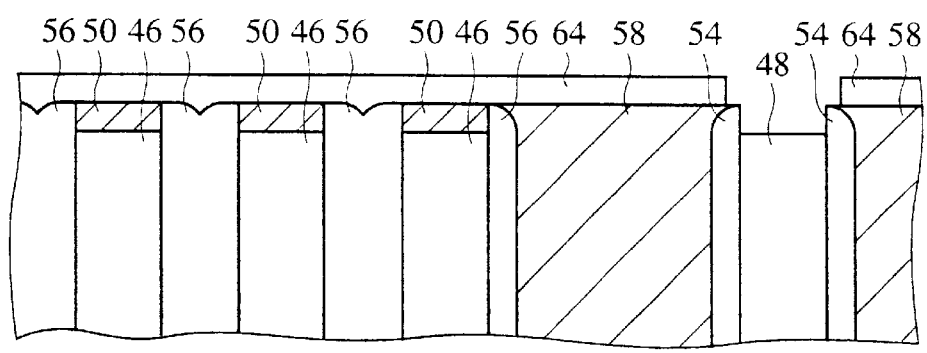
Figure 10C:
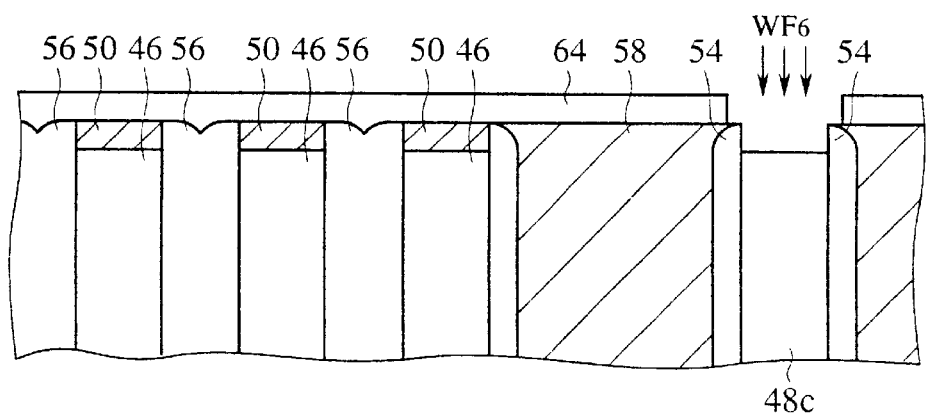

FIGS. 10A–10C show sectional views of the semiconductor device according to the present invention in the steps of the method for fabricating the same, which explain the method.

In the second embodiment, the conducting films 46b, 48b having good compatibility with the dielectric film 52 are formed on the sidewalls of the pillar-shaped conductors 46a, 48a, whereby the contact plug for the peripheral circuit region is made less resistance, and the storage electrodes 46 have good compatibility with the dielectric film 52.

The present embodiment shows a method for fabricating another semiconductor device, which makes the contact plug for the peripheral circuit less resistance.

First, a semiconductor device including a storage electrode 46 and a pillar-shaped conductor 48 formed of polycrystalline silicon film is formed in the same way as in, e.g., the method for fabricating the semiconductor device according to the first embodiment shown in FIGS. 2A to 4A (FIG. 10A).

In the present embodiment, the sectional views shown in FIG. 10 have the structure below the storage electrode 46 and the pillar-shaped conductor 48 omitted for simplicity of the drawings.

Then, with a memory cell region covered, an interlayer insulation film 64 having an opening on the pillar-shaped conductor 48 is formed.

Subsequently a cap film 50 of silicon nitride film exposed in the opening is removed by, e.g., phosphoric acid solution, and the pillar-shaped conductor 48 is exposed in the opening in the inter-layer insulation film 64 (FIG. 10B).

Then, the substrate is exposed to an atmosphere including $WF_6$ gas to replace the pillar-shaped conductor 48 of the polycrystalline silicon film by a pillar-shaped conductor 48c of tungsten film (FIG. 10C).

When polycrystalline silicon film is exposed to $WF_6$ gas, the following reaction takes place between the $WF_6$ gas and the Si.

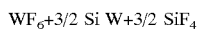

$SiF_4$ is a volatile substance and does not reside on the surface of the substrate. Accordingly the pillar-shaped conductor 48 of the polycrystalline silicon film is replaced by the pillar-shaped conductor 48c of the tungsten film.

A technique for replacing polycrystalline silicon film by tungsten film is described in, e.g., T. Koga et al., "A 0.29-μm MIM-CROWN cell and process technologies for 1-gigabit DRAMs", IEDM Technical Digest, pp. 927–929 (1994).

The pillar-shaped conductor 48 alone constituting the contact plug for the peripheral circuit is replaced by tungsten film, whose resistance value is low, whereby the peripheral circuit can have much lowered resistance value.

On the other hand, the storage electrode 46 is covered with the cap film 50 and the inter-layer insulation film 64, and an opposed electrode 56 is covered with the interlayer insulation film 64. These electrodes remain the polycrystalline silicon film having good compatibility with the dielectric film 52.

As described above, according to the present embodiment, the storage electrode 46 and the pillar-shaped conductor 48 are formed of polycrystalline silicon film which is compatible with the dielectric film 52, and then the pillar-shaped conductor 48 alone is replaced by tungsten film of low resistance, whereby the contact plug for the peripheral circuit can be made less resistance without degrading characteristics of the capacitor.

[A Fourth Embodiment]

The method for fabricating the semiconductor device according to a fourth embodiment will be explained with reference to FIGS. 11A–11C. The same members of the fourth embodiment as the semiconductor device according to the third embodiment and the method for fabricating the same are represented by the same reference numerals not to repeat or simplify their explanation.

Figure 11A:
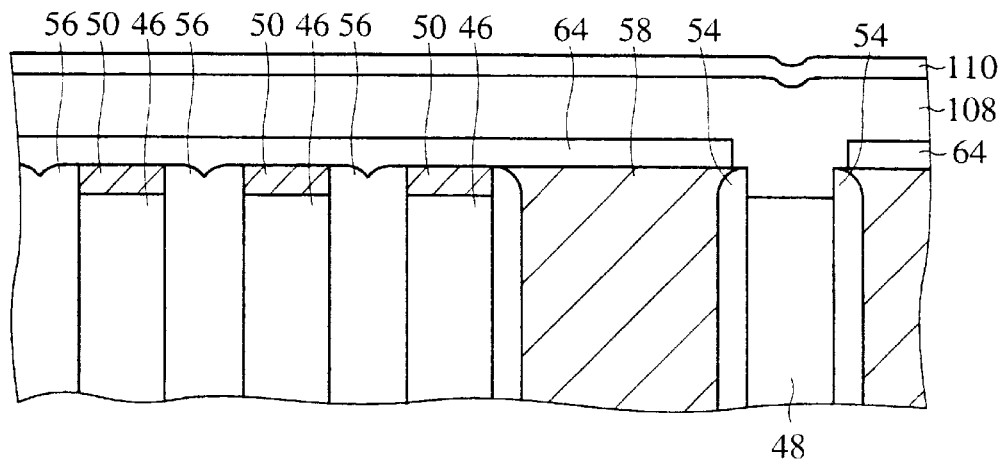
FIGS. 11A–11C are sectional views of the semiconductor device according to a fourth embodiment of the present invention in the steps of the method for fabricating the same, which explain the method.
Figure 11B:
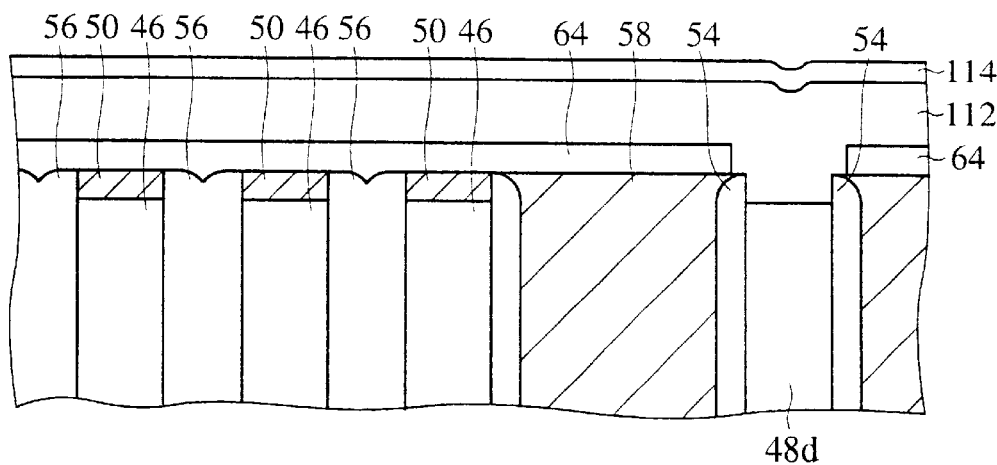
Figure 11C:
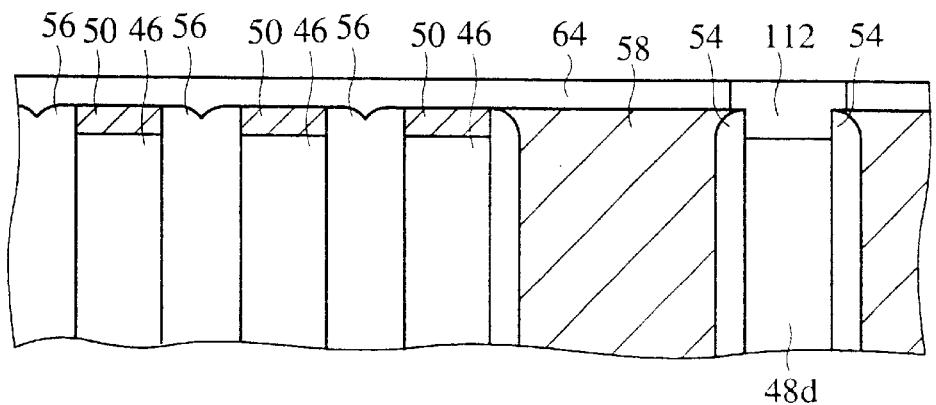

FIGS. 11A–11C are sectional views of the semiconductor device according to the present embodiment in the steps of the method for fabricating the same, which explain the method.

In the third embodiment, the pillar-shaped conductor 48 of polycrystalline silicon film is replaced by the pillar-shaped conductor 48c of tungsten, whereby the contact plug for the peripheral circuit is made less resistance, but the pillar-shaped conductor 48 of polycrystalline silicon film may be replaced by other materials.

The present embodiment shows the method for replacing a pillar-shaped conductor of polycrystalline silicon film by aluminum.

First, a semiconductor device including a storage electrode and a pillar-shaped conductor 48 formed of polycrystalline silicon film in the same way as in, e.g., the method for fabricating the semiconductor device according to the third embodiment, and then an inter-layer insulation film 64 having an opening on the pillar-shaped conductor 48 is formed with a memory cell region covered.

Subsequently an about 1 μm-thick aluminum film 108 is deposited by, e.g., sputtering method.

Then, film which is apt to react with silicon and form silicide, e.g., Ti film 110 is formed (FIG. 11A). The Ti film 110 functions to accelerate replacement of the pillar-shaped conductor 48 of polycrystalline silicon by the aluminum film 108.

Next, a heat-treatment is conducted at, e.g., 500° C. for 1 to 10 hours to replace the pillar-shaped conductor 48 by the pillar-shaped conductor of aluminum 48d.

In this heat-treatment, the pillar-shaped conductor 48 of polycrystalline silicon is replaced by the pillar-shaped conductor 48d of aluminum; the aluminum film 108 is replaced by $Al_xSi_y$ film (or polycrystalline silicon film) 112; and the Ti film 110 is replaced by $Ti_xSi_y$ film 114 (FIG. 11B).

Subsequently, the $Ti_xSi_y$ film 114 and the $Al_xSi_y$ film 112 on the inter-layer insulation film 64 are removed by a planarization technique, e.g., CMP method (FIG. 11C).

At this time, in a case that the pillar-shaped conductor 48 is formed of doped polycrystalline silicon film, native oxide film tends to be formed on the surface of the polycrystalline silicon film with a result that the replacement of the polycrystalline silicon film by the aluminum tends to be hindered.

Here, to form the pillar-shaped conductor 48 it is preferable that doped polycrystalline silicon film and non-doped polycrystalline silicon film are continuously formed in one film forming chamber to form an about 100–300 nm-thick doped polycrystalline silicon film having the surface covered with the non-doped polycrystalline silicon film.

Forming the pillar-shaped conductor 48 in this two-layer structure makes it relatively difficult for native oxide film to be formed on the surface of the pillar-shaped conductor 48. The doped polycrystalline silicon film and the non-doped polycrystalline silicon film are continuously formed, and accordingly no native oxide film is present on the interface therebetween. This makes it easy to replace the pillar-shaped conductor 48 of polycrystalline silicon film by aluminum.

The pillar-shaped conductor 48 alone constituting the contact plug for the peripheral circuit is replaced by aluminum, whose resistance value is low, whereby the peripheral circuit can have much lowered interconnecting resistance.

On the other hand, the storage electrode 46 is covered with a cap film 50 and the inter-layer insulation film 64, and the opposed electrode 56 is covered with the interlayer insulation film 64, whereby these electrodes remain to be of polycrystalline silicon film.

As described above, according to the present embodiment, the storage electrode 46 and the pillar-shaped conductor 48 are formed of polycrystalline silicon film, whose compatibility with the dielectric film 52 is good, and then the pillar-shaped conductor 48 alone is replaced by aluminum film, whose resistance is low, whereby the contact plug for the peripheral circuit can be made less resistance without degrading characteristics of the capacitor.

In the third and the fourth embodiments, polycrystalline silicon film is replaced by tungsten film and aluminum film but may be replaced by metal materials, such as Cu, etc.

[A Fifth Embodiment]

The semiconductor device according to a fifth embodiment of the present invention and the method for fabricating the same will be explained with reference to FIGS. 12 to 14. The same members of the present embodiment as those of the semiconductor device according to the first embodiment and the method for fabricating the same are represented by the same reference numerals not to repeat or simplify their explanation.

Figure 12:
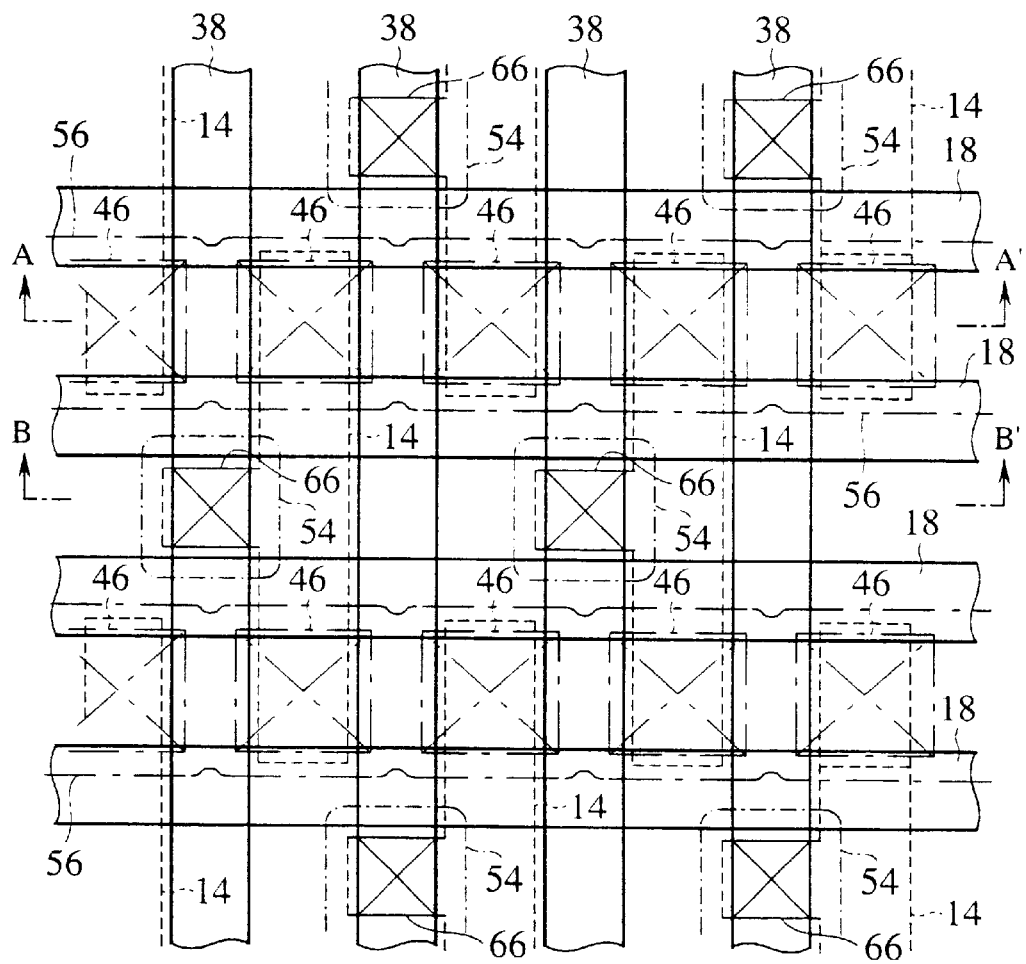
FIG. 12 is a plan view of the semiconductor device according to a fifth embodiment of the present invention, which shows a structure thereof.

FIG. 12 is a plan view of the semiconductor device according to the present embodiment, which shows a structure thereof. FIG. 13 is a sectional view along the line A–A' in FIG. 12. FIG. 14 is a sectional view along the line B–B' in FIG. 12.

In the first to the third embodiments, the pillar-shaped conductor 48 of the same conducting layer as the storage electrode 46 is provided in the contact of the peripheral circuit and is used as the contact plug. This contact structure is applicable to the contact of a bit line of a DRAM structure in which the bit line is formed on the capacitor structure.

The present embodiments shows a semiconductor device and a method for fabricating the same in which a contact plug connecting a memory cell transistor and a bit line is formed simultaneously with a storage electrode 46.

Source/drain diffused layers 20, 22 are formed independently of each other in a device region 14 on a silicon substrate 10 defined by a device isolation film 12. A gate electrode 18 is formed on the silicon substrate 10 between the source/drain diffused layers 20, 22 through an insulation film. The gate electrode 18, the source/drain diffused layers 20, 22 constitute a memory cell transistor (FIG. 13). The gate electrode 18 is arranged in a direction normal to the device region 14 and constitutes a word line which functions also as the gate electrode of the memory cell transistors of the other plural memory cells (FIG. 12).

Figure 13:
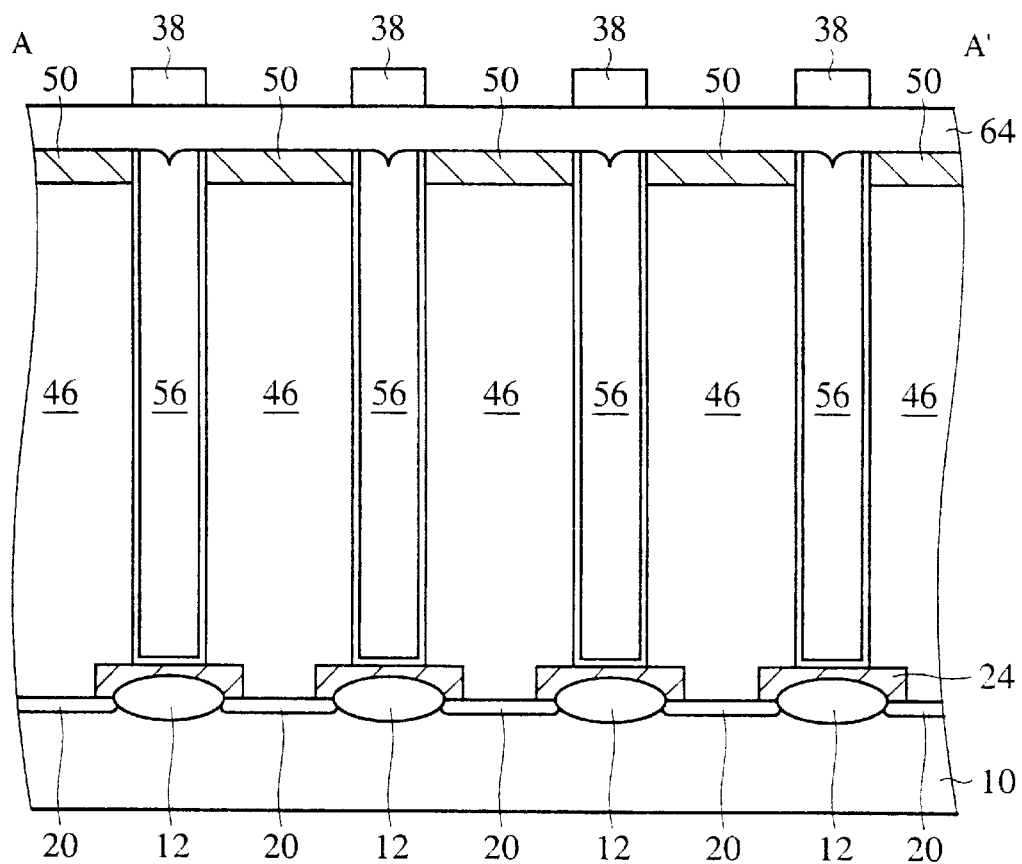
FIG. 13 is a sectional view of the semiconductor device of FIG. 12 along the line A–A'.
Figure 14:
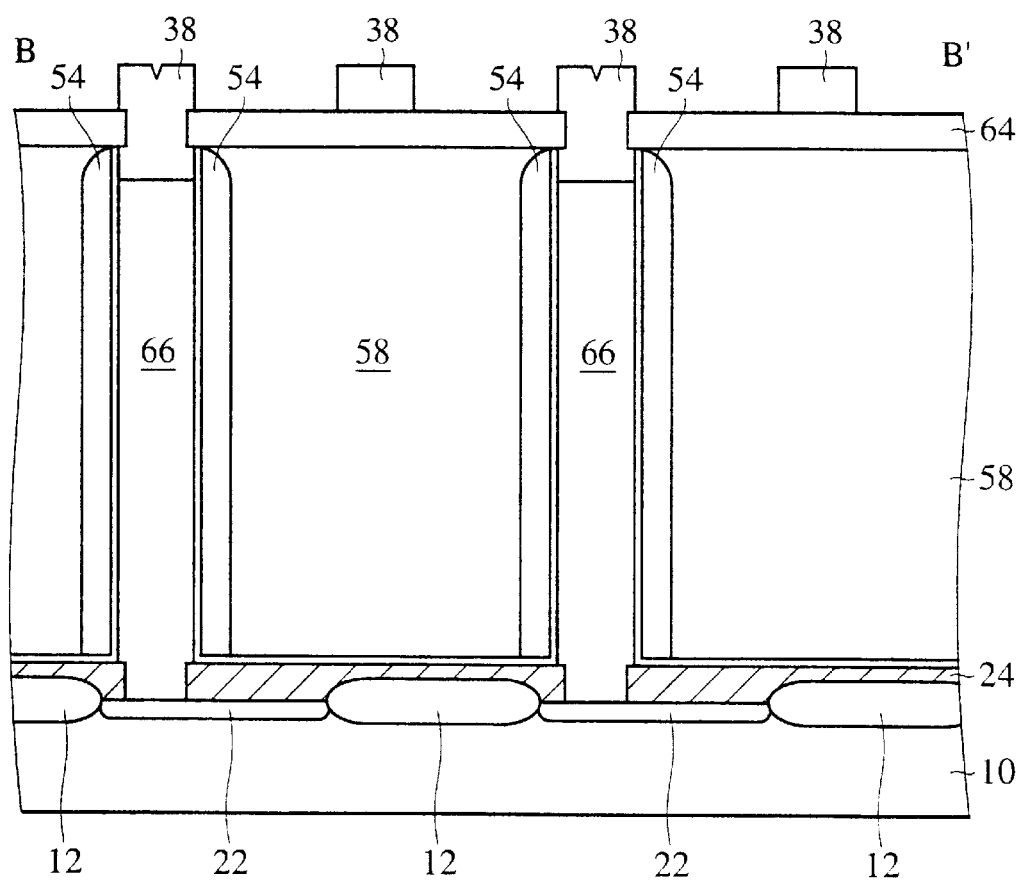
FIG. 14 is a sectional view of the semiconductor device of FIG. 12 along the line B–B'.

On the silicon substrate 10 with the memory cell transistor formed on a pillar-shaped storage electrode 46 connected to the source/drain diffused layer 20, a pillar-shaped conductor 66 connected to the source/drain diffused layer 22 are formed on the inter-layer insulation film 24, projected therefrom (FIGS. 13 and 14).

An opposed electrode 56 is formed on the sidewall of the storage electrode 46 through a dielectric film 52, and a gap between the storage electrodes adjacent to each other is buried with the opposed electrode 56. Thus, the storage electrode 46, the dielectric film 52 and the opposed electrode 56 constitute a capacitor. (FIG. 13).

A sidewall film 54 of the same conducting film as the opposed electrode 56 is formed on the sidewall of the pillar-shaped conductor 66 through the dielectric film 52 (FIGS. 12 and 14).

A bit line 38 is formed on the silicon substrate 10 with the thus-formed capacitor and the pillar-shaped conductor 66 through the inter-layer insulation film 64. The bit line 38 is electrically connected to the pillar-shaped conductor 66 through an opening formed in the interlayer insulation film 64 (FIGS. 12 and 14).

As described above, in forming the bit line 38 on the inter-layer insulation film 64 formed on the capacitor, the pillar-shaped conductor 66 of the same conducting layer as the storage electrode 46 is used as the contact plug for the bit line contact.

In the semiconductor device according to the present embodiment, it is necessary to dispose the contact plug (the pillar-shaped conductor 66 for the bit line contact on the source/drain diffused layer 22, which does not permit the storage electrodes 46 adjacent to each other in the direction of extension of the bit lines 38 to be arranged close to each other. That is, the opposed electrodes 56 cannot be arranged in a mesh. However, the storage electrodes can be arranged close to each other in the direction of extension of the gate electrodes as in the first embodiment, which permits the opposed electrodes 56 of the capacitors arranged in the direction extension of the gate electrodes 18 to be connected to each other (FIG. 12).

In fabricating the semiconductor device according to the present embodiment, when a pillar-shaped conductor to be the storage electrode 46 is formed, the pillar-shaped conductor 66 is formed connected to the source/drain diffused layer 22, and then the semiconductor device is fabricated in the same way as in, e.g., the first embodiment.

As described above, according to the present embodiment, the contact plug for connecting the bit line 38 to the memory cell transistor is provided by the pillar-shaped conductor 66 of the same conducting layer as the storage electrode 46, which facilitates formation of the bit line contact in arranging the bit line 38 on the interlayer insulation film 64 covering the capacitor.

The contact plug structure according to the second or the third embodiment and the method for fabricating the same is applied to the semiconductor device according to the present embodiment, whereby the contact plug for connecting the bit line 38 can be made less resistance.

[A Sixth Embodiment]

The semiconductor device according to a sixth embodiment and the method for fabricating the same will be explained with reference to FIGS. 15, 16A–16C, 17A–17B and 18A–18B. The same members of the sixth embodiment as the semiconductor device according to the first to the fifth embodiments and the method for fabricating the same are represented by the same reference numerals not to repeat or simplify their explanation.

Figure 15:
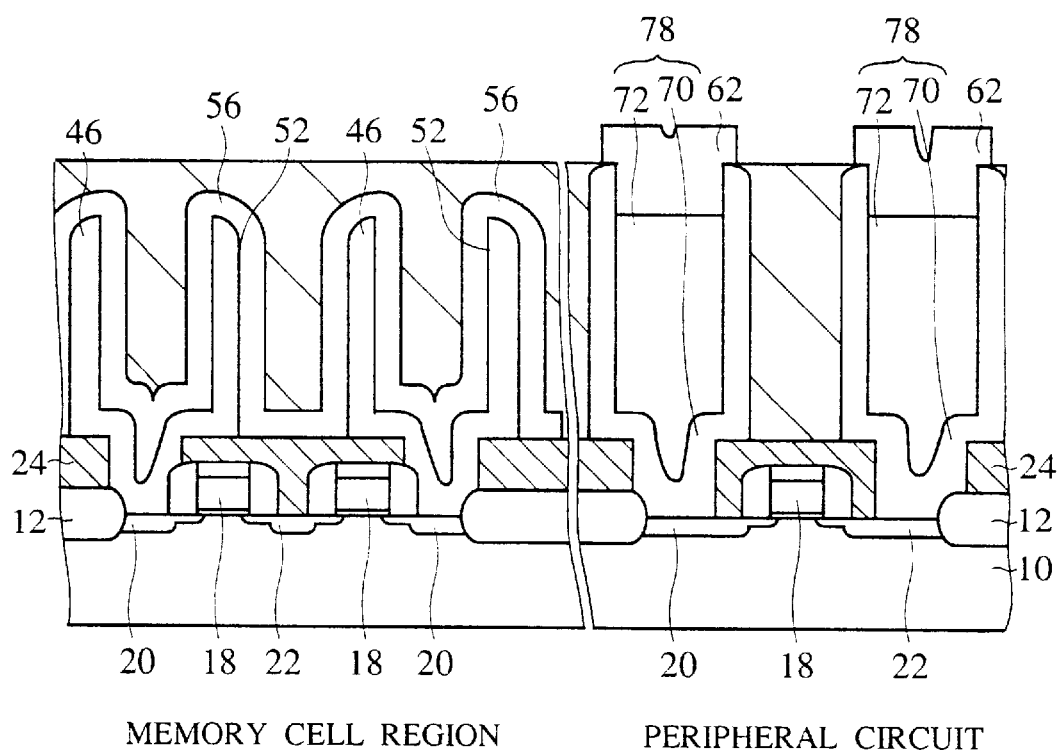
FIG. 15 is a diagrammatic sectional view of the semiconductor device according to a sixth embodiment of the present invention, which shows a structure thereof.

FIG. 15 is a diagrammatic sectional view of the semiconductor device according to the present embodiment, which show a structure thereof. FIGS. 16A–16C, 17A–17B and 18A–18B are sectional views of the semiconductor device according to the present embodiment in the steps of the method for fabricating the same, which explain the method.

In the first to the fifth embodiments, the structures of the capacitors are simple, but to increase capacitance of the capacitors, it is necessary to make the storage electrodes higher, which are a barrier to the processing technique for the storage electrodes, reduction of resistance of the contact plugs, etc.

On the other hand, as one capacitor structure for ensuring a capacitance of the capacitors, the storage electrode is formed in a crown shape, and both surfaces of the crown are used as the electrode surface. (For example, Wakamiya et al., "Novel stacked capacitor cell for 64 Mb DRAM", 1989 Symposium on VLSI Technology, Digest of technical Papers, pp. 96-70 (1989)). This structure of the capacitor increases a surface area of the storage electrode by about twice, whereby a height of the storage electrode can be diminished by about ½ for the same capacitance of the capacitor.

The present embodiment shows a semiconductor device including a crown-shaped capacitor using the pillar-shaped conductor formed in the first embodiment, and a method for fabricating the same.

First, the structure of the semiconductor device according to the present embodiment will be explained with reference to FIG. 15.

Source/drain diffused layers 20, 22 are formed independent of each other in a prescribed region on a semiconductor substrate 10 defined by a device isolation film 12. A gate electrode 18 is formed on the semiconductor substrate 10 between the source/drain diffused layers 20, 22 through a gate oxide film. The gate electrode 18, the source/drain diffused layers 20, 22 constitute a memory cell transistor. The gate electrode 18 is arranged in a direction normal to a device region 14 and constitute a word line which functions as the gate electrodes of the memory cell transistors of other plural memory cells.

On the semiconductor substrate 10 with the memory cell transistor formed on, a crown-shaped storage electrode 46 connected to the source/drain diffused layer 20 is formed through an inter-layer insulation film 24. An opposed electrode 56 is formed on the surface of the storage electrode 46 through a dielectric film 52.

Thus, the storage electrode 46, the dielectric film 52, the opposed electrode 56 constitute a crown-shaped capacitor. "A crown-shaped capacitor" in the specification of the present application means a capacitor including storage electrode 46 having cylindrical projection, the inside and the outside surfaces of the cylindrical projection function respectively as electrode surfaces.

Thus, a DRAM including one transistor and 1 capacitor is constituted.

The semiconductor device shown in FIG. 15 has bit lines omitted, but bit lines can be provided in the same way as in, e.g., the first or the fifth embodiment.

In a peripheral circuit region adjacent to the memory cell region, a pillar-shaped structure 78 formed of a tungsten film 72 and a polycrystalline silicon film 70 and connected to the source/drain diffused layers 20,22 is formed. An interconnection 62 connected to the source/drain diffused layers 20, 22 through the pillar-shaped structure 78 is formed on the pillar-shaped structure 78.

Then, the method for fabricating the semiconductor device according to the present embodiment will be explained with reference to FIGS. 16A–16C, 17A–17B and 18A–18B.

In the same way as in, e.g., the method for fabricating the semiconductor device according to the first embodiment shown in FIGS. 2A to 2C, a memory cell transistor and a transistor constituting the peripheral circuit are formed respectively in the device region 14 and the device region 16 defined by the device isolation film 12.

Then, an about 300 nm-thick silicon oxide film is deposited by, e.g., CVD method, and the surface of the silicon oxide film is polished by CMP method. The interlayer insulation film 24 having the surface planarized is thus formed.

Figure 16A:
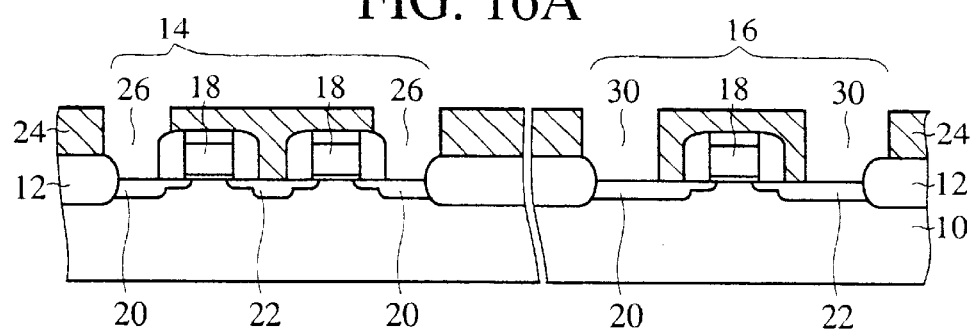
FIGS. 16A–16C, 17A–17B and 18A–18B are sectional views of the semiconductor device according to the sixth embodiment of the present invention in the steps of the method for fabricating the same, which explain the method.

Subsequently, through-holes 26, 30 opened on the source/drain diffused layers 20, 22 are formed by the usual lithography and the etching (FIG. 16A).

Subsequently, an about 50 nm-thick doped polycrystalline silicon film, an about 1.5 μm-thick tungsten (W) film, and an about 300 nm-thick silicon nitride film are continuously formed.

Next, the silicon nitride film in the memory cell region is selectively removed by the usual lithography and etching.

Figure 16B:
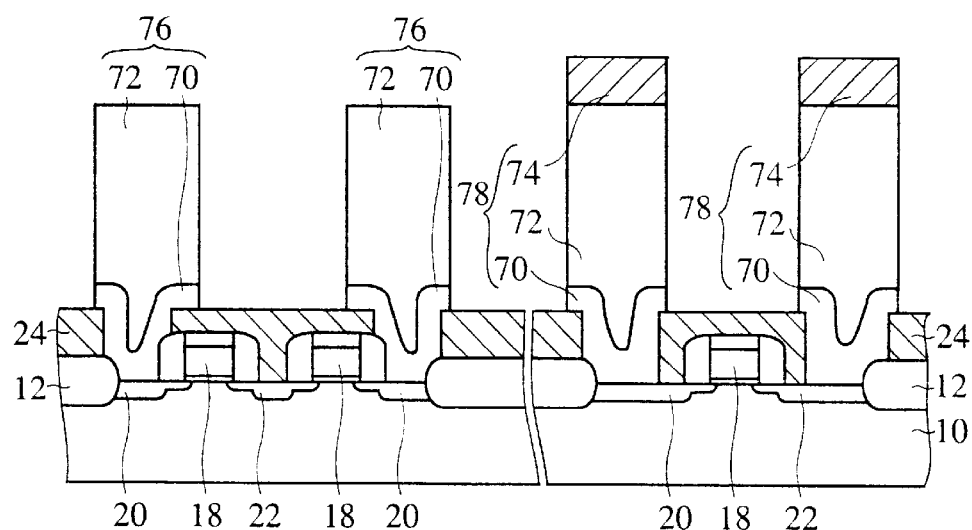

Subsequently, the silicon nitride film, the tungsten film and the polycrystalline silicon film are processed into the same pattern by the usual lithography and etching. Thus, the pillar-shaped structure 76 connected to the source/drain diffused layer 20 of the memory cell region and formed of the tungsten film 72 and the polycrystalline silicon film 70, and the pillar-shaped structure 78 connected to the source/drain diffused layers 20, 22 of the peripheral circuit transistor and formed of the cap film 74 of the silicon nitride film, the tungsten film 72 and the polycrystalline silicon film 70 are formed (FIG. 16B).

Figure 16C:
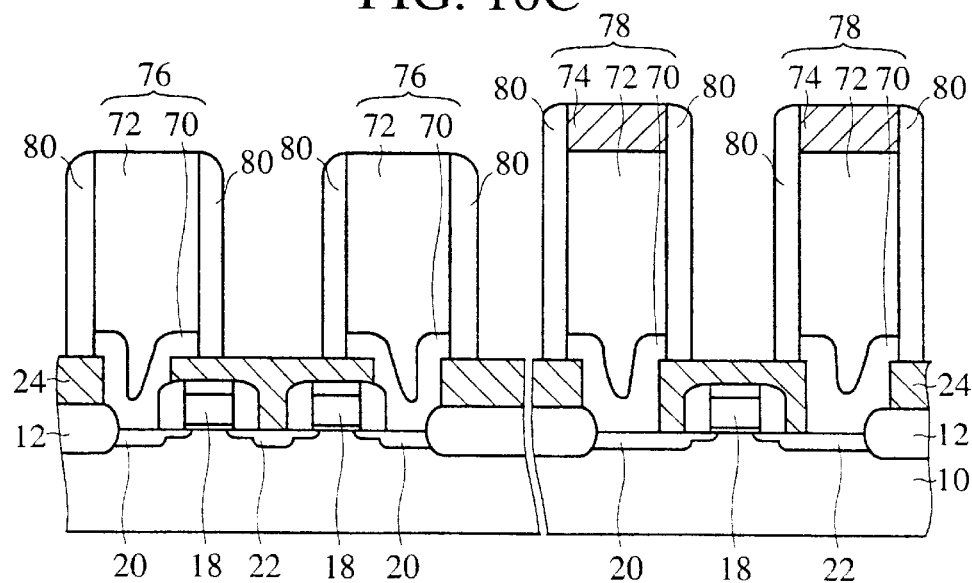

Then, doped polycrystalline silicon film is deposited by, e.g., CVD method and is anisotropically etched to form the sidewall films 80 on the sidewalls of the pillar-shaped structures 76, 78 (FIG. 16C). The sidewall film 80 of the polycrystalline silicon film is electrically connected at a lower part to the polycrystalline silicon film 70.

Figure 17A:
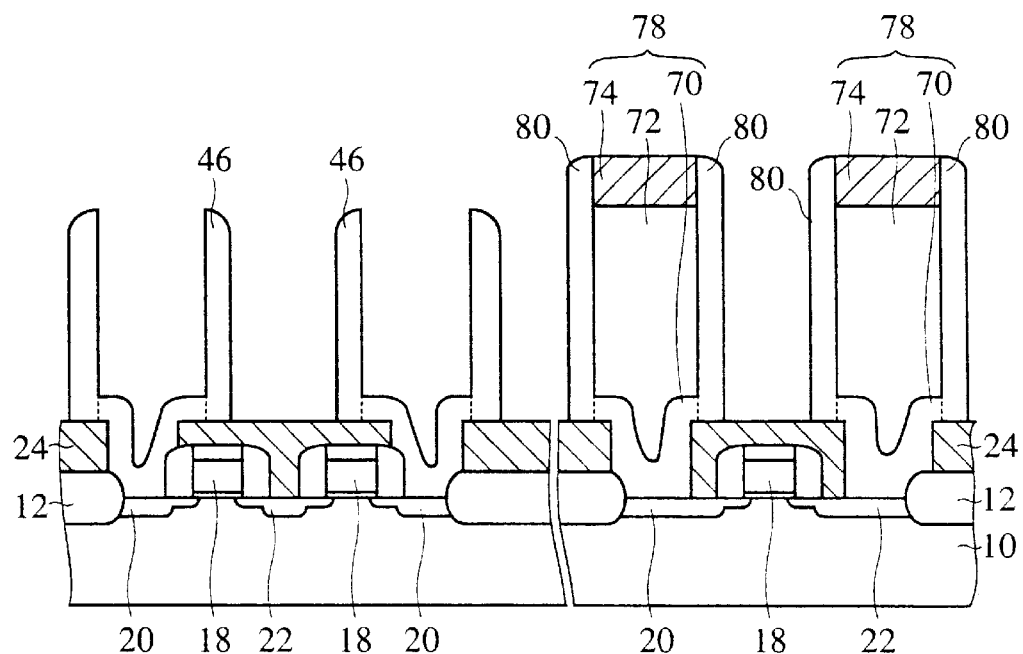

Then, the silicon substrate 10 with the pillar-shaped structures 76, 78 formed on is immersed in, e.g., a persulfuric acid solution to selectively etch the tungsten film. This etchant etches the tungsten film 72 of the pillar-shaped structure 76, which is exposed on the surface thereof but does not etch the tungsten film 72 of the pillar-shaped structure 78 having the top covered with the cap film 74 and the sides covered with the sidewall film 80. Thus the crown-shaped storage electrode 46 of the polycrystalline silicon film 70 and the sidewall film 80 can be formed in the memory cell region (FIG. 17A).

Subsequently, the dielectric film 52 of silicon oxynitride film is formed on the entire surface in the same way as in, e.g., the method for fabricating the semiconductor device according to the first embodiment.

Figure 17B:
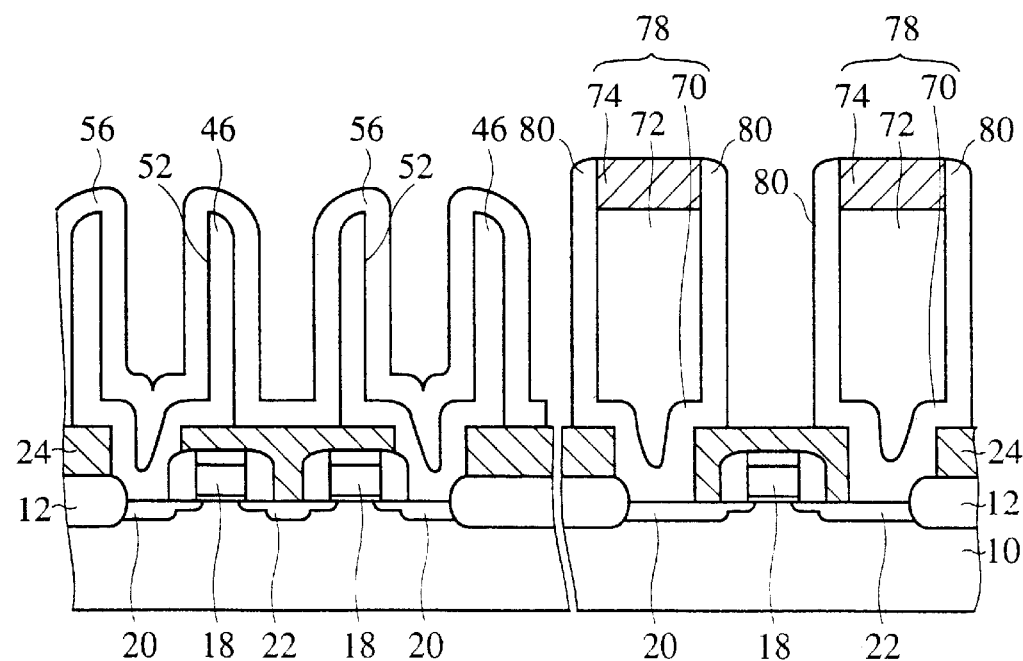

Then, an about 100 nm-thick doped polycrystalline silicon film, for example, is deposited to form the opposed electrode 56 of the polycrystalline silicon film only in the memory cell region (FIG. 17B). Thus, the capacitor having the crown-shaped electrode is formed.

Figure 18A:
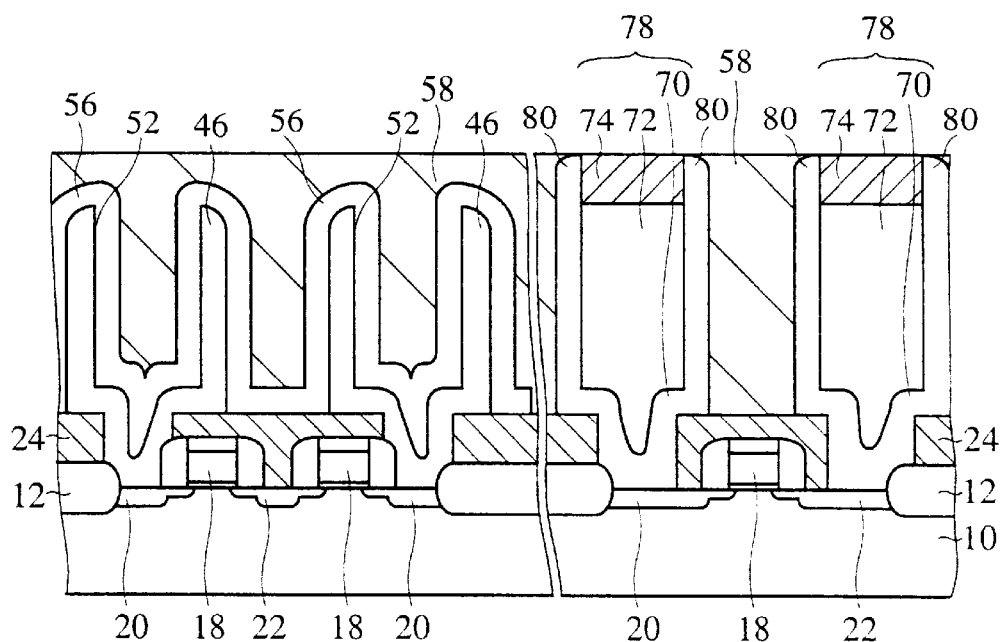

Next, an about 2.0 μm-thick silicon oxide film is deposited by, e.g., CVD method, and the surface of the silicon oxide film is polished by CMP method. Thus, the inter-layer insulation film 58 having the surface planarized is formed (FIG. 18A). The polishing can be finished with good controllability by conducting the polishing with the cap film 74 of the pillar-shaped structure 78 as an etching stopper.

Subsequently the cap film 74 of the pillar-shaped structure 78 is etched to expose the tungsten film 72. The tungsten film 72, which is connected to the source/drain diffused layers 20, 22 through the polycrystalline silicon film 70, functions as the contact plug for leading the interconnection from the peripheral circuit. The cap film 74 is merely etched to thereby open the contact region in self-alignment with the base pattern, which permits the contact hole connected to the peripheral circuit to be formed without a lithography step.

Figure 18B:
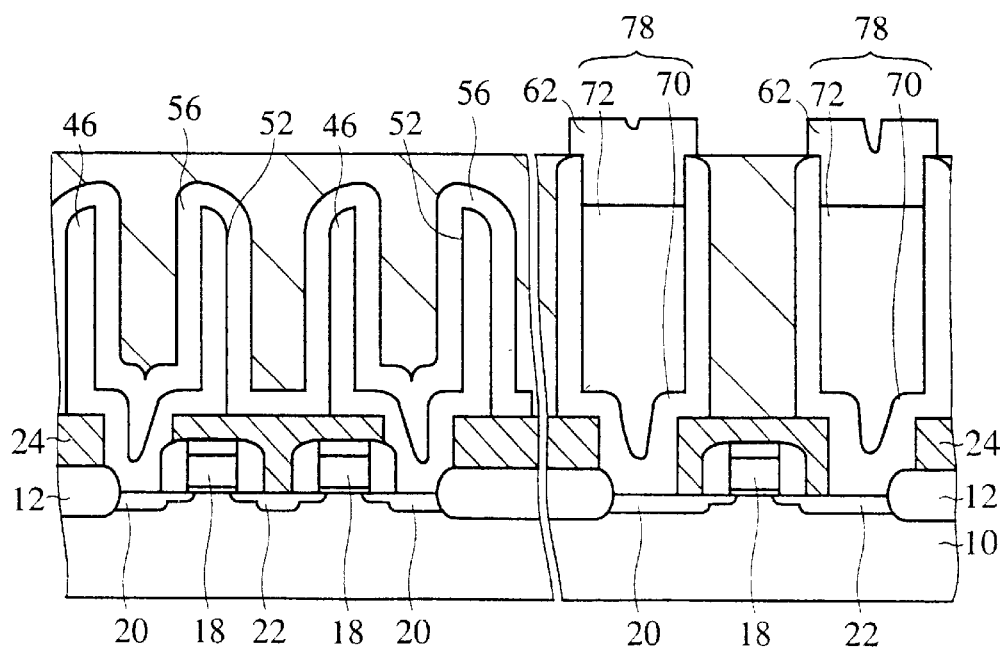

Then, a conducting film of a metal or others is deposited on the thus-formed ground substrate and patterned to form an interconnection 62 connected to the peripheral circuit through the tungsten film 72 and the polycrystalline silicon film 70 (FIG. 18B).

By thus fabricating the semiconductor device, a DRAM including the crown-shaped capacitor can be formed.

As described above, according to the present embodiment, the pillar-shaped structure 76, which is formed simultaneously with the pillar-shaped structure 78 functioning as the contact plug for leading the interconnection from the peripheral circuit is used to form the crown-shaped capacitor, which enables the contact plug for the peripheral circuit and the crown-shaped capacitor to be formed without complicating the fabrication process.

The main material (the tungsten film 72) forming the contact plug of the peripheral circuit, which is removed in forming the crow-shaped capacitor in the memory cell region, does not contact the dielectric film 52. Accordingly a main material of the contact plug can be an arbitrary material of low resistance, and the storage electrode 46 can be formed of a material having good compatibility with the dielectric film 52.

In the present embodiment, in removing the tungsten film 72 of the pillar-shaped structure 78, silicon nitride film is used as the cap film 74 for protecting the tungsten film 72 of the pillar-shaped structure 78, but other materials may be used as long as they are durable to the etching of tungsten.

Figure 19:
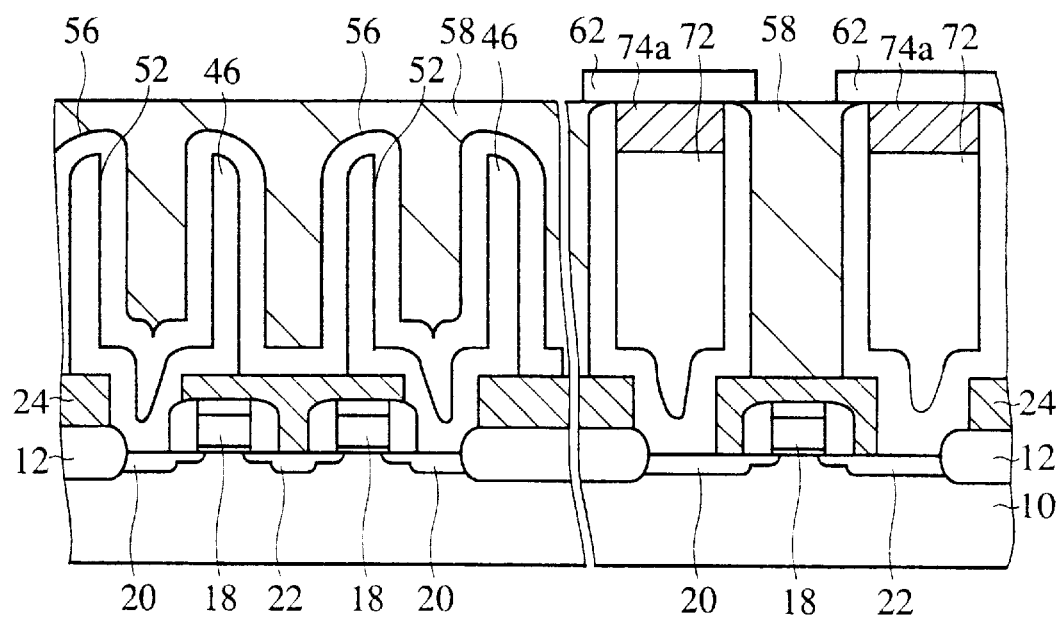
FIG. 19 is a diagrammatic sectional view of the semiconductor device according to a modification of the sixth embodiment of the present invention, which shows a structure thereof.

Especially by the use of a conducting material durable to the etching of the tungsten, e.g., polycrystalline silicon film 74a in place of the silicon nitride film, the polycrystalline silicon film 74a used as the cap film is exposed on the surface simultaneously with the planarization of the inter-layer insulation film 58, whereby the interconnection 62 connected to the peripheral circuit can be formed without removing the polycrystalline silicon film 74a (FIG. 19).

Figure 20A:
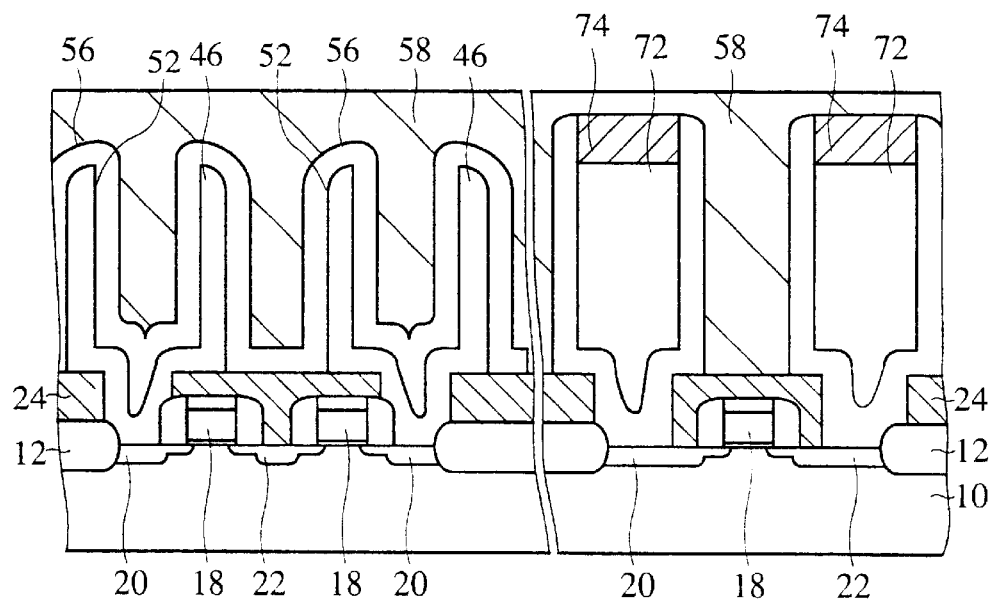
FIGS. 20A–20B and 21A–21B are sectional views of the semiconductor device according to the modification of the sixth embodiment of the present invention in the steps of the method for fabricating the same, which explain the method.
Figure 20B:
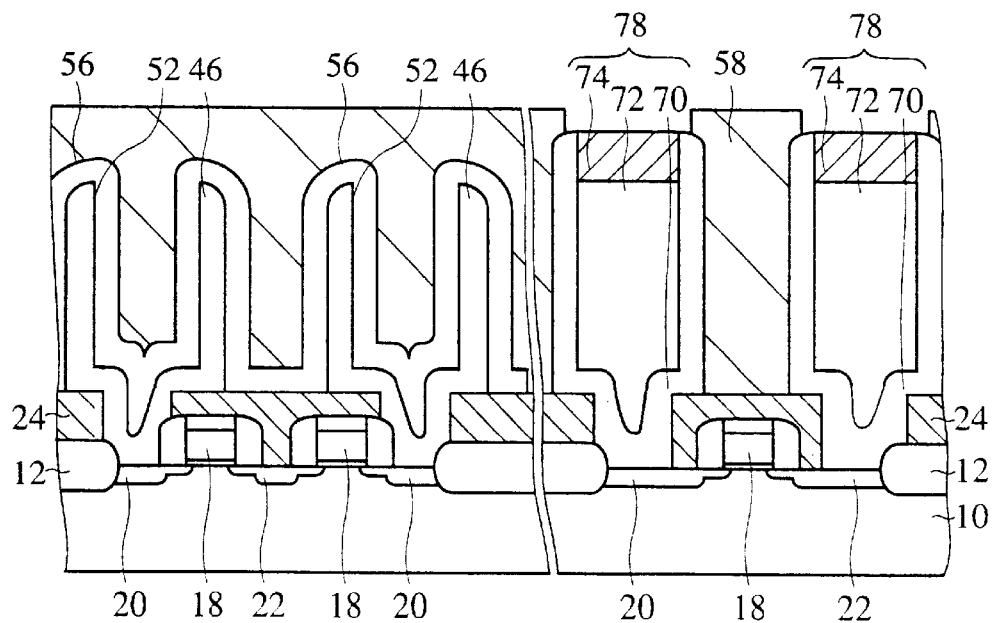

In the present embodiment, the inter-layer insulation film 58 is planarized with the cap film 74 as a stopper, but the polishing may be stopped before the cap film 74 is exposed (FIG. 20A). In this case, it is possible that the contact hole formed on the pillar-shaped structure 78 is opened in the inter-layer insulation film 58 (FIG. 20B), and then the interconnection 62 is formed as shown in FIG. 18B.

Figure 21A:
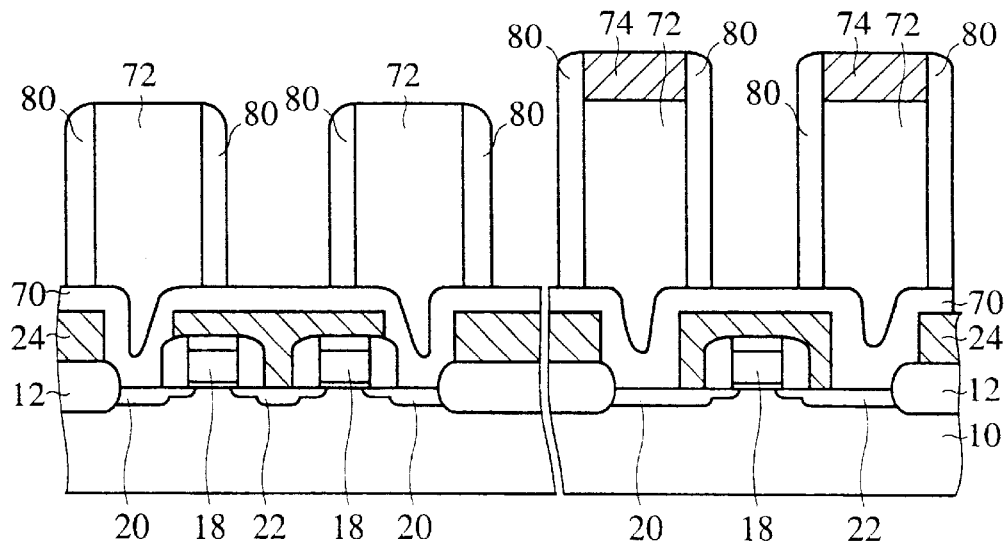
Figure 21B:
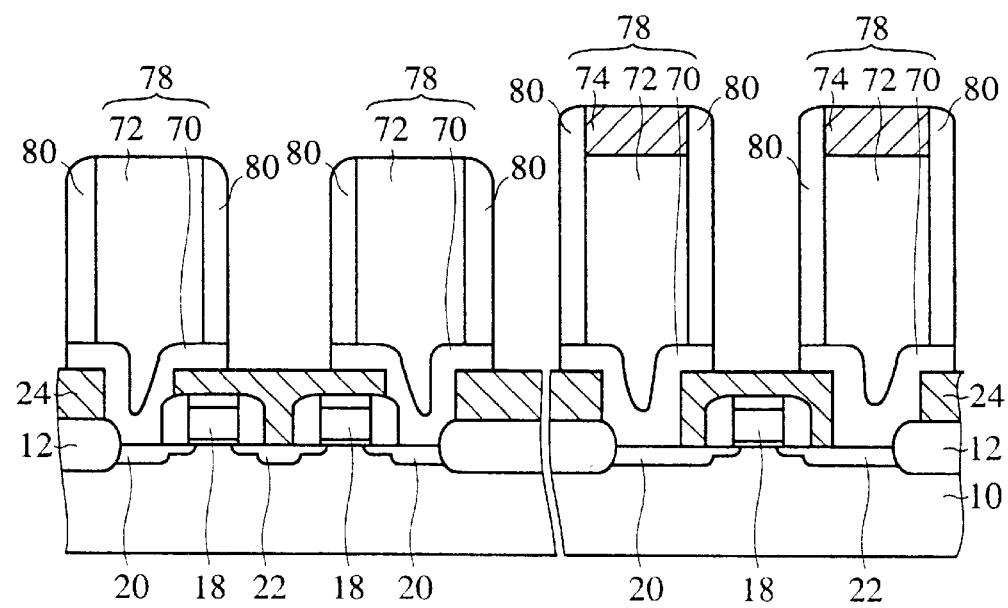

In the present embodiment, the polycrystalline silicon film 70, the tungsten film 72 and the cap film 74 are processed into the same pattern, and then the sidewall films 80 are formed on the sidewalls of the pillar-shaped structures 76, 78, but it is possible that after the tungsten film 72 and the cap film 74 are processed into the same pattern, the sidewall films 80 are formed (FIG. 21(s)), and then the polycrystalline silicon film 70 is patterned (FIG. 21B).

In the present embodiment, the silicon nitride film in the memory cell region is removed before the patterning of the tungsten film 72, but it is not necessary that the silicon nitride film removal is conducted before the patterning of the tungsten film 72 if the removal is before the step of etching the tungsten film 72 of the pillar-shaped structure 76. For example, the etching may be conducted after the pillar-shaped structures 76, 78 are formed, or after the sidewall films 80 are formed on the sidewalls of the pillar-shaped structures 76, 78.

In the present embodiment, the tungsten film 72 of the pillar-shaped structure 78 is protected by forming in advance the cap film 74 of silicon nitride film, but it is possible that a resist pattern covering the tungsten film 72 of the pillar-shaped structure 78 is formed before the etching of the tungsten film 72 of the pillar-shaped structure 76, and with the resist as a mask, the tungsten film 72 of the pillar-shaped structure 78 is etched.

In a case that the resist does not achieve sufficient masking function, a film to be a mask material is formed on the entire uppermost layer, then a resist pattern is transferred to the mask material, and the etching is conducted with the mask material as the mask.

[A Seventh Embodiment]

The method for fabricating the semiconductor device according to a seventh embodiment of the present invention will be explained with reference to FIGS. 22A–22B and 23. The same members of the present embodiment as those of the semiconductors according to the first to the sixth embodiments and the methods for fabricating the same are represented by the same reference numerals not to repeat or simplify their explanation.

Figure 22A:
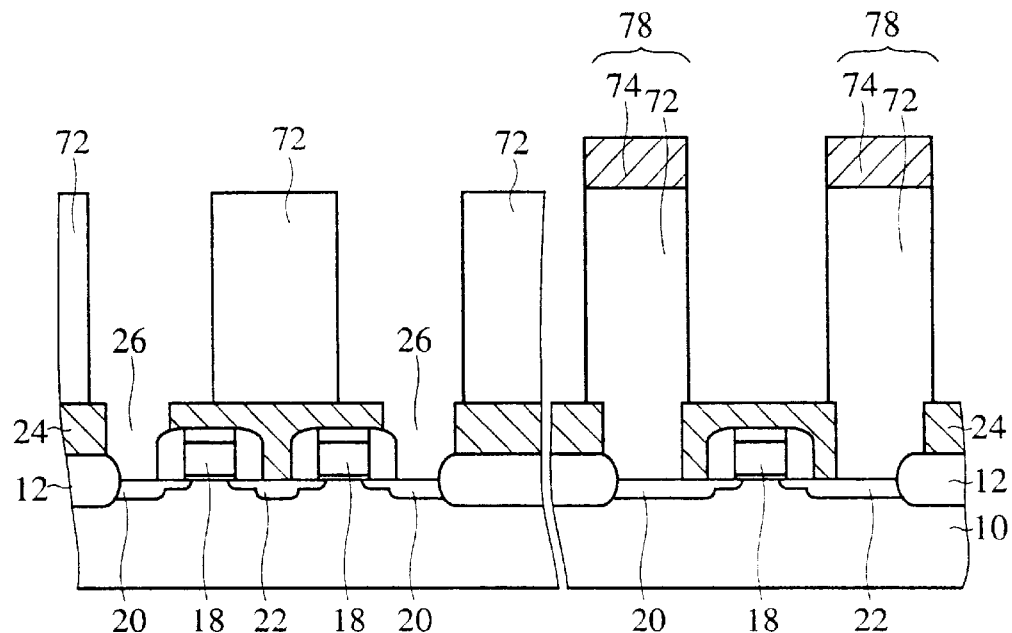
FIGS. 22A–22B and 23 are sectional views of the semiconductor device according to a seventh embodiment of the present invention in the steps of the method for fabricating the same, which explain the method.
Figure 22B:
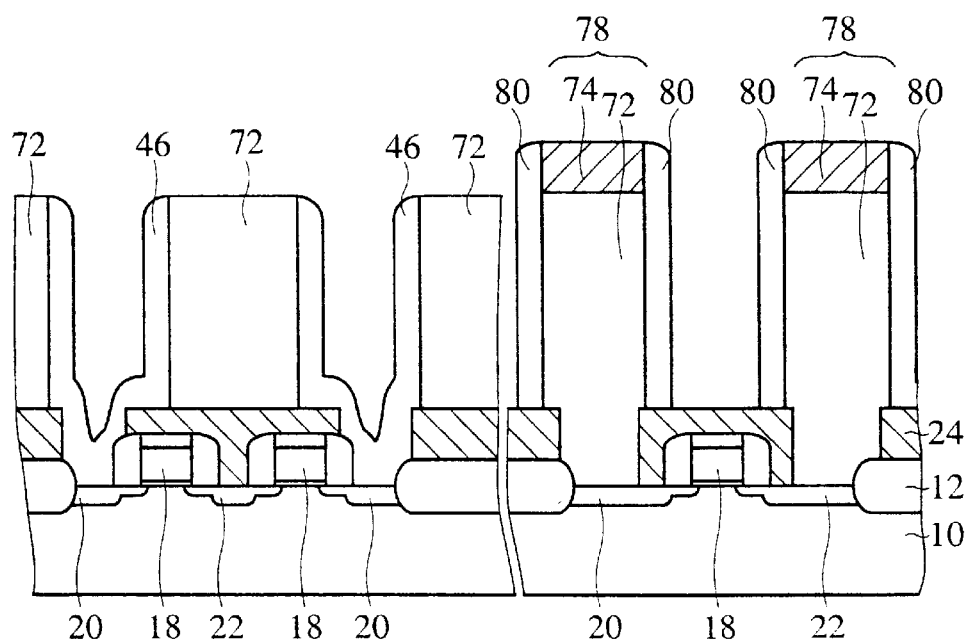
Figure 23:
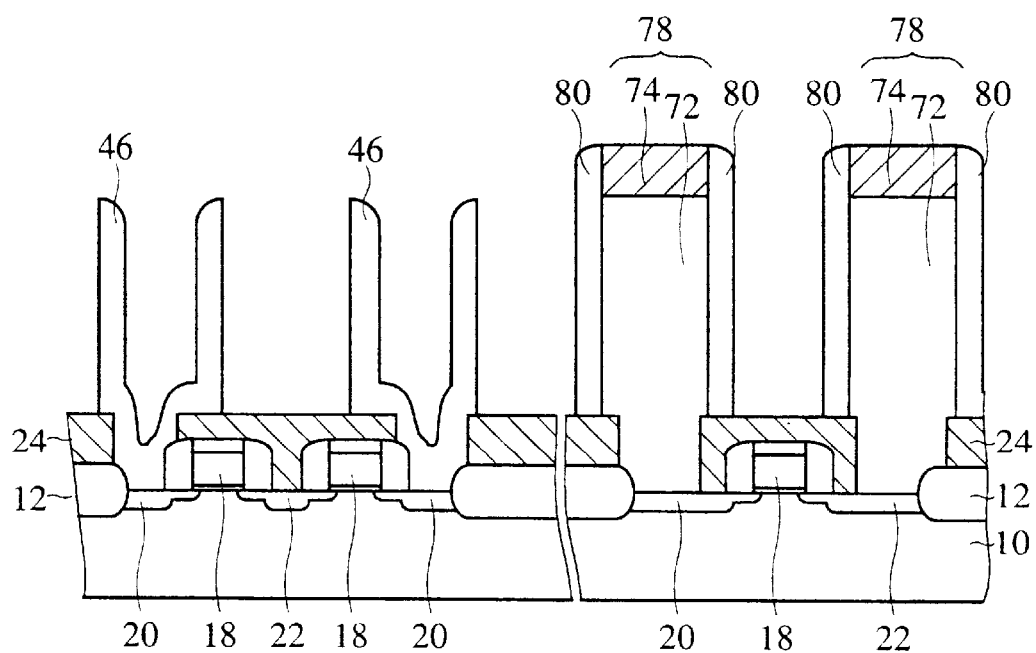

FIGS. 22A–22B and 23 are sectional views of the semiconductor device according to the present embodiment in the steps of the method for fabricating the same, which explain a structure thereof and the method.

In the method for fabricating the semiconductor device according to the sixth embodiment, the crown-shaped capacitor is formed by the use of the tungsten film forming the contact plug of the peripheral circuit, but the crown-shaped capacitor can be formed by a different method.

In the present embodiment, another method for fabricating a semiconductor device including the crown-shaped capacitor.

In the same way as in the method for fabricating the semiconductor device according to, e.g., the sixth embodiment, a memory cell transistor and a transistor for a peripheral circuit are formed respectively in a device region 14 and in a device region 16, and an inter-layer insulation film 24 opened through-holes 26, 30 on source/drain diffused layers 20, 22 are formed (FIG. 16A).

Then, an about 1.5 μm-thick tungsten film 72 and an about 300 nm-thick silicon nitride film are continuously formed by, CVD method.

Subsequently the cap film 74 in the memory cell region is selectively removed by the usual lithography and etching.

The cap film 74 and the tungsten film 72 are processed into the same pattern by the usual lithography and etching. At this time, the tungsten film 72 residing in the memory cell region is formed on the inter-layer insulation film 24 in a region without the through-hole 26 formed in, as is in the sixth embodiment (FIG. 22A). That is, the tungsten film 72 is patterned into a pattern having an opening formed on the region including the through-hole 26. In relation with the semiconductor device according to the sixth embodiment, the tungsten film 72 in the memory cell region have a negative pattern and a positive pattern which are opposite to those of the tungsten film in the memory cell region of the sixth embodiment.

Then, an about 100 nm-thick polycrystalline silicon film is deposited, and the polycrystalline silicon film on the tungsten film 72, a cap film 74, and the inter-layer insulation film 24 between the pillar-shaped structures 78 is selectively removed. The polycrystalline silicon film only on the tungsten film 72, the cap film 74, and the inter-layer insulation film 24 between the pillar-shaped structures 78 can be removed by, e.g., polishing the surfaces by CMP method, or etching the polycrystalline silicon film with a resist film buried in the opening.

A storage electrode 46 is thus formed on the inside wall of the opening in the tungsten film 72 in the memory cell region, and a sidewall film 80 of the polycrystalline silicon film is formed on the sidewalls of the pillar-shaped structure 78 (FIG. 22B).

Subsequently, the silicon substrate 10 with the storage electrode 46 and the pillar-shaped structure 78 is immersed in, e.g., a persulfuric acid solution to selectively etch the tungsten film 72. The tungsten film 72 in the memory cell region, the top surface of which is exposed, is etched by this etching, but the tungsten film 72 forming the pillar-shaped structure 78, the tops surface of which is covered with the cap film 74 and the sidewalls of which is covered with the sidewall film 80, is not etched (FIG. 23).

Then, in the same way as in the method for fabricating the semiconductor device according to, e.g., the sixth embodiment shown in FIGS. 17B to 18C, a dielectric film 52, an opposed electrode 56, etc. are formed, whereby a DRAM including the crown-shaped capacitor can be fabricated.

As described above, according to the present embodiment, the contact plug connected to the peripheral circuit is formed, and simultaneously therewith the crown-shaped capacitor is formed by the use of the process, whereby the contact plug for the peripheral circuit and the crown-shaped capacitor are formed without complicating the fabrication method.

[An Eighth Embodiment]

The semiconductor device according to an eighth embodiment of the present invention, and the method for fabricating the same will be explained with reference to FIGS. 24A–24B, 25A–25B, 26A–26B and 27. The same reference numerals of the present embodiment as those of the semiconductor device according to the first to the seventh embodiments and the methods for fabricating the same are represented by the same reference numerals not to repeat or simplify their explanation.

FIGS. 24A–24B, 25A–25B, 26A–26B and 27 are sectional views of the semiconductor device according to the present embodiment in the steps of the method for fabricating the same, which explain the method.

The method for fabricating the semiconductor device according to the sixth embodiment shows an example of patterning the tungsten film 72 with a resist film as a mask to form the pillar-shaped structure 76. However, the generally used resist materials have low durability to the etching of the tungsten film 72, and the resist film is abraded as the etching of the tungsten film 72 advances and finally often makes the etching with the resist film as a mask difficult.

On the other hand, to form the crown-shaped capacitor it is necessary to remove a tungsten film 72 of a pillar-shaped structure 76 in a later step, and to this end, the etching mask is not allowed to remain on the tungsten film for the etching.

The present embodiment shows a method for fabricating a semiconductor device which can realize these requirements without complicating the fabrication process.

First in the same way as in the method for fabricating the semiconductor device according to, e.g., the sixth embodiment, a memory cell transistor and a transistor for a peripheral circuit are formed respectively in a device region 14 and a device region 16, and an inter-layer insulation film 24 with through-holes 26, 30 formed in source/drain diffused layers 20, 22 (FIG. 16A).

Figure 24A:
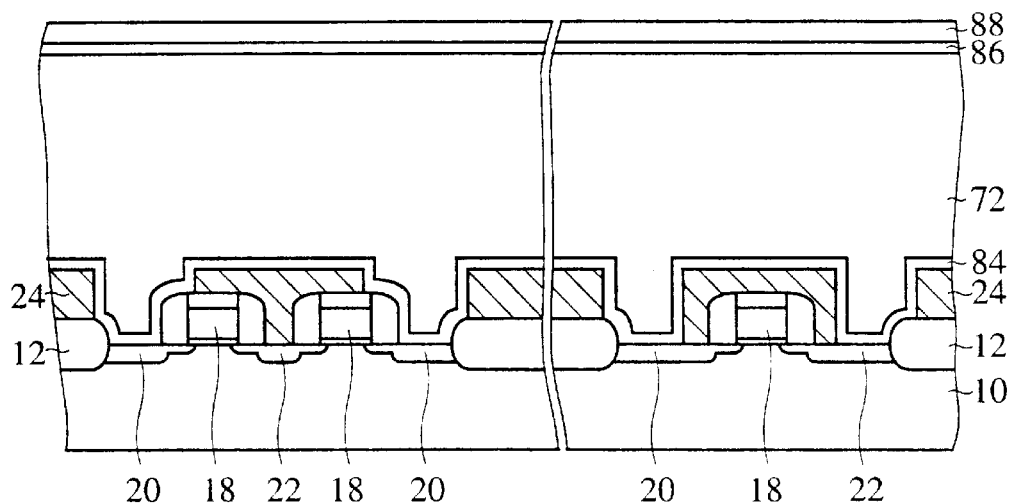
FIGS. 24A–24B, 25A–25B, 26A–26B and 27 are sectional views of the semiconductor device according to an eighth embodiment of the present invention in the steps of the method for fabricating the same, which explain the method.

Next, a TiN film 84 to be a barrier of a silicon substrate 10 to tungsten film, a tungsten film 72 as a main material forming a contact plug for the peripheral circuit, a TiN film functioning as a mask in patterning the tungsten film 72, and a silicon oxide film 88 to be an etching mask in removing the tungsten film in the memory cell region are continuously deposited (FIG. 24A).

As described above, the method for fabricating the semiconductor device according to the present embodiment is characterized in that the cap film of silicon nitride film used in the sixth embodiment is formed of a layer structure of the TiN film 86 and the silicon oxide film 88, and is also characterized in that a barrier metal formed below the tungsten film 72 is formed of the same material (TiN film 84) as a material (TiN film 86) of the cap film.

Figure 24B:
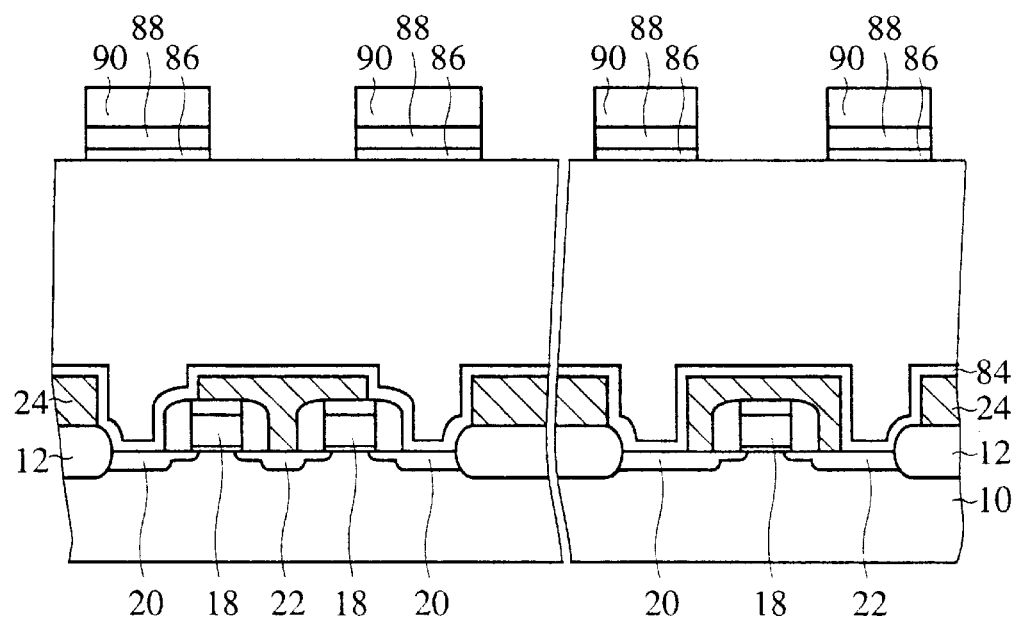

Subsequently the silicon oxide film 88 and the TiN film 86 are etched with a resist film 90 as a mask by the usual lithography and etching into the same pattern (FIG. 24B). The pattern corresponds to the pattern of the pillar-shaped structures 76, 78 of the sixth embodiment.

Figure 25A:
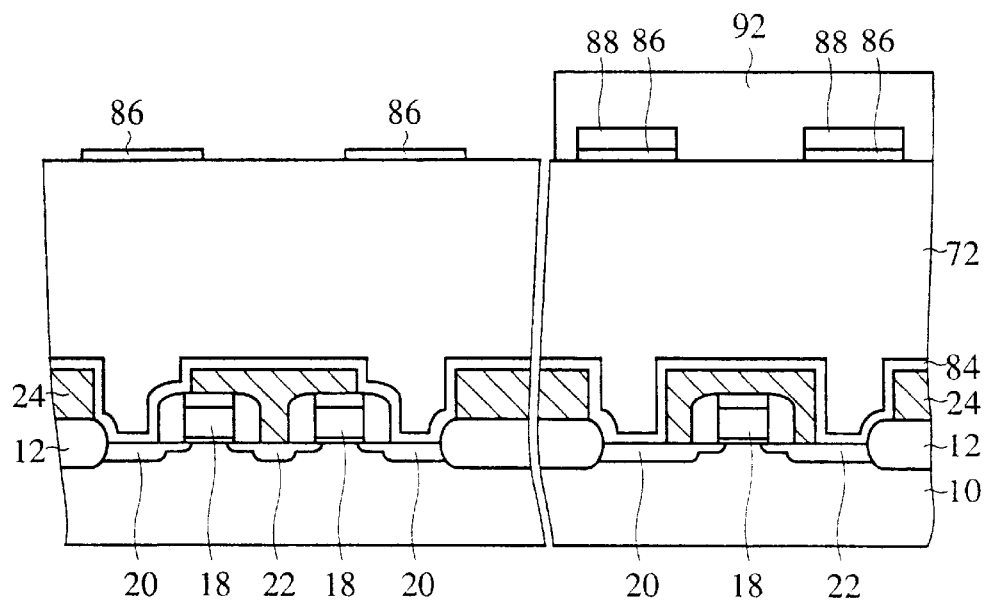

Then, a resist film 92 for covering a peripheral circuit region is formed by the usual lithography, and the silicon oxide film 88 is etched with the resist film 92 as a mask to selectively remove the silicon oxide film 88 only in the memory cell region (FIG. 25A). The etching by, e.g., a mixed gas of $C_4F_8$ and CO can remove the silicon oxide film without damaging the TiN film 86.

Figure 25B:
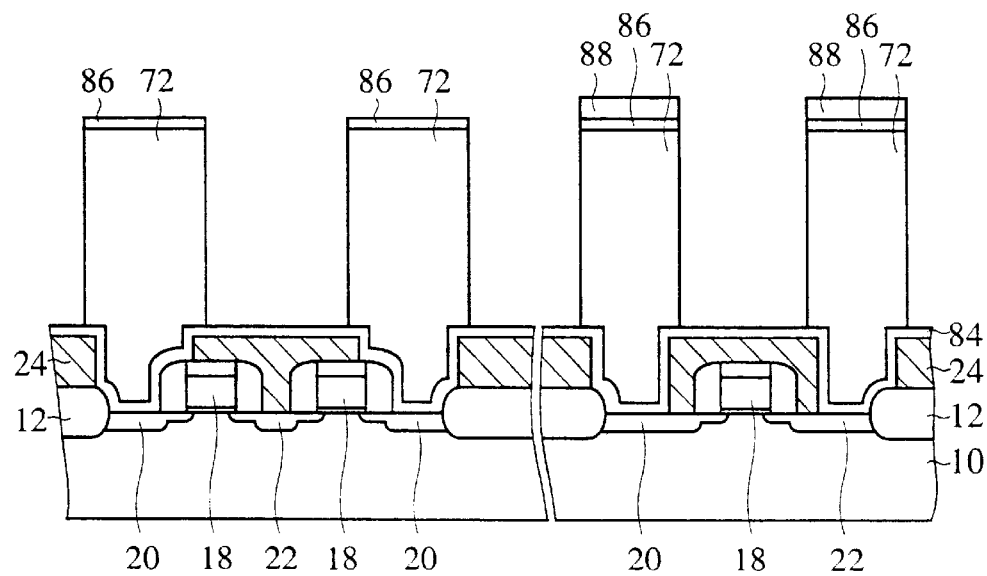

After the resist film 92 is removed, the tungsten film 72 is etched with the TiN film 86 and/or the silicon oxide film 88 as a mask (FIG. 25B). The etching by a mixed gas of, e.g., $Cl_2$ and $O_2$ can remove the tungsten film 72 without damaging the TiN films 84, 86, and the silicon oxide film 88.

Figure 26A:
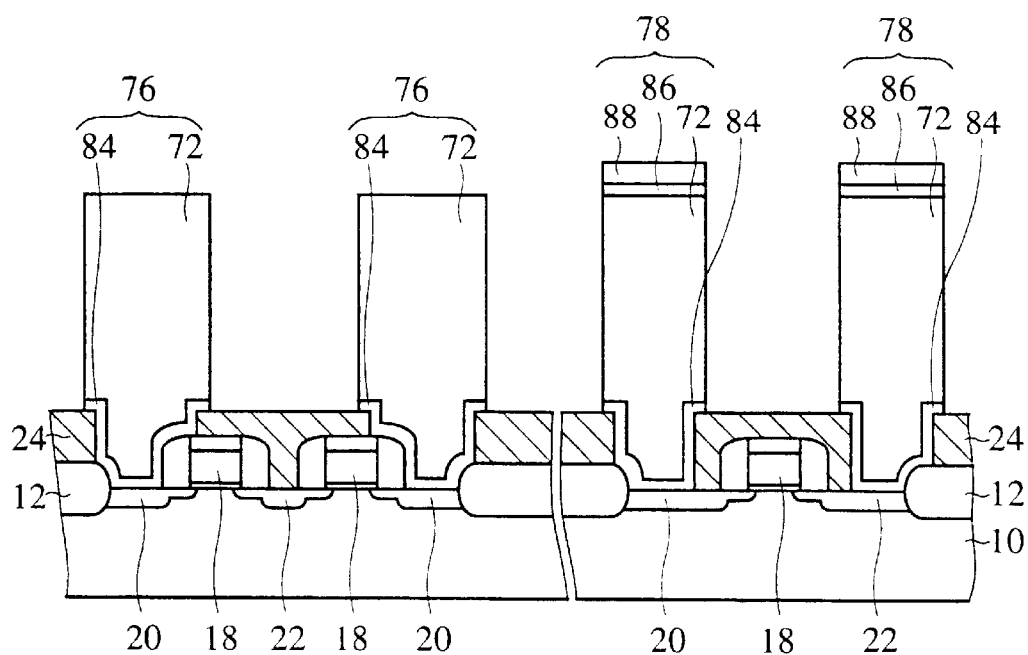

Then, the TiN film 84 is etched with the silicon oxide film 88 and the tungsten film 72 as a mask. At this time, the TiN film 86, which is exposed on the tungsten film 72 in the memory cell region, is concurrently removed by the etching of the TiN film 84. Thus, the pillar-shaped structure 76 of the tungsten film 72 and the TiN film 84 is formed in the memory cell region, and the pillar-shaped structure 78 of the silicon oxide film 88, TiN film 86, the tungsten film 72 and the TiN film 84 is formed in the peripheral circuit region (FIG. 26A).

Figure 26B:
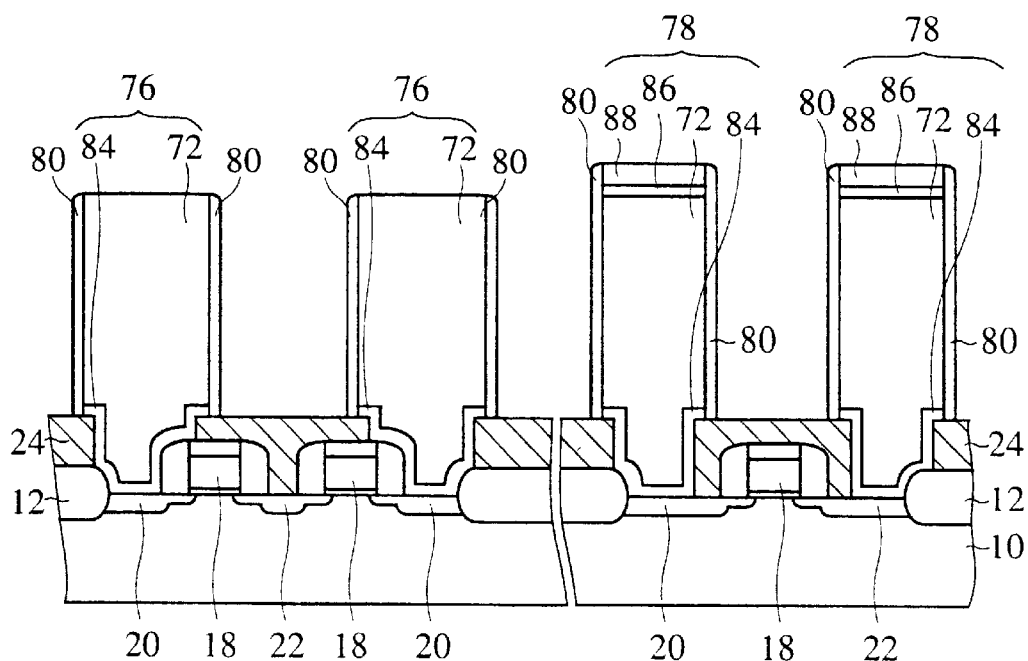

Subsequently, doped polycrystalline silicon film is deposited by, e.g., CVD method and anisotropically etched to form a sidewall films 80 on the sidewalls of the pillar-shaped structures 76, 78 (FIG. 26B). The sidewall films 80 of the doped polycrystalline silicon film are electrically connected at lower parts thereof to the TiN film 84.

Figure 27:
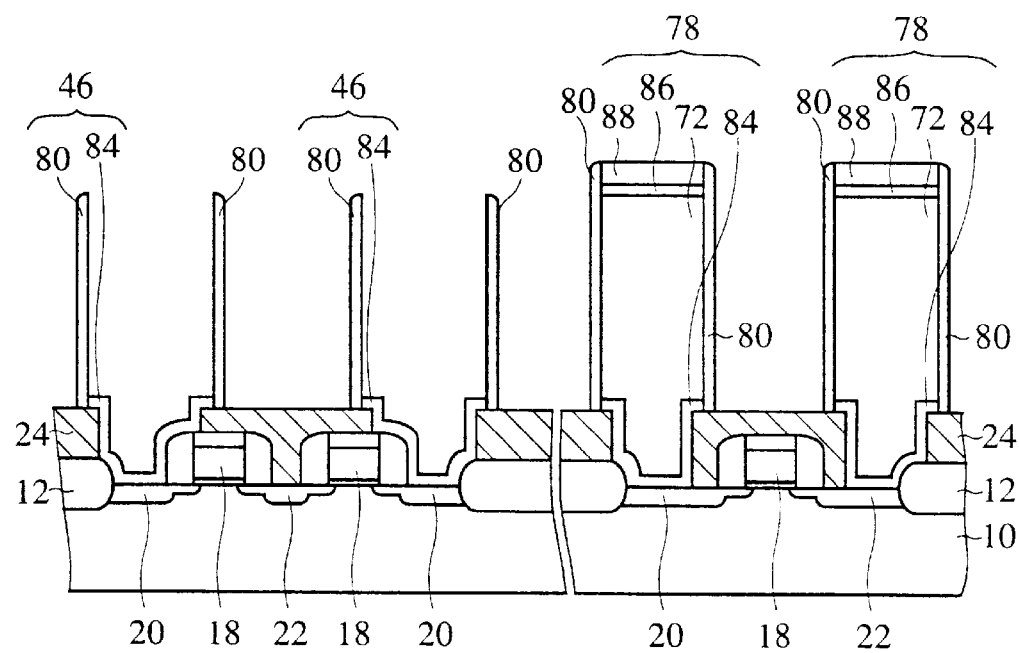

Then, the silicon substrate 10 with the pillar-shaped structures 76, 78 formed on is immersed in, e.g., warm sulfuric acid to selectively etch the tungsten film 72. The tungsten film 72 of the pillar-shaped structure 76 having the top surface exposed is etched by this etching, but the tungsten film 72 of the pillar-shaped structure 78 having the top surface covered with the silicon oxide film 88 and the TiN film 86 and the sidewalls covered with the sidewall films 80 is no etched. Thus a crown-shaped storage electrode 46 of the TiN film 84 and the sidewall films 80 is formed in the memory cell region (FIG. 27).

Subsequently in the same way as in the method for fabricating the semiconductor device according to, e.g., the sixth embodiment shown in FIGS. 17B to 18B, a dielectric film 52, an opposed electrode 56, etc. are formed to fabricate a DRAM including the crown-shaped capacitor.

As described above, according to the present embodiment, the layer structure of the TiN film 86 and the silicon oxide film 88 is used as the cap film covering the pillar-shaped structure 78, and the barrier metal formed below the tungsten film 72 is formed of the same material (TiN film 84) as a material (TiN film 86) forming the cap film, whereby the pillar-shaped conductor without the cap film in the memory cell region, and the pillar-shaped structure 76 with the cap film formed in the peripheral circuit region can be stably formed.

In the present embodiment, the storage electrode 46 is formed of TiN film, which allows the dielectric film 52 to be formed of, e.g., $Ta_2O_5$. In this case, it is preferable that the opposed electrode 56 is also formed of TiN film.

In the present embodiment, the barrier metal is provided by the TiN film 84, but in depositing TiN film on a silicon substrate, generally a contact metal of, e.g., Ti film is intervenes between the silicon substrate and the TiN film so as to lower contact resistance between the silicon substrate and the TiN film. This structure is applicable to the present embodiment, and a layer structure of TiN film/Ti film may be used in place of the TiN film 84.

In the present embodiment, the cap film used in etching the tungsten film 72 is provided by a layer film of the TiN film 86, which is durable to the anisotropic etching of the tungsten film 72, and the silicon oxide film 88, which is durable to the etching by a persulfuric acid solution, but other material may be used as long as they have such properties. Chrome (Cr) film, for example, may be used in place of the TiN film 86, and silicon nitride film may be used in place of the silicon oxide film 88. Preferably these materials are suitably selected in accordance with a main material (the tungsten film 72 in the present embodiment) of the contact plug.

It is not essential that the cap film is formed of a layer film as in the present embodiment if the cap film is formed of a material which is durable both to the etching for forming the pillar-shaped conductors and to the etching for forming the crown-shaped capacitor. The cap film may be a layer structure of three or more layers.

The present embodiment shows an example that semiconductor device according to the sixth embodiment has the cap structure replaced by the new cap structure. The new cap structure is applicable to the seventh embodiment, which is not substantially different form the sixth embodiment in removing the tungsten film 72.

[A Ninth Embodiment]

The semiconductor device according to a ninth embodiment and the method for fabricating the same will be explained with reference to FIGS. 28A and 28B. The same members of the present embodiment as those of the semiconductor device according to the first to the eighth embodiments and the method for fabricating the same are represented by the same reference numerals not to repeat or simplify their explanation.

Figure 28A:
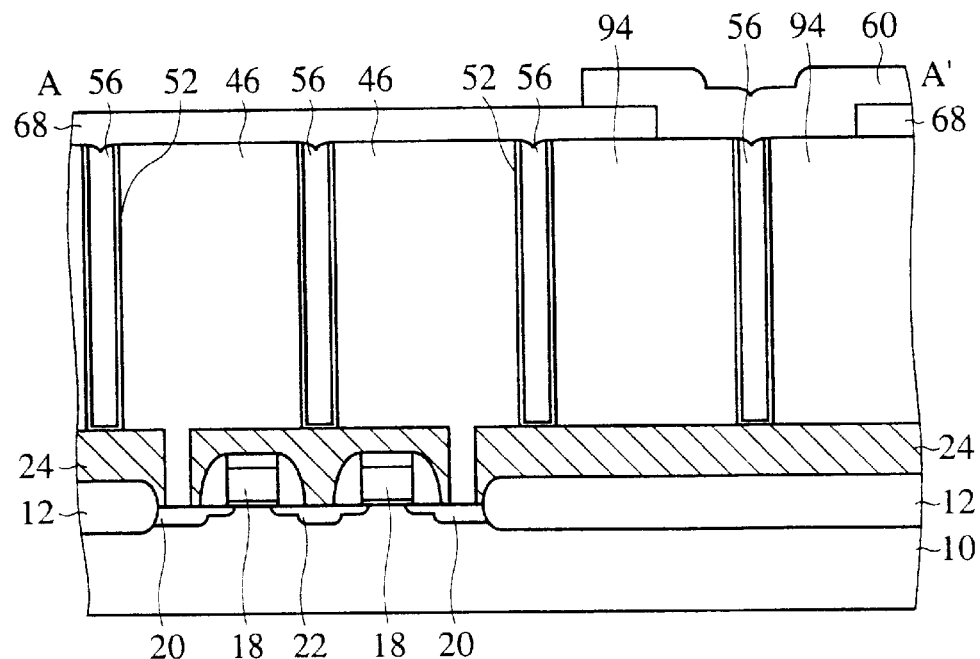
FIG. 28A is a sectional view of the semiconductor device according to a ninth embodiment of the present invention, which show a structure thereof.
Figure 28B:
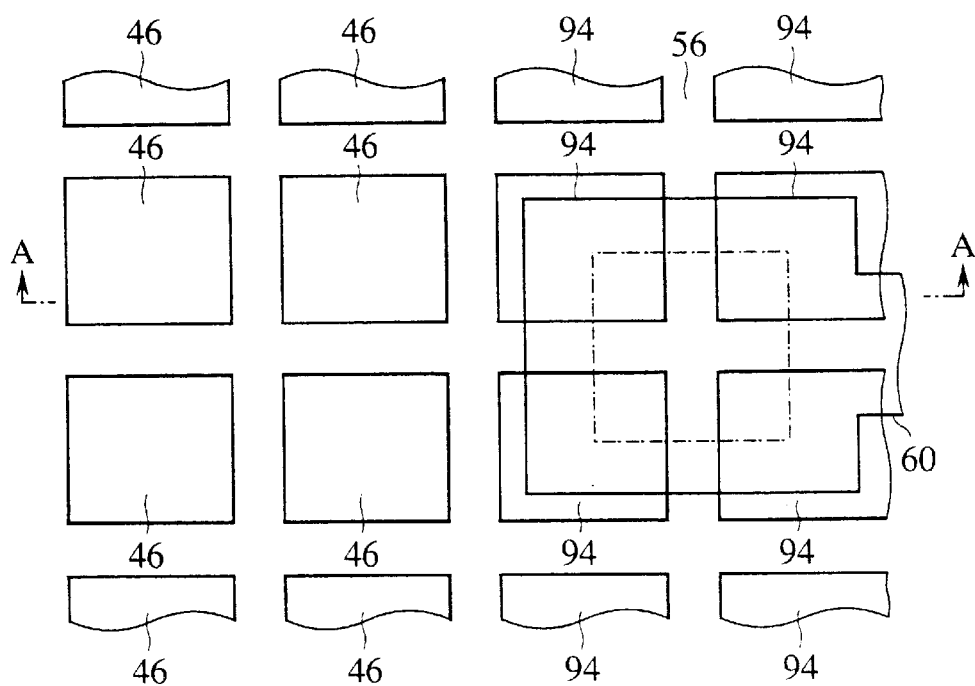
FIG. 28B is a plan view of the semiconductor device according to a ninth embodiment of the present invention, which show a structure thereof.

FIG. 28B is a plan view of the semiconductor device according to the present invention, and FIG. 28A is a sectional view along the line A–A' in FIG. 28A.

The semiconductor device according to the present embodiment is characterized in that a contact between the opposed electrode and an interconnection connected to the opposed electrode are formed in a region where a dummy electrode of the same conducting layer as a storage electrode is formed.

That is, dummy electrodes 94 which are formed of the same conducting layer as storage electrodes 46 and are not connected to the other devices are formed in a part of a memory cell region where the storage electrodes 46 are formed in a mesh arrangement. Opposed electrodes 56 are buried between the storage electrodes 46 and the dummy electrodes 94 through a dielectric film 52. Thus, the storage electrodes 46 and the dummy electrodes 94 are formed in the mesh of the opposed electrodes 56 (FIG. 28B).

On the substrate with a capacitor constituted by the storage electrode 46, the dielectric film 52 and the opposed electrode 56 an inter-layer insulation film 68 having an opening formed on the opposed electrode 56 near the dummy electrode 94 is formed. An interconnection 60 connected to the opposed electrode 56 in the opening is formed on the inter-layer insulation film 68 (FIG. 28A).

Here, it is necessary that the interconnection 60 is not connected to the storage electrode 46 but is connected to the opposed electrode 56. Because of the dummy electrode 94 formed in place of the storage electrode 48 in the contact, the interconnection 60 can be led from the opposed electrode 56 without shorting the storage electrode 46 with the opposed electrode 56.

In a case that the dummy electrode 94 is not provided, a contact hole for connecting the interconnection 60 must be opened exactly on the opposed electrode 56, which requires very highly precise alignment. However, because of the dummy electrode 94, a contact hole connecting to the opposed electrode 56 may be extended over the dummy electrode 94 without any trouble, which can much mitigate the alignment precision for opening the contact hole.

The contact hole for connecting the interconnection 60 can be opened simultaneously with opening a contact hole for connecting to a contact plug (not shown) in a peripheral circuit, which permits the contact holes to be opened without adding to lithography steps.

The semiconductor device shown in FIG. 28A can be fabricated in the same way as in the method for fabricating the semiconductor device according to, e.g., the first embodiment shown in FIGS. 2A to 4B because the dummy electrode 94 is formed of the same conducting layer as the storage electrode 46 as in the semiconductor device according to the first embodiment except that the dummy electrode 94 is not connected to the source/drain diffused layer 20.

As described above, according to the present embodiment, the dummy electrode 94 formed of the same conducting layer as the storage electrode 46 is provided, and the interconnection 60 connected to the opposed electrode 56 is led from the region where the dummy electrode 94 is formed, whereby the interconnection 60 can be easily led from the opposed electrode 56.

In the present embodiment, the case that the cap film 50 is not provided on the storage electrode 46 and the pillar-shaped conductor 48 is explained, but the present embodiment is applicable to the case that a cap film 50 of silicon nitride film or others provided on the storage electrode 46 and the pillar-shaped conductor 48. The present embodiment is also applicable to the case that the top surfaces of the storage electrode 46 and the pillar-shaped conductor 48 is covered with a conducting film of polycrystalline silicon film or others.

In the method for fabricating the semiconductor device according to one modification of the first embodiment shown in FIG. 6, isotropic etching is used to form the opposed electrode 56. In a case that such etching is used, the opposed electrode 56 is not formed on the sidewall of a storage electrode 46' in a peripheral region of the memory cell (see FIG. 6B). Accordingly such storage electrode 46' is not applicable to a capacitor of a memory cell. Then, the storage electrode 46' is used as the dummy electrode 94 of the present embodiment to thereby constitute a semiconductor device.

By applying the dummy electrode 94, the sidewall film 54 dose not remain on the sidewall of the pillar-shaped conductor 48, which can improve integration around the contact in the peripheral circuit region.

[A Tenth Embodiment]

The semiconductor device according to a tenth embodiment of the present invention and the method for fabricating the same will be explained with reference to FIGS. 29, 30A–30B and 31A–31B. The same members of the present embodiment as those of the semiconductor device according to the first to the ninth embodiments of the present invention and the method for fabricating the same are represented by the same reference numerals not to repeat or simplify their explanation.

Figure 29:
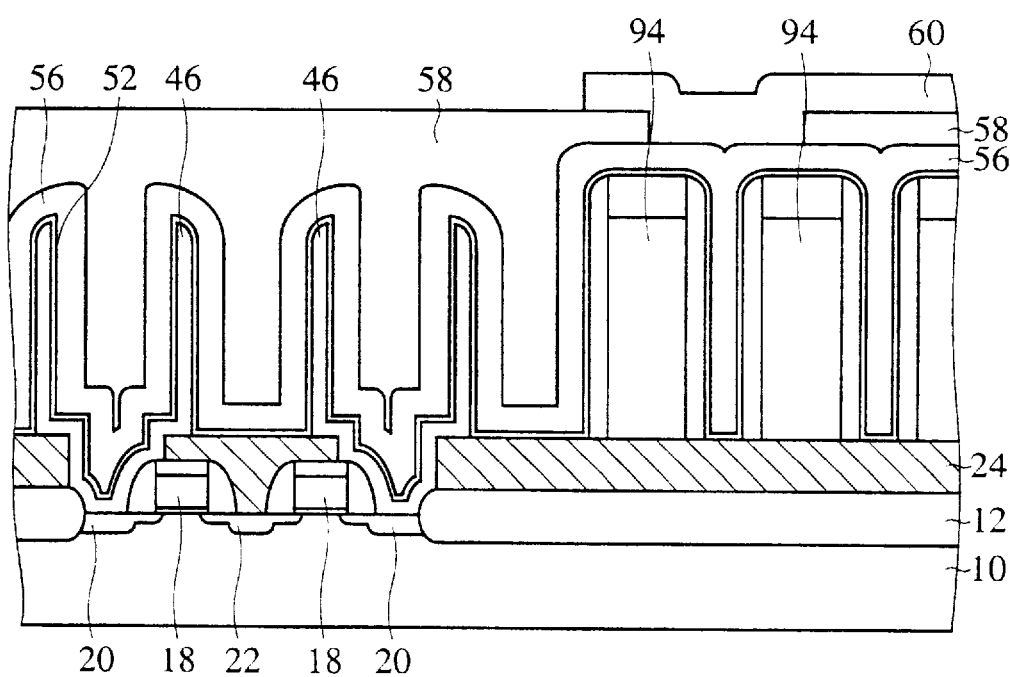
FIG. 29 is a diagrammatic sectional view of the semiconductor device according to a tenth embodiment of the present invention, which shows a structure thereof.

FIG. 29 is a diagrammatic sectional view of the semiconductor device according to the present embodiment, which shows a structure thereof. FIGS. 30A–30B and 31A–31B are sectional views of the semiconductor device according to the present embodiment in the steps of the method for fabricating the same, which explain the method.

The sixth to the eighth embodiments show the semiconductor device including the crown-shaped capacitor and the method for fabricating the semiconductor device, but in the semiconductor device according to these embodiments, it is difficult to lead the interconnection 60 from the opposed electrode 56 in the same way as in the first to the fifth embodiments.

However, in the same way as in the method for fabricating the semiconductor device according to the ninth embodiment, the dummy electrode 94 of the same conducting layer as the pillar-shaped structure 78 in the peripheral circuit region is provided, whereby the interconnection 60 can be led form the opposed electrode without adding to the fabrication steps.

In the present embodiment, a method for leading an interconnection 60 from an opposed electrode 56 in a semiconductor device including the crown-shaped capacitor will be explained.

The semiconductor device including the crown-shaped capacitor according to the present embodiment is characterized in that a contact between the opposed electrode 56 and the interconnection 60 connected to the opposed electrode 56 is formed in a region where a dummy electrode 94 of the same conducting layer as a pillar-shaped conductor in a peripheral circuit region (FIGS. 28 and 15).

That is, dummy electrodes 94 which are formed of the same conducting layer as the pillar-shaped conductor 78 in the peripheral circuit region and are not connected to the other devices are formed in a part of a memory cell region where storage electrodes 46 are arranged in a matrix. Opposed electrodes 56 are formed on the sidewalls and the top surfaces of the dummy electrodes 94 through a dielectric film 52, and the opposed electrodes 56 are buried in gaps between the adjacent dummy electrodes 94. The opposed electrodes 56 in this region are electrically connected to the opposed electrodes 56 surrounding the storage electrodes 46.

On a substrate with a capacitor constituted by the storage electrode 46, the dielectric film 52 and the opposed electrode 56, an inter-layer insulation film 58 with an opening formed on the region where the dummy electrode 94 is formed is formed. The interconnection 60 connected to the opposed electrode 56 in the opening is formed on the inter-layer insulation film 58.

Then, the method for fabricating the semiconductor device according to the present embodiment will be explained with reference to FIGS. 30A–30B and 31A–31B.

Figure 30A:
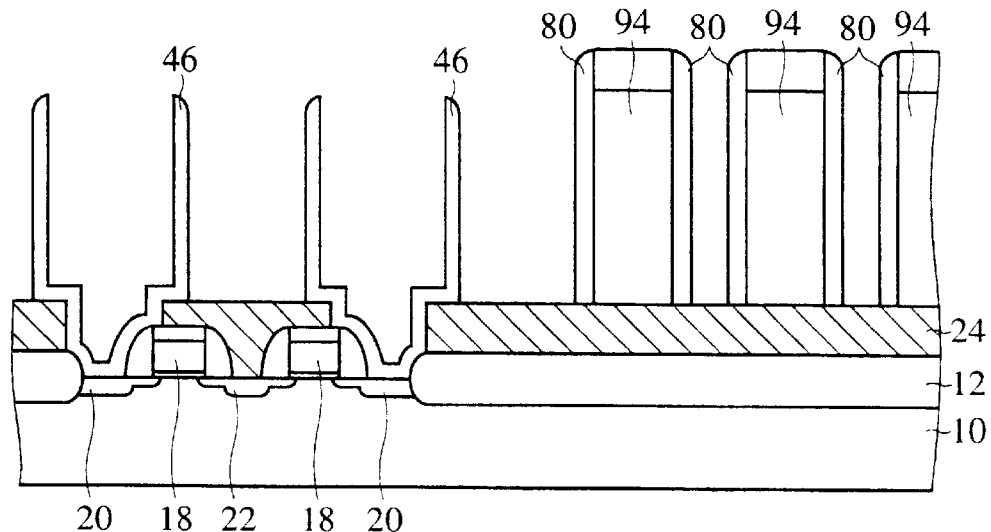
FIGS. 30A–30B and 31A–31B are sectional views of the semiconductor device according to the tenth embodiment of the present invention in the steps of the method for fabricating the same, which explain the method.

In the same way as in the method for fabricating the semiconductor device according to, e.g., the sixth embodiment shown in FIGS. 16A to 17A, the storage electrode 46 and the pillar-shaped conductor 78 (not shown) are formed on a semiconductor substrate 10. At this time a dummy electrode 94 of the same conducting layer as the pillar-shaped conductor is formed in a region adjacent to region where the storage electrode 46 is formed. The dummy electrode 94 is not connected to any of the devices on the semiconductor substrate 10 (FIG. 30A).

Next, in the same way as in the method for fabricating the semiconductor device according to, e.g., the sixth embodiment, a dielectric film 52 of silicon oxynitride film is formed on the entire surface.

Figure 30B:
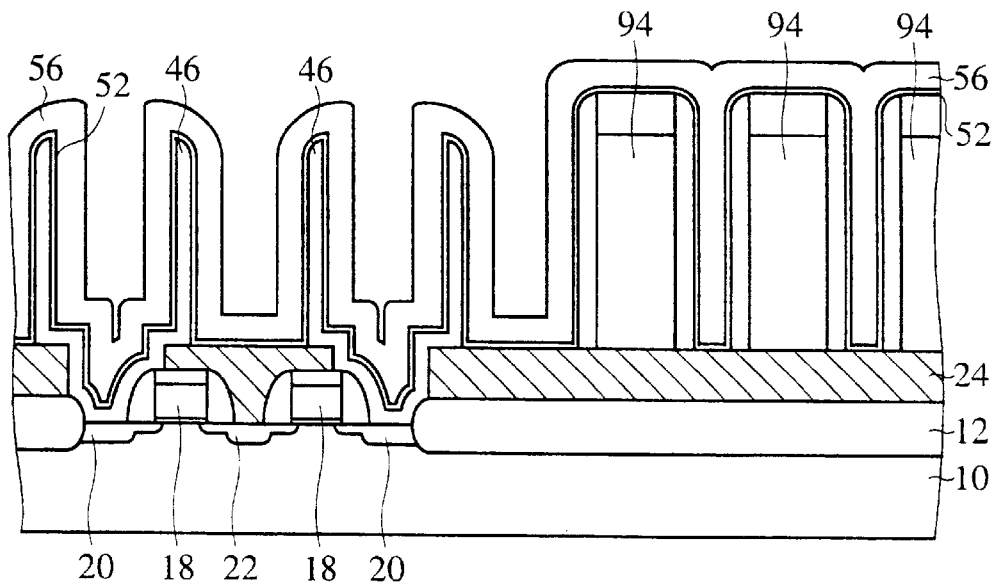

Subsequently, an about 100 nm-thick doped polycrystalline silicon film, for example, is deposited and patterned to form the opposed electrode 56 of the polycrystalline silicon film. At this time, the opposed electrode 56 is formed extending over the dummy electrode 94 (FIG. 30B). Thus, a capacitor including the crown-shaped electrode is formed. In the semiconductor device shown in FIG. 30B, the opposed electrode 56 is buried between the adjacent dummy electrodes 94 but is not essentially buried.

Figure 31A:
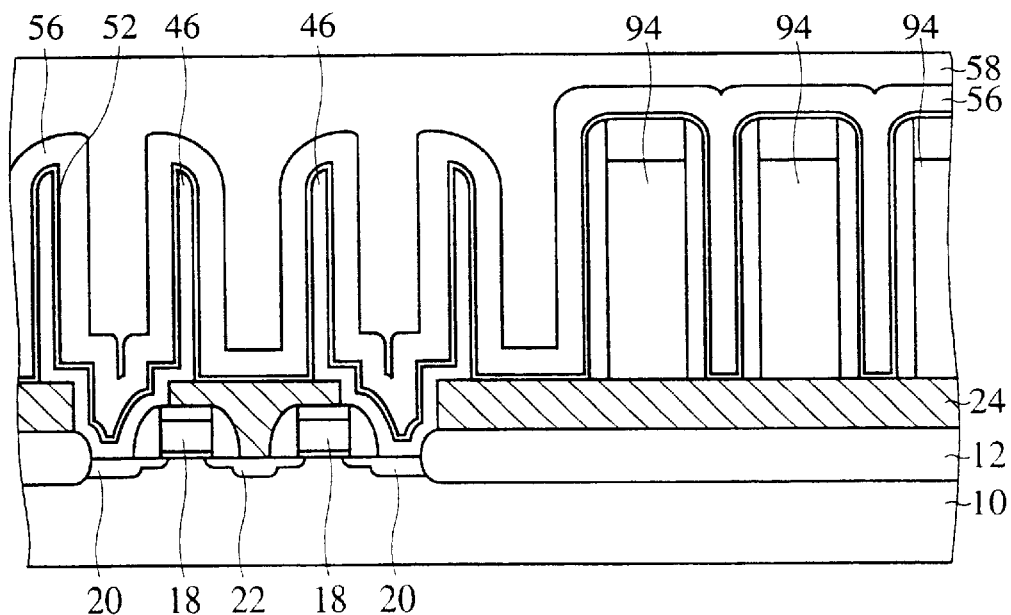

Then, an about 2.0 μm-thick silicon oxide film is deposited by, e.g., CVD method, and the surface of the silicon oxide film is polished by CMP method. Thus the inter-layer insulation film 58 having the surface planarized is formed (FIG. 31A).

Next, a contact hole is opened in the inter-layer insulation film 58 on the dummy electrode 94, which reaches the opposed electrode 56. At this time, simultaneously therewith a contact hole which arrives at the pillar-shaped structure 78 is formed on the pillar-shaped structure 78 in the peripheral circuit region (see FIG. 20B).

At this time, the region for the contact hole to be opened in is raised by the dummy electrode 94 or the pillar-shaped structure 78, and the contact of the memory cell region and that of the peripheral circuit region are on substantially the same level. Accordingly, without sufficiently planarizing the inter-layer insulation film 58, the contact hole to be opened on the opposed electrode 56 and the contact hole for the peripheral circuit can be simultaneously formed without considering the problem of depth of focus.

The opposed electrode 56 in the region for the opening to be formed in is raised by the dummy electrode 94, which allows the contact hole opened on the opposed electrode 56 to be shallow. This facilitates the processing of the contact hole.

Subsequently, the cap film 74 exposed in the contact in the peripheral circuit region is selectively removed by wet etching with, e.g., phosphoric acid. This exposes the contact plug of the tungsten film 72 in the contact in the peripheral circuit region.

Figure 31B:
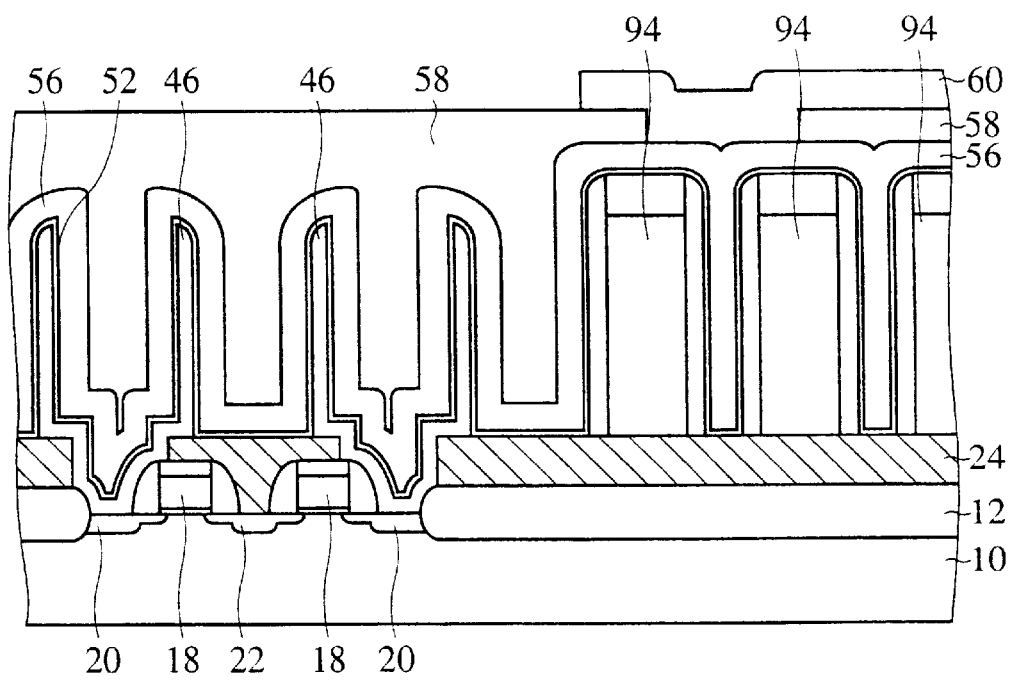

Then, the interconnection 60 connected to the opposed electrode 56, and an interconnection 62 connected to the tungsten film 72 are formed on the inter-layer insulation film 58 (FIG. 31B and FIG. 18B).

As described above, according to the present invention, the dummy electrode 94 of the same conducting layer as the contact plug in the peripheral circuit region is formed in the memory cell region, and the opposed electrode 56 is extended over the dummy electrode 94 to connect the opposed electrode 56 to the interconnection 60 on the dummy electrode 94. This permits the interconnection 60 to be led from the opposed electrode 56 without adding to the fabrication steps.

In the above-described embodiment, the polishing of the inter-layer insulation film 58 is stopped before the polishing reaches the opposed electrode 56 but may be set on until the opposed electrode 56 on the dummy electrode 94 is exposed, for example.

Figure 32A:
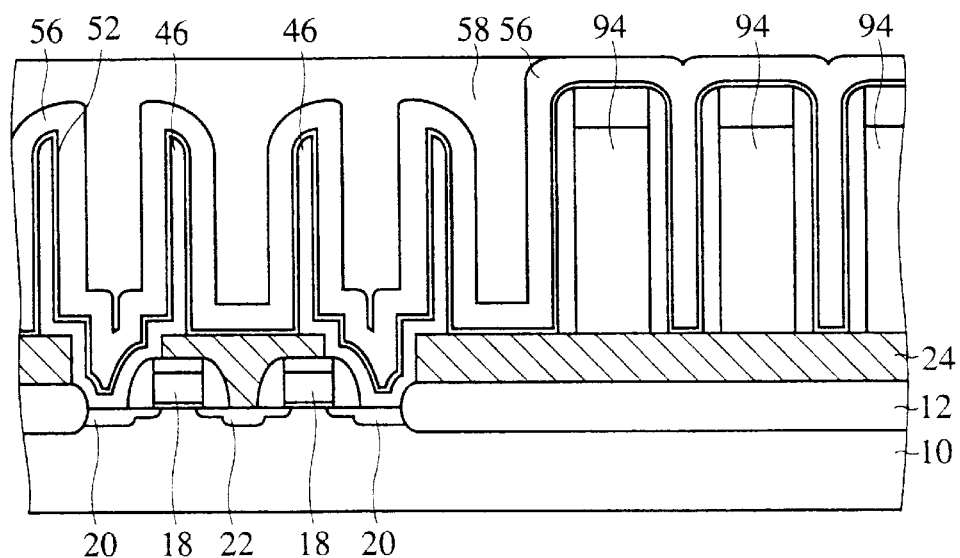
FIGS. 32A–32B and 33A–33B are sectional views of the semiconductor device according to a modification of the tenth embodiment of the present invention in the steps of the method for fabricating the same, which explain the method.

At this time, because the opposed electrode 56 is formed on the dummy electrode 94, the opposed electrode 56 is higher than the pillar-shaped structure 78 in the peripheral circuit region by a thickness of the opposed electrode 56, but by making a polishing speed for the inter-layer insulation film 58 of silicon oxide film is sufficiently higher than that for the opposed electrode of polycrystalline silicon film, the pillar-shaped structure 78 can be exposed substantially at the same time that the opposed electrode 56 on the dummy electrode 94 is exposed (FIG. 32A and FIG. 18B).

Figure 32B:
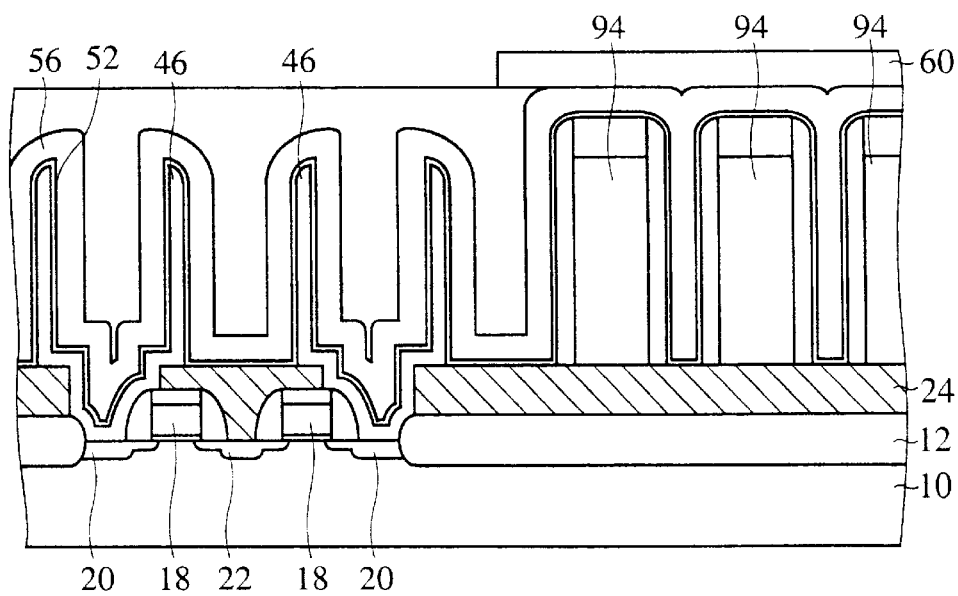

Then, the interconnection 60 connected to the opposed electrode 56 on the dummy electrode 94 exposed on the surface is formed, whereby the interconnection 60 can be led from the opposed electrode 56 without opening a contact hole in the memory cell region (FIG. 32B).

Figure 33A:
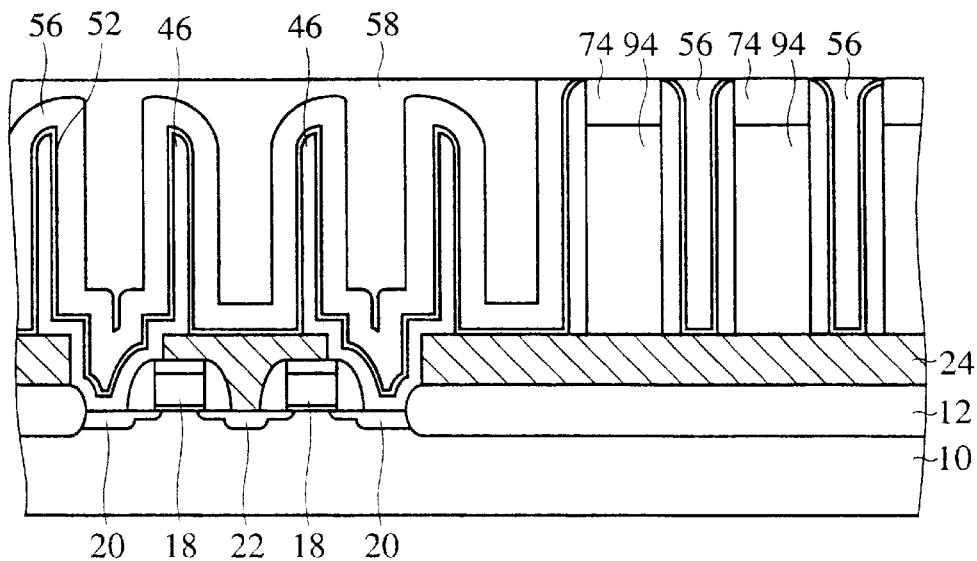

The inter-layer insulation film 58 may be polished until the cap film 74 on the dummy electrode 94 is exposed (FIG. 33A). This removes the opposed electrode 56 on the dummy electrode 94, but the opposed electrodes 56 buried in a mesh between the adjacent dummy electrodes 94 can be exposed on the surface by the polishing.

Figure 33B:
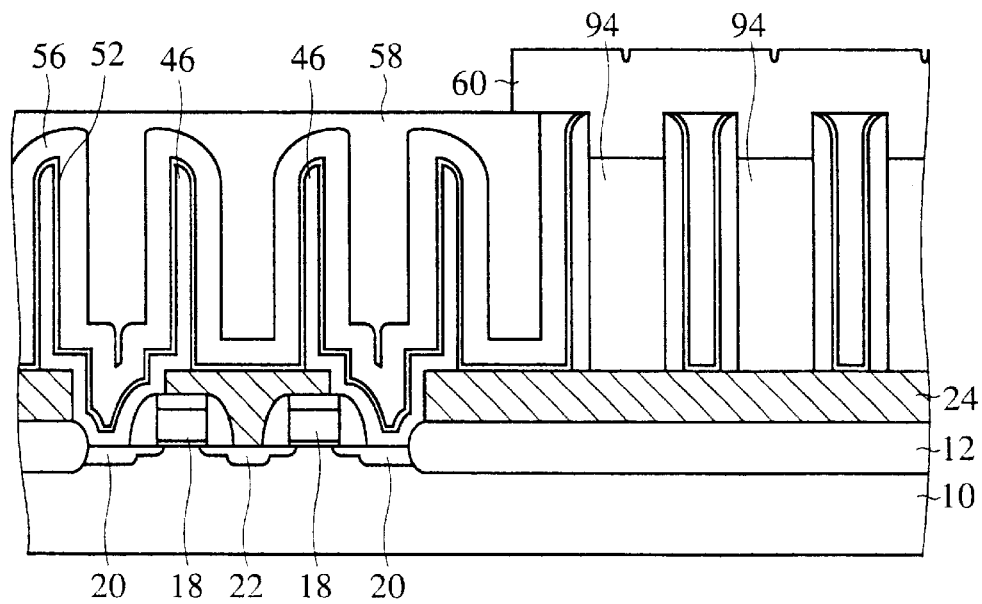

Then, the cap film 74 exposed in the peripheral circuit region, and the cap film 74 on the dummy electrode 94 are simultaneously removed to form the interconnection thereon, whereby the interconnection 60 connected to the opposed electrode 56, and the interconnection 62 connected to the peripheral circuit can be simultaneously formed (FIG. 33B and FIG. 15). The interconnection 60 is connected also to the dummy electrode 94, but the dummy electrode 94 is not connected to the other devices. There is no problem.

The present embodiment shows the case that the cap film 50 of silicon nitride film is formed on the storage electrode 46 and the pillar-shaped conductor 48, but in place of silicon nitride film, the cap film 50 may be of conducting film, such as polycrystalline silicon film or others.

[An Eleventh Embodiment]

The semiconductor device according to an eleventh embodiment of the present invention and the method for fabricating the same will be explained with reference to FIGS. 34 and 35A–35C. The same members of the present embodiment as those of the semiconductor device according to the first to the tenth embodiments and the method for fabricating the same are represented by the same reference numerals not to repeat or simplify their explanation.

Figure 34:
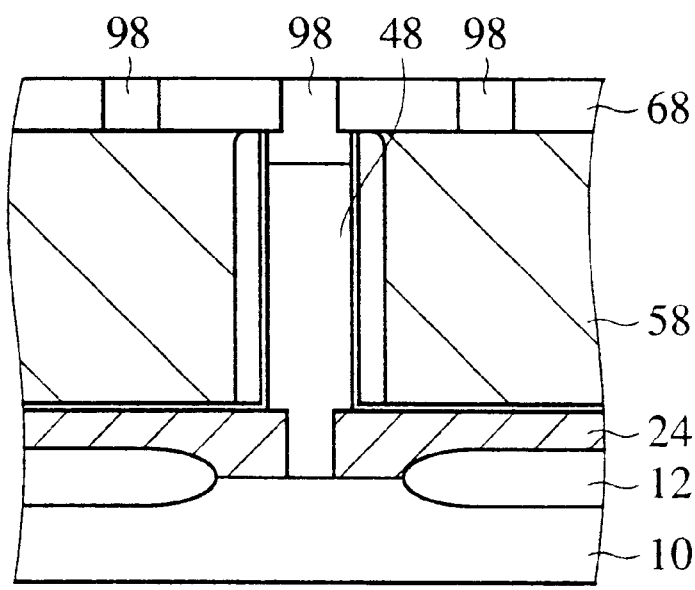
FIG. 34 is a diagrammatic sectional view of the semiconductor device according to an eleventh embodiment of the present invention, which shows a structure thereof.
Figure 35A:
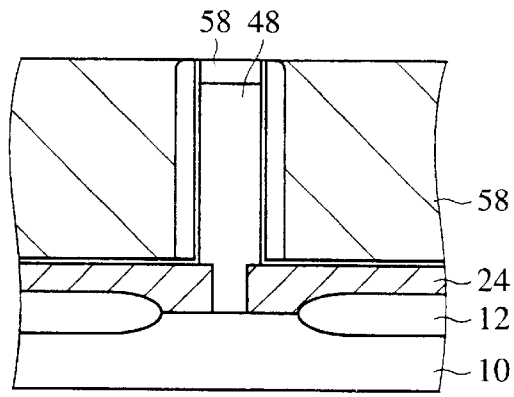
FIGS. 35A–35C are sectional views of the semiconductor device according to the eleventh embodiment of the present invention in the steps of the method for fabricating the same, which explain the method.
Figure 35B:
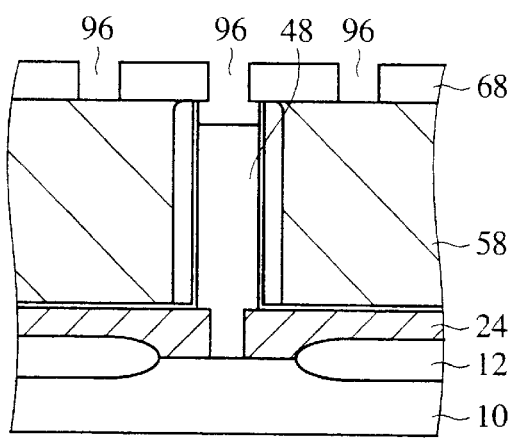
Figure 35C:
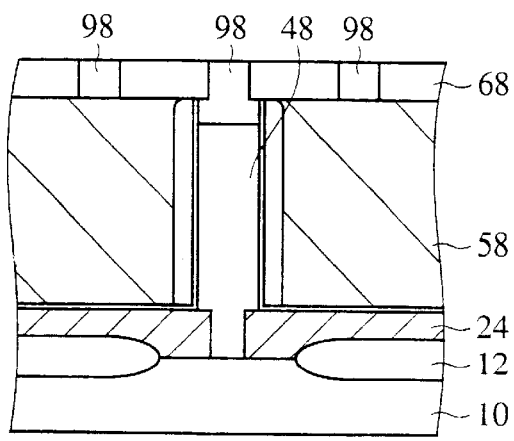

FIG. 34 is a diagrammatic sectional view of the semiconductor device according to the present embodiment, which shows a structure thereof. FIGS. 35A–35C are sectional view of the semiconductor device according to the present embodiment in the steps of the method for fabricating the same, which explain the method.

The present embodiment shows another way of leading the interconnection 62 from the contact plug in the peripheral circuit region.

In the semiconductor device according the first embodiment, the cap film 50 exposed on the polished surface of the inter-layer insulation film 58 to expose the pillar-shaped conductor 48 therebelow and form the interconnection 62 connected to the pillar-shaped conductor 48 (FIG. 4).

In addition to the method of patterning the conducting film on the inter-layer insulation film, there is a general metallization method of burying a conducting film in a groove formed in an insulation film, i.e., forming the so-called buried interconnection.

The present embodiment shows a method of forming a buried interconnection connected to a pillar-shaped conductor 48.

The semiconductor device according to the present embodiment is characterized in that, as shown in FIG. 34, an interconnection led from the pillar-shaped conductor 48 is a buried interconnection 98 buried in the inter-layer insulation film 58.

Then, the method for fabricating the semiconductor device according to the present embodiment will be explained with reference to FIGS. 35A–35C.

First, as in the same way as in the method for fabricating the semiconductor device according to the first embodiment shown in FIGS. 2A to 4A, the inter-layer insulation film 58 is planarized to expose the cap film 50 on the pillar-shaped conductor 48 connected to the peripheral circuit (FIG. 35A).

Then, the inter-layer insulation film 58 with an interconnection groove 96 extended on the cap film 50 is formed on the inter-layer insulation film 58 with the cap film 50 exposed.

Subsequently, the cap film 50 of silicon nitride film exposed in the interconnection groove 96 is etched by wet etching using, e.g., a phosphoric acid solution. The etching with phosphoric acid solution is isotropic, and all the cap film 50 on the pillar-shaped conductor 48 is removed (FIG. 35B).

Then, a conducting film, such as tungsten film or others, is formed by, e.g., CVD method, and the conducting film is left alone in the interconnection groove 96 by etching back or CMP method. Thus, the buried interconnection 98 buried in the interconnection groove 96 is formed (FIG. 35C).

By depositing the conducting film by CVD method, the buried interconnection 98 is buried also in a cavity 100 formed by removing the cap film 50, and the buried interconnection 98 is connected to the pillar-shaped conductor 48.

Thus, the buried interconnection 98 connected to the pillar-shaped conductor 48 is formed.

As described above, according to the present embodiment, the interconnection in the peripheral circuit region can be formed by the buried interconnection connected to the pillar-shaped conductor 48.

The present embodiment shows an example that the buried interconnection is applied to the semiconductor device according to the first embodiment, but the buried interconnection is applicable in the same way to the other embodiments.

[A Twelfth Embodiment]

The semiconductor device according to a twelfth embodiment of the present invention and the method for fabricating the same will be explained with reference to FIGS. 36 and 37A–37C. The same members of the present embodiment as those of the first to the eleventh embodiments are represented by the same reference numerals not to repeat or simplify their explanation.

Figure 36:
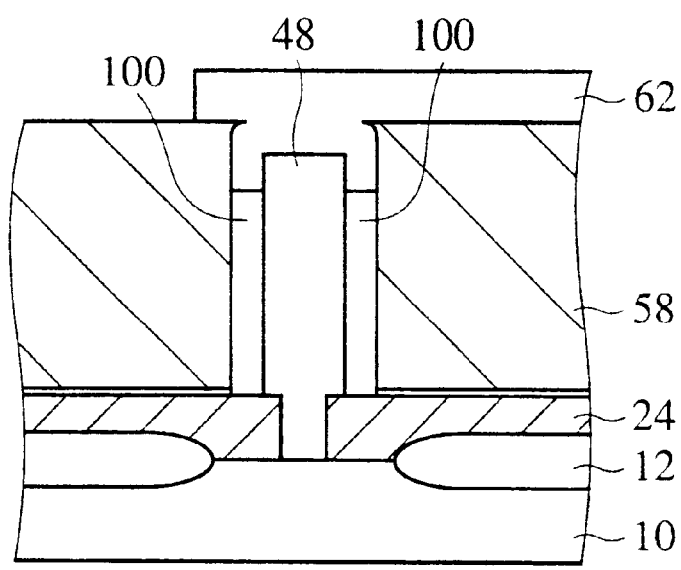
FIG. 36 is a diagrammatic sectional view of the semiconductor device according to a twelfth embodiment of the present invention, which shows a structure thereof.
Figure 37A:
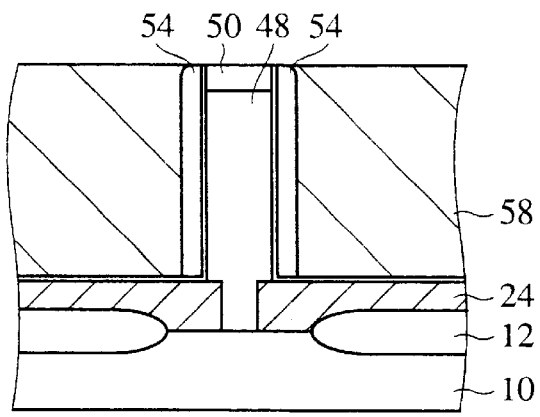
FIGS. 37A–37C are sectional views of the semiconductor device according to the twelfth embodiment of the present invention in the steps of the method for fabricating the same, which explain the method.
Figure 37B:
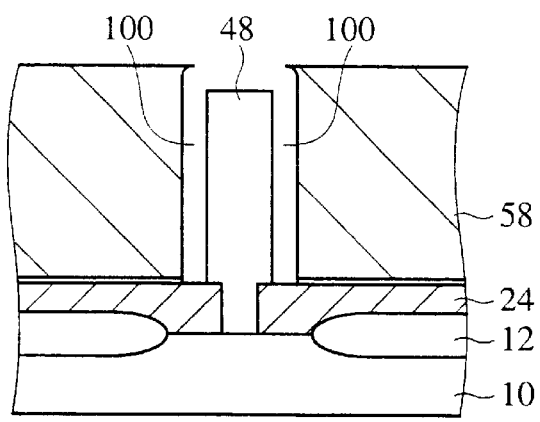
Figure 37C:
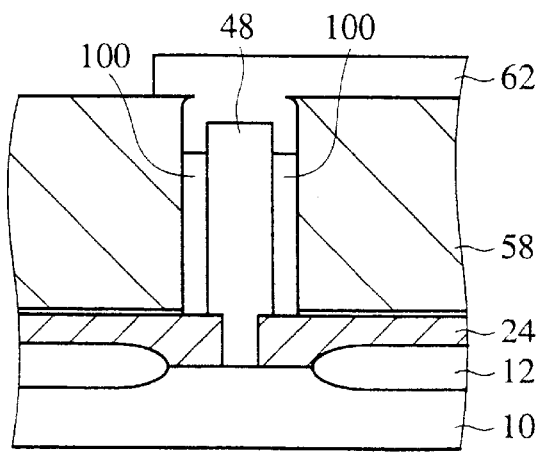

FIG. 36 is a diagrammatic sectional view of the semiconductor device according to the present embodiment, which shows a structure thereof. FIGS. 37A–37C are sectional views of the semiconductor device according to the present embodiment in the steps of the method for fabricating the same, which explain the method.

The semiconductor device according to the present embodiment is characterized in that a sidewall film 54 formed on the sidewall of the pillar-shaped conductor 48, for leading the interconnection of the peripheral circuit is removed.

That is, the sidewall film 54 formed on the sidewalls of the pillar-shaped conductor 48 is removed, and a cavity 100 is formed between the inter-layer insulation film 58 and the pillar-shaped conductor 48. An interconnection 62 formed on the inter-layer insulation film 58 is connected to the pillar-shaped conductor 48 at the top surface of the pillar-shaped conductor 48 and a part of the inside wall of the cavity 100 formed by removing the sidewall film 54.

The sidewall film 54 formed on the sidewall of the pillar-shaped conductor 48 is thus removed, whereby parasitic capacitance can be reduced.

That is, in comparison with the dielectric constant of $SiO_2$, 3.5–4.0, a dielectric constant of a gas is near to that of vacuum, substantially 1. On the other hand, a capacitance between the opposed electrodes is proportional to a dielectric constant of a material between the opposed electrodes. Accordingly, in the case of $SiO_2$, for the same area and the same distance, parasitic capacitance can be reduced to $1/3.5–1/4$ by forming the cavity.

Then, the method for fabricating the semiconductor device according to the present embodiment will be explained.

First, in the same way as in the method for fabricating the semiconductor device according to, e.g., the first embodiment shown in FIGS. 2A to 4A, the interlayer insulation film 58 is planarized to expose the cap film 50 on the pillar-shaped conductor 48 connected to the peripheral circuit (FIG. 37A).

Then, by wet etching using, e.g., a phosphoric acid solution, the cap film 50 of silicon nitride film on the pillar-shaped conductor 48 is removed.

Subsequently, the sidewall film 54 formed on the sidewalls of the pillar-shaped conductor 48 is removed by wet etching using a mixed solution of, e.g., HF and nitric acid ($HNO_3$). For example, by wet etching using, e.g., boiled phosphoric acid, the dielectric film 52 formed on the sidewalls of the pillar-shaped conductor 48 is removed. When the dielectric film 52 is thin, the dielectric film 52 may not be removed to be left as it is. Thus the cavity 100 is formed between the pillar-shaped conductor 48 and the inter-layer insulation film 58 (FIG. 37B).

Then, the interconnection 62 is formed on the interlayer insulation film 58, and the interconnection 62 is connected to the pillar-shaped conductor 48 at the top surface thereof. A part of the interconnection 62 intrudes into the cavity 100 and is also connected to the pillar-shaped conductor 48 also at the sidewalls. The cavity 100 is not completely buried with the interconnection 62.

Thus, the interconnection 62 can be connected to the pillar-shaped conductor 48 with the cavity 100 left on the sidewall of the pillar-shaped conductor 48 (FIG. 37C).

As described above, according to the present embodiment, the sidewall film 54 formed on the sidewalls of the pillar-shaped conductor 48 for leading the interconnection 62 of the peripheral circuit is removed to leave the cavity 100 on the sidewalls of the pillar-shaped conductor 48, whereby the peripheral circuit can have reduced interconnection capacitance.

In the present embodiment, the cap film 50 on the pillar-shaped conductor 48 is removed but is not essentially removed. In this case, the interconnection 62 cannot be contacted to the top surface of the pillar-shaped conductor 48 but is contacted to the pillar-shaped conductor 48 at the part of the interconnection 62 caused to intrude into the cavity 100 by removing the dielectric film 52 exposed by the removal of the sidewall film 54 (FIG. 38)

The sidewall film 54 may be removed in a case that the buried interconnection 98 of the eleventh embodiment is used.

Figure 39A:
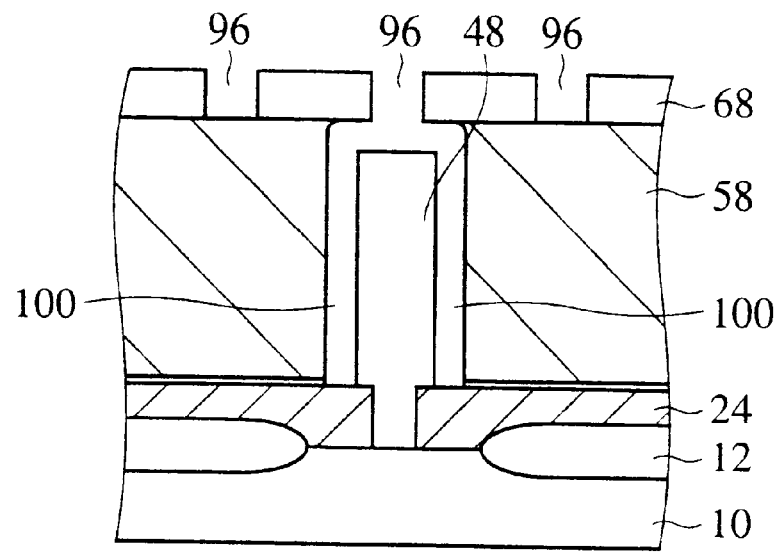
FIGS. 39A and 39B are sectional views of the semiconductor device according to the modification of the twelfth embodiment of the present invention in the steps of the method for fabricating the same, which explain a structure thereof and the method.
Figure 39B:
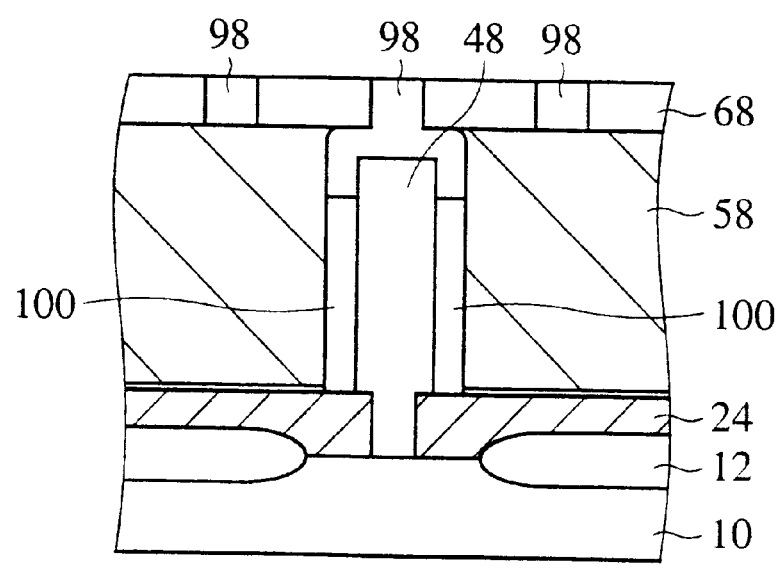

In this case, the cap film 50 sown in FIG. 35B is removed, and then the sidewall film 54 is etched through the inter-connection groove 96, whereby the cavity 100 can be formed on the sidewall of the pillar-shaped conductor 48 (FIG. 39A). Next, the buried interconnection 98 is formed in the interconnection groove 96, and the buried interconnection 98 can be connected to the top surface of the pillar-shaped conductor 48 and a part thereof (FIG. 39B).

Figure 38:
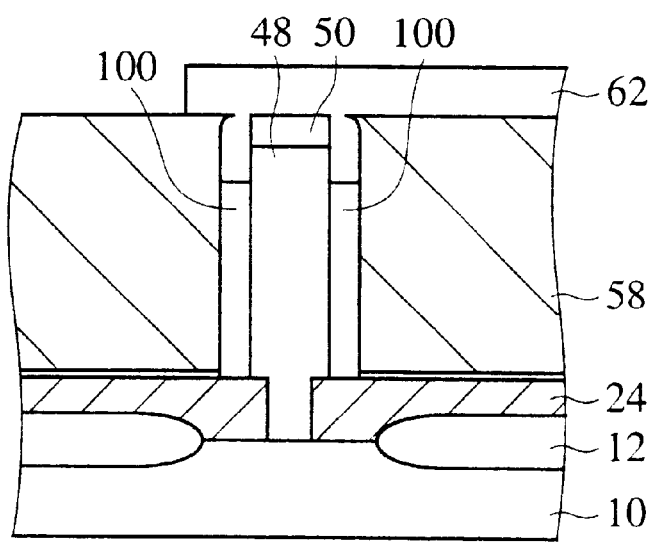
FIG. 38 is a diagrammatic sectional view of the semiconductor device according to a modification of the twelfth embodiment of the present invention, which shows a structure thereof.

It is not essential as in the case of FIG. 38 to remove the cap film 50 in the case that an opening 96 shown in FIG. 39A is wider than the pillar-shaped conductor 48 or in the case that the opening 96 is extended over the sidewall.

[A Thirteenth Embodiment]

The semiconductor device according to a thirteenth embodiment of the present invention and the method for fabricating the same will be explained with reference to FIGS. 40 and 41A–41D. The same members of the present embodiment as those of the semiconductor device according to the first to the twelfth embodiments and the method for fabricating the same are represented by the same reference numerals not to repeat or simplify their explanation.

Figure 40:
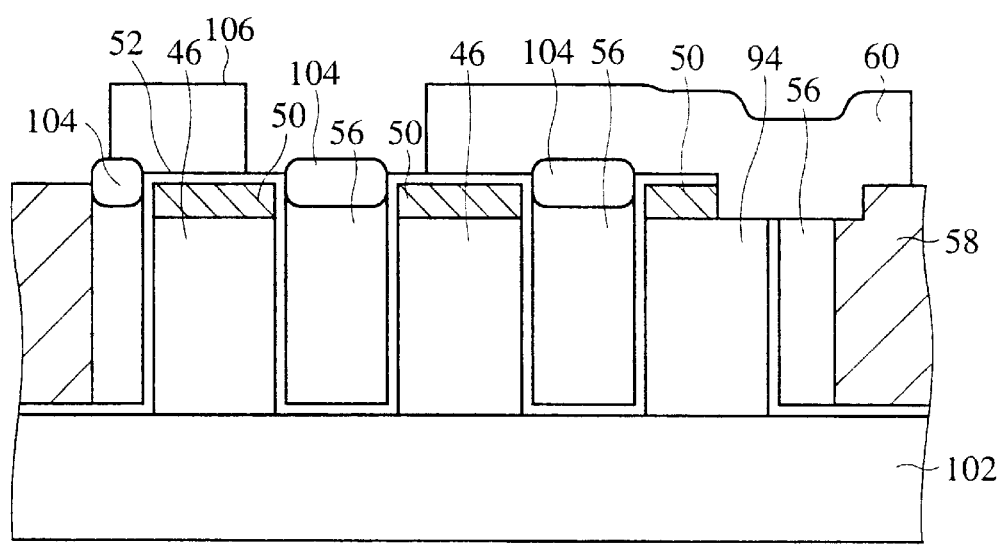
FIG. 40 is a diagrammatic sectional view of the semiconductor device according to a thirteenth embodiment of the present invention, which shows a structure thereof.

FIG. 40 is a diagrammatic sectional view of the semiconductor device according to the present embodiment, which show a structure thereof. FIGS. 41A–41D are sectional views of the semiconductor device according to the present embodiment in the steps of the method for fabricating the same, which explain the method.

In the semiconductor device according to the first to the tenth embodiments and the method for fabricating the same, an interconnection extended on the memory cell region is the interconnection 60 alone connected to the opposed electrode 56. In consideration of integration of a semiconductor device, it is often preferable that additional interconnections are provided on the memory cell region. For lower interconnection delay it is preferable that a scrapping word line is provided on the region where the capacitor is formed.

The present embodiment shows a semiconductor device and a method for fabricating the same in which additional interconnections are formed on the memory cell region without complicating fabrication process.

First, a structure of the semiconductor device according to the present embodiment will be explained with reference to FIG. 40. To simplify the drawing, the present embodiment is shown with a structure below a storage electrode and a pillar-shaped conductor omitted. For more details, reference is made to the structure of the semiconductor device according to, e.g., the ninth embodiment shown in FIG. 28.

On a base substrate 102 with memory cell transistors (not shown) formed on, storage electrodes 46 connected to a source/drain diffused layer of memory cell transistors, and dummy electrodes 94 which are not connected to any other device are spaced from each other by a prescribed interval. The top surfaces of the storage electrodes 46 and the dummy electrodes 94 are covered with a cap film 50.

The surfaces of the storage electrodes 46 and of the dummy electrode 94 are covered with a dielectric film 52. Between the storage electrodes 46 and the dummy electrodes 94 covered with the dielectric film 52 opposed electrodes 56 are buried in a mesh. Thus, the storage electrodes 46, the dielectric film 52 and the opposed electrodes 56 constitute capacitors.

A silicon oxide film 104 formed by oxidizing the opposed electrode 56 is formed on the top surface of the opposed electrode 56. Thus, the memory cell region is covered with the cap film 50, the dielectric film 52 and the silicon oxide film 104.

On the memory cell region, an interconnection 62 connected to the opposed electrode 56, and an interconnection 106 insulated by the cap layer 50 and the silicon oxide film 104 from the storage electrode 46 and the opposed electrode 56 are formed.

As described above, the present embodiment is characterized in that the surface of the opposed electrode 56 is covered with the silicon oxide film 104 to be insulated from the interconnection 106 formed thereon.

Then, the method for fabricating the semiconductor device according to the present embodiment will be explained with reference to FIGS. 41A–41D.

Figure 41A:
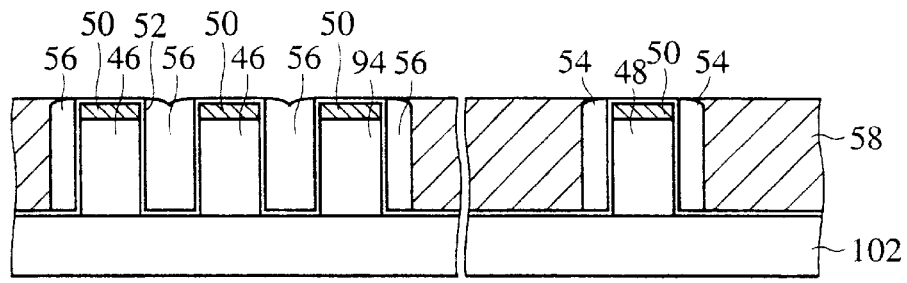
FIGS. 41A–41D are sectional views of the semiconductor device according to the thirteenth embodiment of the present invention in the steps of the method for fabricating the same, which explain the method.

First, as in the same way as shown in the method for fabricating the semiconductor device according to, e.g., the first embodiment shown in FIGS. 2A to 4A, a capacitor constituted by the storage electrode 46, the dielectric film 52 and the opposed electrode 56, and the pillar-shaped conductor 48 connected to the peripheral circuit are formed. At this time, simultaneously therewith the dummy electrode 94 of the same conducting layer as the storage electrode 46 is formed in the same way as in the semiconductor device according to, e.g., the ninth embodiment shown in FIG. 28A (FIG. 41A).

Figure 41B:
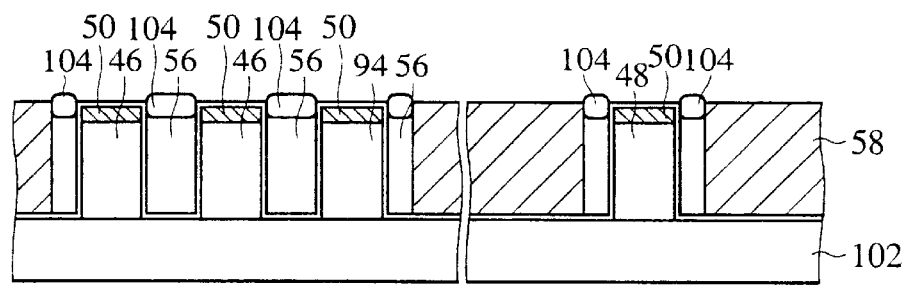

Then, the surface of the opposed electrode 56 of polycrystalline silicon film is oxidized by thermal oxidation to form the silicon oxide film 104 covering the surface of the opposed electrode 56. Thus, the top surface of the memory cell region is completely covered with the insulation film (FIG. 41B). At this time, the cap film 50, which is formed of, e.g., silicon nitride film, is not oxidized.

Subsequently, an opening is formed for connecting the interconnection to the opposed electrode 56 and the pillar-shaped conductor 48. First, a resist pattern having an opening on the opposed electrode 56 and the pillar-shaped conductor 48 is formed. At this time, the opening on the opposed electrode 56 may be extended over the dummy electrode 94 but may not be extended over the storage electrode 46.

Figure 41C:
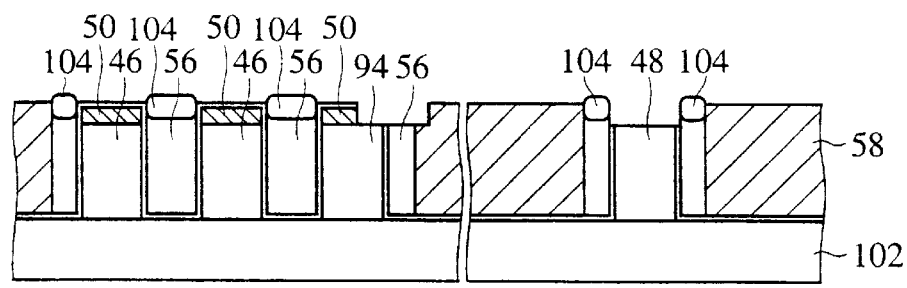

Then, the silicon oxide film 104 and the cap film 50 are removed with the resist pattern as a mask. Thus, the opposed electrode 56 is exposed in the memory cell region, and the pillar-shaped conductor 48 is exposed in the peripheral circuit region (FIG. 41C).

To contact the opposed electrode 56 and the pillar-shaped conductor 48 with each other, it is necessary to remove the silicon oxide film 104 on the opposed electrode 56 and the cap film 50 on the pillar-shaped conductor 48 are removed. In simultaneously forming, to this end, the opening on the opposed electrode 56 and the opening on the pillar-shaped conductor 48, even the cap film 50 on the storage electrode 46 is adversely removed when the cap film 50 on the pillar-shaped conductor 48 is removed, which causes a risk that the storage electrode 64 may be exposed in the openings.

In the present embodiment, however, because of the dummy electrode 94, even when the cap film 50 in the opening is removed, what is exposed is the dummy electrode 94, which causes no problem. Accordingly, the structure of the semiconductor device according to the present embodiment enables the opening on the opposed electrode 56 and the opening on the pillar-shaped conductor 48 to be formed by one lithography step.

Figure 41D:
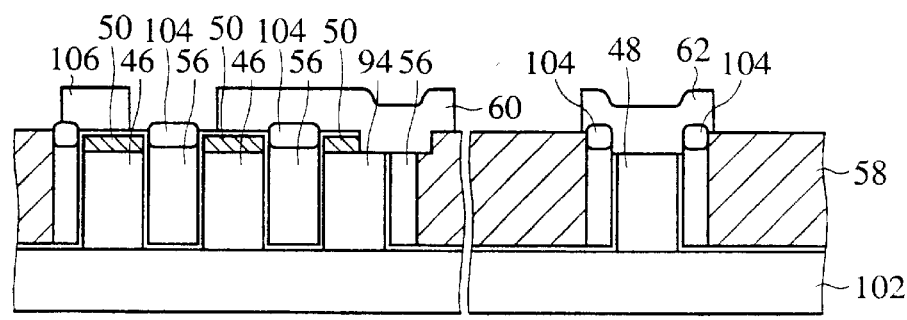

Then, the conducting film of, e.g., Al is deposited and patterned to form the interconnection 60 connected to the opposed electrode 56 and the interconnection 62 connected to the pillar-shaped conductor 48. Simultaneously therewith, an interconnection 106 extended on the memory cell region is formed (FIG. 41D).

At this time, the storage electrode 46 and the opposed electrode 56 are formed below the interconnection 106, but the interconnection 106 does not short-circuit with these electrodes 46, 56 because the top surface of the storage electrode 46 is covered with the cap film 50 and the top surface of the opposed electrode 56 is covered with silicon oxide film 104.

As described above, according to the present embodiment, the surface of the opposed electrode 56 is oxidized to be replaced by the silicon oxide film 104, whereby the entire surface of the memory cell region is covered with the insulation film. This allows not only the interconnection 62 connected to the opposed electrode 56, but also the interconnection 106 to be extended on the insulation film.

Thus, a part of the interconnection of the peripheral circuit can be extended on the memory cell region, which increases freedom degree of the interconnection layout, and this improves integration.

The provision of the dummy electrode 94 enables the opening for connecting the opposed electrode 56 to the interconnection 60, and the opening for connecting the pillar-shaped conductor 48 to the interconnection 62 to be simultaneously formed, whereby the semiconductor device can be fabricated without complicating fabrication process.

In the present embodiment, the opposed electrode 56 is thermally oxidized to cover the top surface of the memory cell region with the insulation film, but in place of the thermal oxidation, an inter-layer insulation film may be deposited on the surface.

Figure 42A:
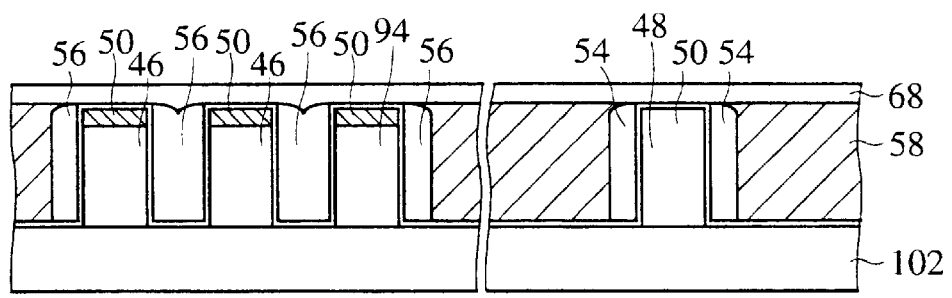
FIGS. 42A–42C are sectional views of the semiconductor device according to a modification of the thirteenth embodiment of the present invention in the steps of the method for fabricating the same, which explain a structure thereof and the method.
Figure 42B:
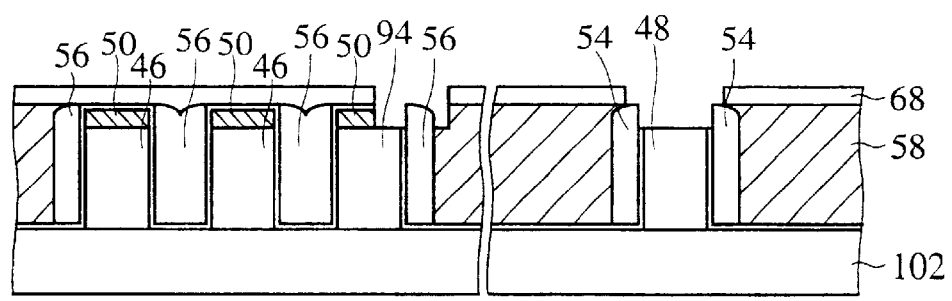
Figure 42C:
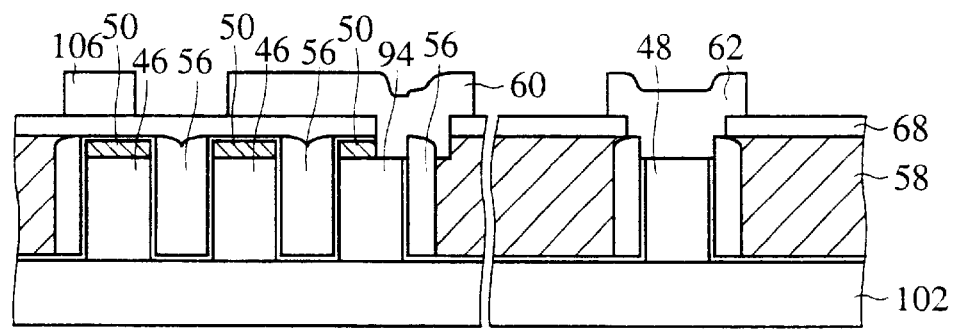

It is also possible that, for example, the inter-layer insulation film 68 is deposited after the capacitor constituted by the storage electrode 46, the dielectric film 52 and the opposed electrode 56 and the pillar shaped conductor 48 connected to the peripheral circuit are formed (FIG. 42A), the openings reaching the opposed electrode 45 and the pillar-shaped conductor 48 are formed (FIG. 42B), and then the interconnections 60, 62, 106 are formed (FIG. 42C).

[A Fourteenth Embodiment]

The semiconductor device according to a fourteenth embodiment of the present invention and the method for fabricating the same will be explained with reference to FIGS. 43A–43B, 44A–44B, 45A–45B, 46A–46B, 47A–47B, 48A–48B, 49 and 50A–50B. The same members of the present embodiment as the semiconductor device according to the first to the thirteenth embodiment and the method for fabricating the same are represented by the same reference numbers not to repeat their explanation or to simplify their explanation.

Figure 43A:
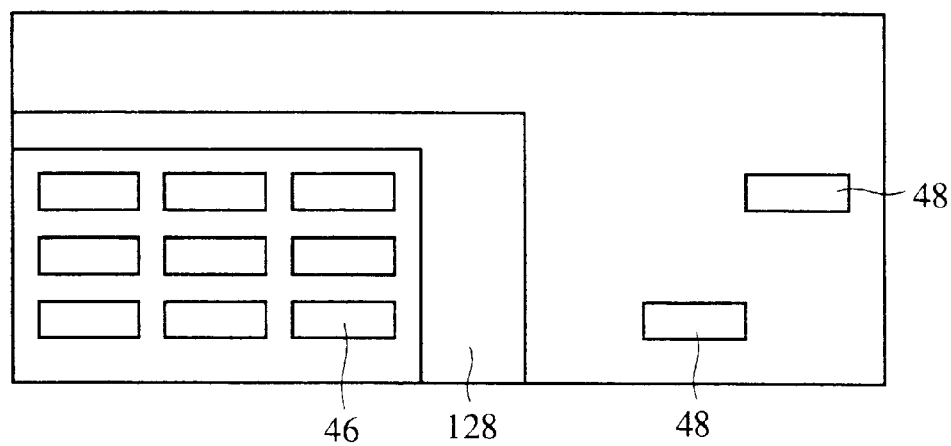
FIG. 43A is a plan view of the semiconductor device according to a fourteenth embodiment of the present invention, which shows a structure thereof.
Figure 43B:
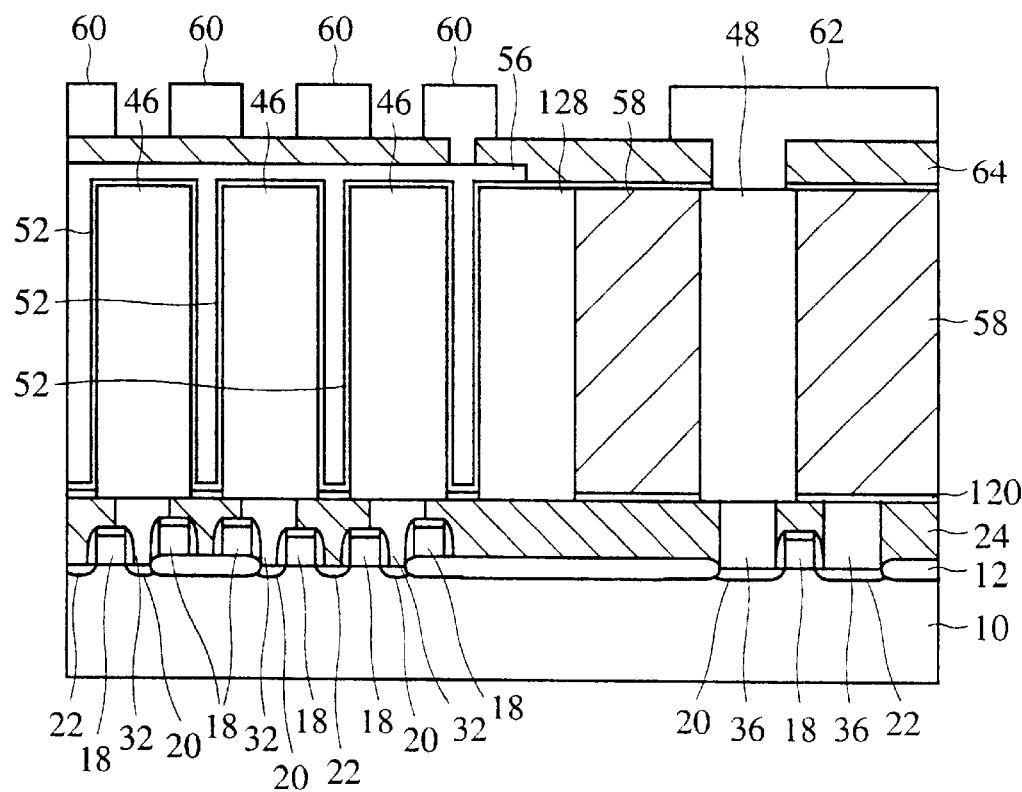
FIG. 43B is a sectional view of the semiconductor device according to a fourteenth embodiment of the present invention, which shows a structure thereof.
Figure 46A:
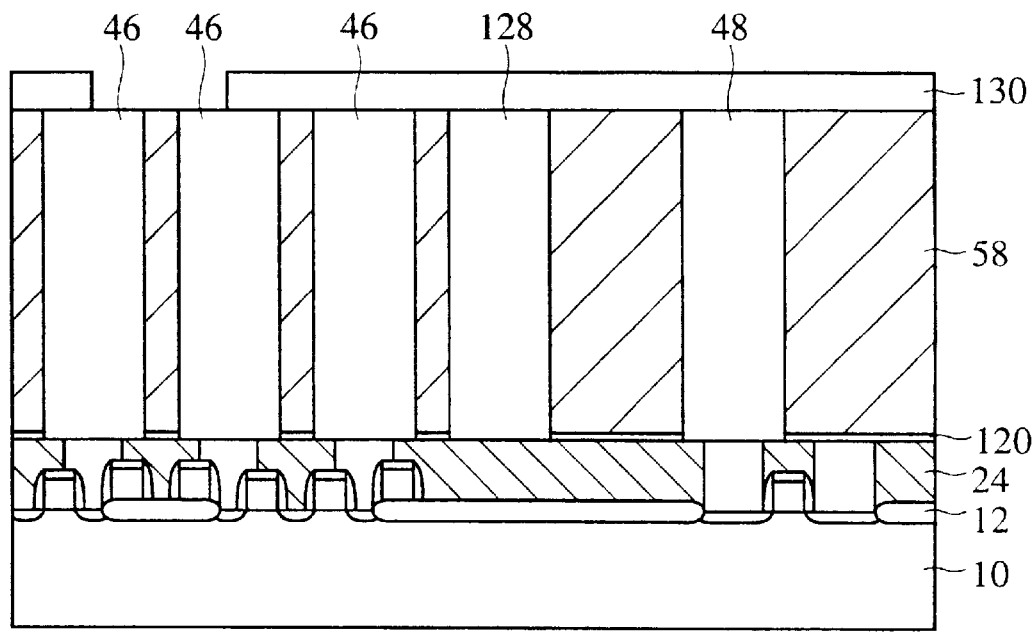
Figure 46B:
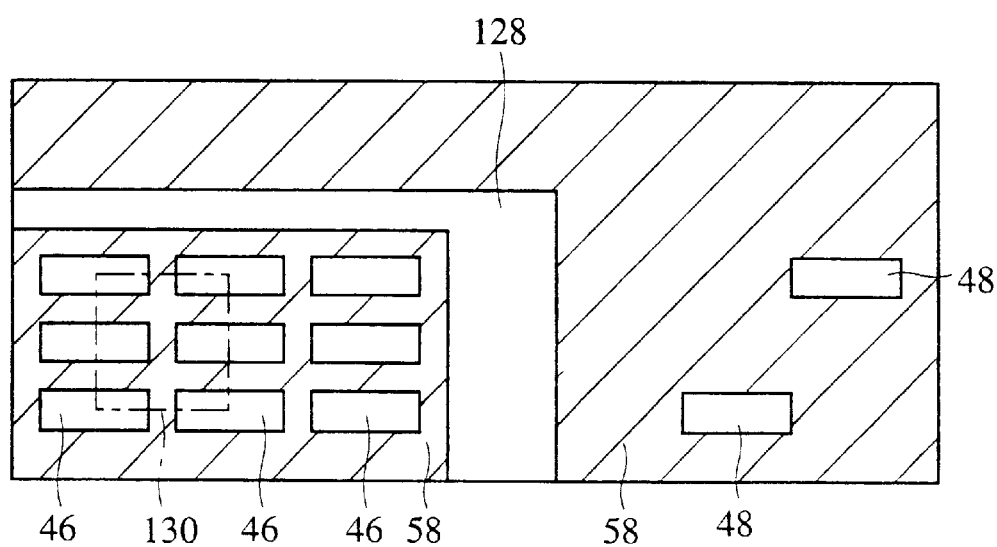
FIGS. 46B and 47B are plan views of the semiconductor device according to the fourteenth embodiment of the present invention in the steps of the method for fabricating the same, which explain the method.
Figure 47A:
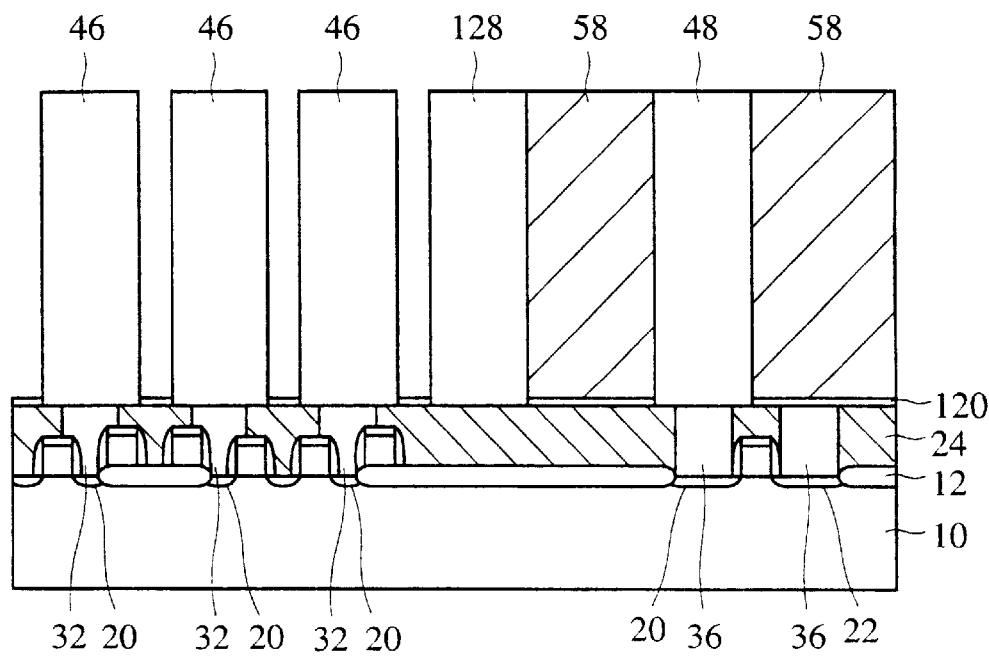
Figure 47B:
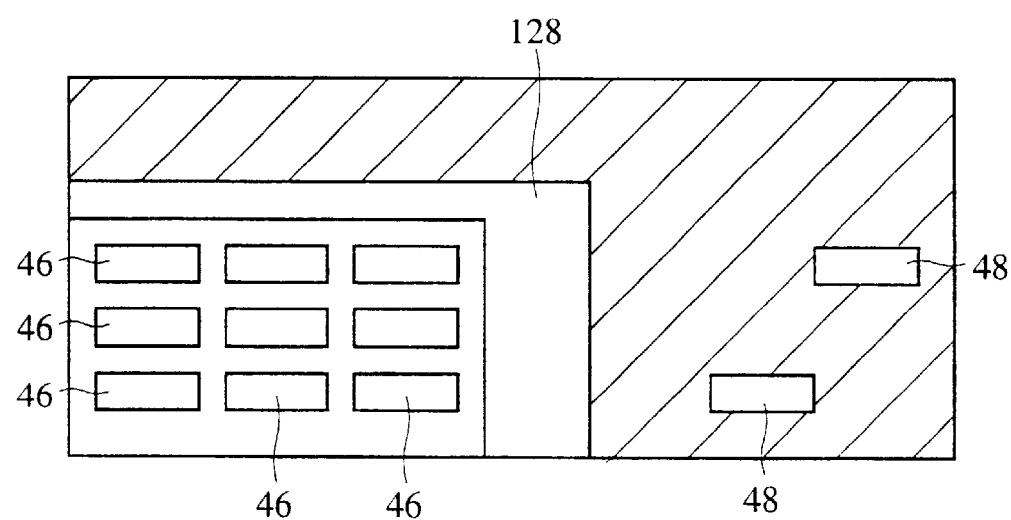
Figure 48A:
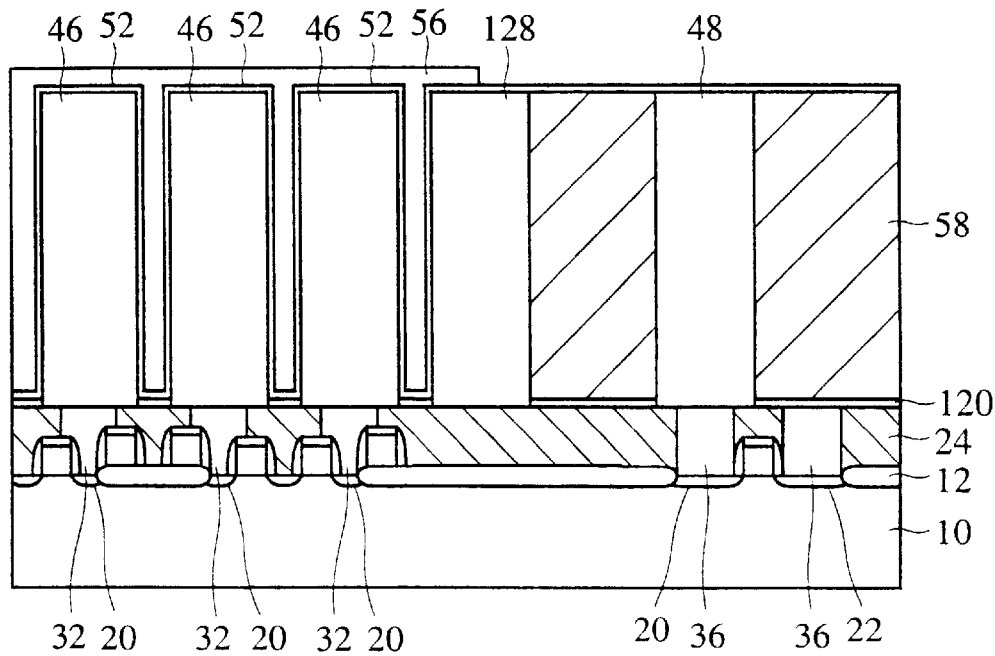
Figure 49:
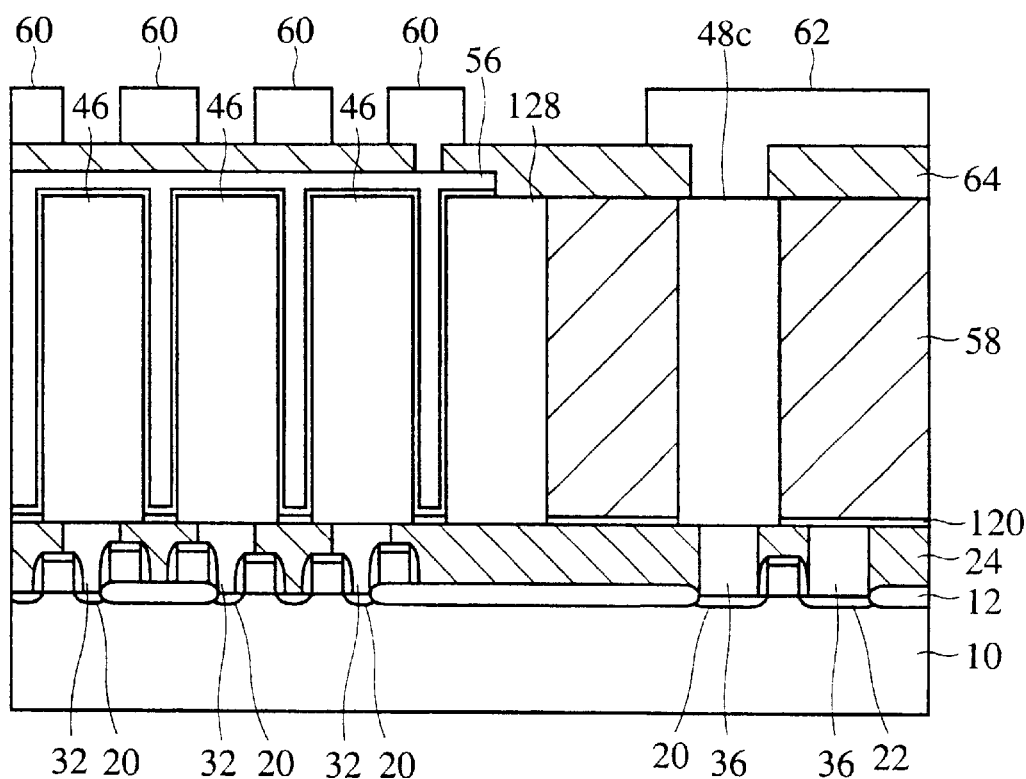
Figure 50A:
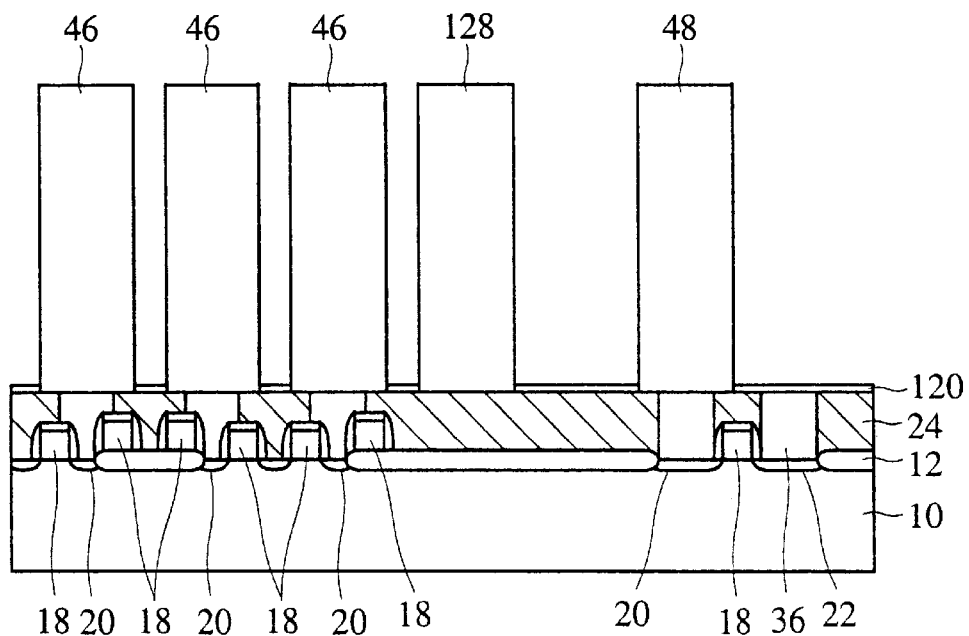
FIGS. 50A and 50B are sectional views of the semiconductor device according to a modification of the fourteenth embodiment of the present invention, in the steps of the method for fabricating the same, which explain the method.
Figure 50B:
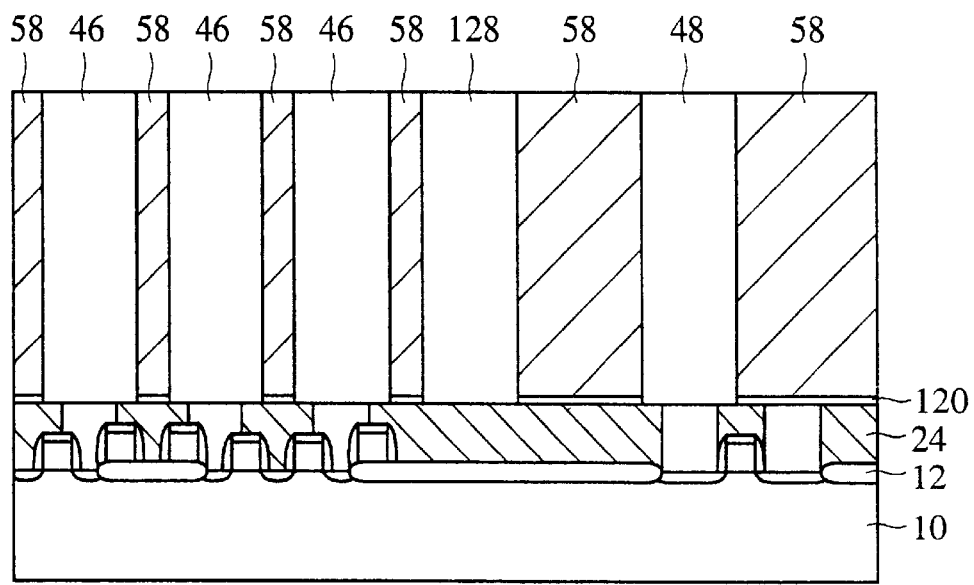

FIG. 43A is a plan view of the semiconductor device according to the present embodiment, which show the structure thereof. FIG. 43B is a sectional view of the semiconductor device according to the present embodiment, which show the structure thereof. FIGS. 44A–44B, 45A–45B, 46A, 47A, 48A–48B and 49 are sectional views of the semiconductor device according to the present embodiment in the steps of the method for fabricating the same, which show the method. FIGS. 46B and 47B are plan views of the semiconductor device according to the present embodiment in the steps of the method for fabricating the same, which show the method. FIGS. 50A–50B are sectional views of a modification of the semiconductor device according to the present embodiment in the steps of the method for fabricating the same, which explain the same.

In the method for fabricating a semiconductor device according to the first to the thirteenth embodiments, the capacitor and the contact plugs are formed, projected above the inter-layer insulation films 24, 40 and the inter-layer insulation film 58 is formed, burying the gap therebetween.

However, to form the inter-layer insulation film 58 after the capacitor and the contact plugs are formed, it is considered that the present planarization technique cannot often form the inter-layer insulation film 58 having good global flatness.

In a case, for example, that the surface of the interlayer insulation film 58 is planarized by CMP method, in a peripheral circuit where plugs are scattered, the interlayer insulation film 58 in regions remote from the plugs is often polished in a larger amounts than regions near the plugs.

It is considered that the planarization by other planarization techniques will involve various problems.

To planarize the surface of the inter-layer insulation film 58 by, e.g., reflow or melt a high temperature and/or long time thermal processing is necessary. Accordingly there is a risk that an impurity profile of the source/drain diffused layer may be changed, and transistor characteristics may be deteriorated.

It is considered that the surface of the inter-layer insulation film is planarized by repeating a plurality of planarization techniques, but unpreferably especially from the viewpoint of fabrication costs this results in a larger number of fabrication steps.

The semiconductor device according to the present embodiment and the method for fabricating the same can include the inter-layer insulation film having improved global flatness without complicated fabrication steps.

First, the structure of the semiconductor device according to the present embodiment will be explained with reference to FIGS. 43A and 43B. FIG. 43A is a plan view of the semiconductor device according to the present embodiment, which shows the structure thereof. FIG. 43B is a diagrammatic sectional view of the semiconductor device according to the present embodiment, which shows the structure thereof.

A memory cell transistor comprising a gate electrode 18 and a source/drain diffused layer 20, 22 is formed in a prescribed region on a semiconductor substrate 10 defined by a device isolation film 12.

On the semiconductor substrate 10 with the memory cell transistor formed on, an inter-layer insulation film 24 with a plug 32 buried on the source/drain diffused layer 20 is formed.

On the inter-layer insulation film 24, a pillar-shaped storage electrode 46 is formed, connected to the source/drain diffused layer 20 through the plug 32 and projected from the inter-layer insulation film 24. An opposed electrode 56 is formed on the sidewalls and the top surface of the storage electrode 46 through a dielectric film 52, and a gap between the storage electrode 46 and an adjacent storage electrode 46 is buried with the opposed electrode 56. Thus, a capacitor comprising the storage electrode 46, the dielectric film 52 and the opposed electrode 56 is constituted.

On the periphery of a cell array region in which memory cells comprising the thus-formed memory cell transistors and capacitors there is formed an annular dummy electrode 128 surrounding the cell array region. The annular dummy electrode 128 is formed, projected from the inter-layer insulation film, and has a height substantially equal to that of the storage electrode 46. In the present embodiment, the annular structure is called "an annular dummy electrode" for convenience, but the annular dummy electrode 128 is not essentially formed of a conducting material. The annular dummy electrode 128 can produce the effect of the present embodiment as long as the electrode 128 is formed of a material having etching selectivity with respect to an inter-layer insulation film 58 which will be described later.

On the other hand, in a peripheral circuit region adjacent to the memory cell region, a pillar-shaped conductor 48 is formed, connected to the semiconductor substrate 10 through a plug 36, and plays the role of electrically connecting an interconnection 62 formed above to the semiconductor substrate 10.

The inter-layer insulation film 58 is formed on the inter-layer insulation film 24 in regions where the storage electrode 46 or the pillar-shaped conductor 48 is not formed. A surface formed by the storage electrode 46, the pillar-shaped conductor 48, the annular dummy electrode 128 and the inter-layer insulation film 58 is substantially made flat.

On the opposed electrode 56, an interconnection 60 is formed through an inter-layer insulation film 64, connected to the opposed electrode 56. On the pillar-shaped conductor 48, an interconnection 62 is formed through an inter-layer insulation film 64, connected to the pillar-shaped conductor 48.

As described above, the semiconductor device according to the present embodiment is characterized in that the annular dummy electrode 128 surrounding the cell array is formed in the periphery of the cell array. The annular dummy electrode 128 is thus formed, whereby various merits are obtained in the fabrication process of the semiconductor device.

Advantages of the semiconductor device according to the present embodiment will be detailed in accordance with the fabrication process.

Figure 44A:
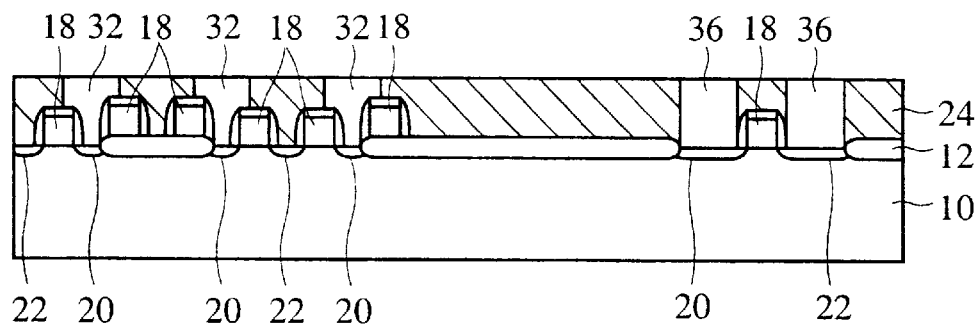
FIGS. 44A–44B, 45A–45B, 46A, 47A, 48A–48B and 49 are sectional views of the semiconductor device according to the fourteenth embodiment of the present invention in the steps of the method for fabricating the same, which explain the method.

First, in the same way as the method for fabricating the semiconductor device according to the first embodiment shown in FIGS. 2A to 2D, the memory cell transistor formed in the deice region 14, the transistor constituting the peripheral circuit formed in the device region 16, the plug 32 buried in the inter-layer insulation film 24 and connected to the source/drain diffused layer 20, and the plug 36 connected to the transistor constituting the peripheral circuit are formed (FIG. 44A).

Figure 44B:
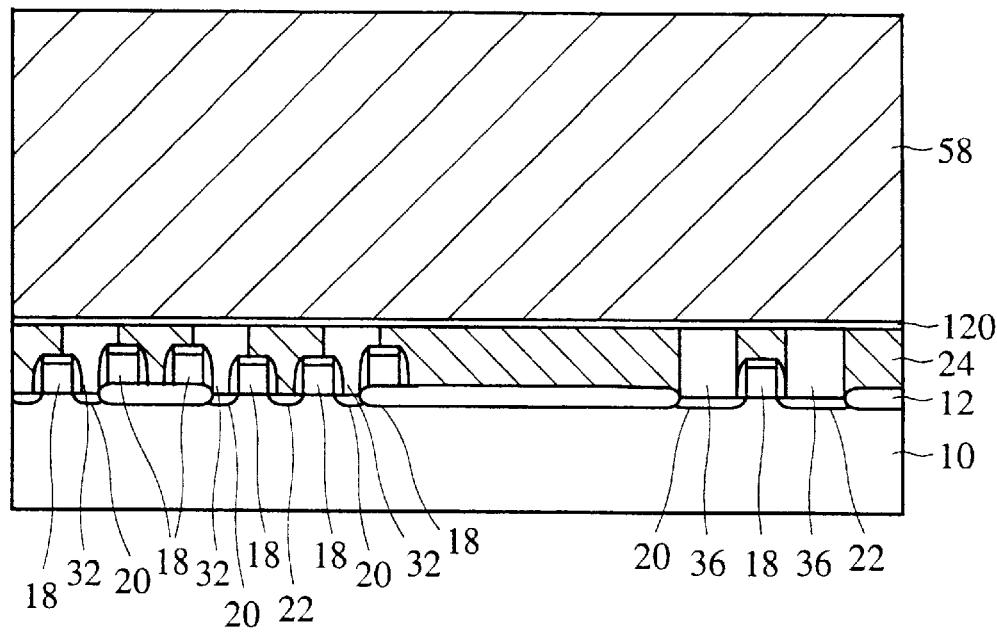

Then, the silicon nitride film 120 and the inter-layer insulation film 58 formed of a silicon oxide film are formed on the inter-layer insulation film 24 with the plugs 32, 36 buried in (FIG. 44B). The silicon nitride film 120 acts as a stopper for etching the inter-layer insulation film 58. The inter-layer insulation film 58 is formed of, e.g., a silicon oxide film doped with an impurity, such as BPSG or others, a non-doped silicon oxide film, or others. The base structure for the inter-layer insulation film 58 to be deposited on is planarized, whereby the inter-layer insulation film 58 can have good global flatness. The planarization of the base structure is easier than that of the inter-layer insulation film 58, and the above-described various problems can be easily removed.

In a device in which the global flatness of the interlayer insulation film 58 is very important, it is preferable that the inter-layer insulation film having good flatness is deposited in advance.

Figure 45A:
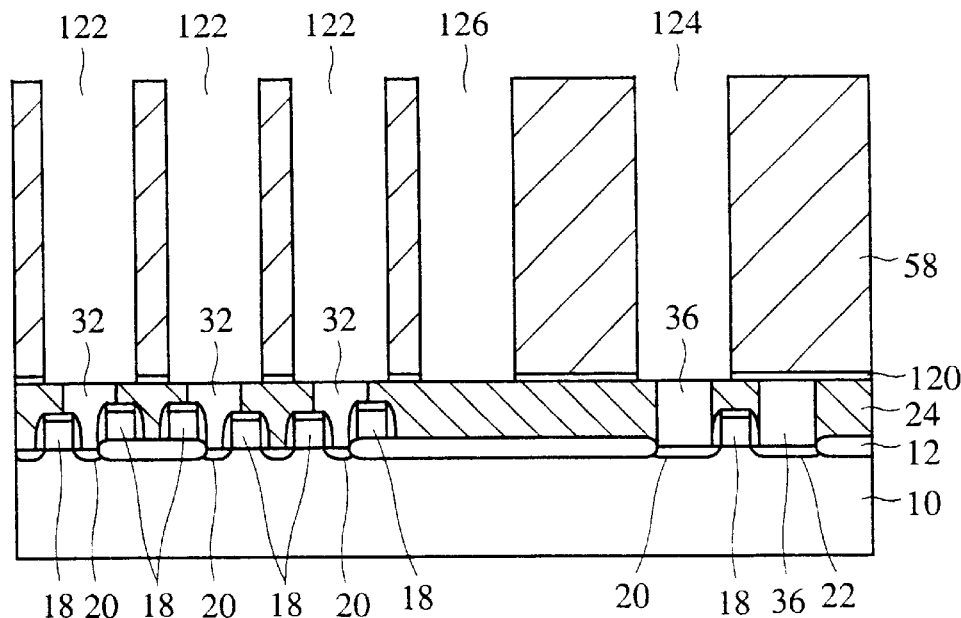

Subsequently, the inter-layer insulation film 58 and the silicon nitride film 120 are patterned by the usual lithography and etching to form the opening 122 for exposing the plug 32, and an opening 124 for exposing the plug 36, and an annular opening 126 for surrounding a cell array region with the opening 122 formed in (FIG. 45A).

Then, a conductor film of, e.g., an impurity-doped polycrystalline silicon film is deposited on the interlayer insulation film 58 with the openings 122, 124, 126 formed in. The conductor film is buried in the openings 122, 124, 126 and connected to the plugs 32, 36 on the bottoms of the openings 122, 124.

Figure 45B:
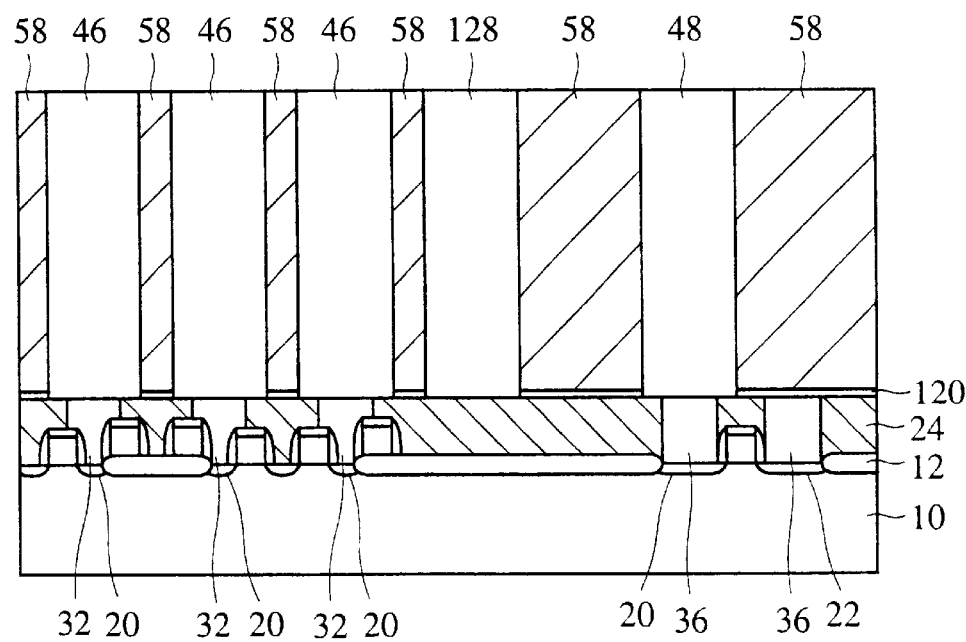

Then, the conductor film on the inter-layer insulation film 58 is selectively removed by, e.g., CMP method or etching-back to bury the conductor film only in the openings 122, 124, 126. Thus, the storage electrode 46 buried in the opening 122, the pillar-shaped conductor 48 buried in the opening 124, and the annular dummy electrode 128 buried in the opening 126 are formed (FIG. 45B).

In the present embodiment, the openings 122, 124, 126 are concurrently opened, and the conductor film is concurrently buried in these openings, but it is possible that the openings are opened at different times from each other, and the conductor film is buried at different times from each other. The latter is especially significant to a case that the openings 122, 124, 126 have etching characteristics different from each other, and a case that the storage electrode 46, the pillar-shaped conductor 48 and the annular dummy electrode 128 must be formed of materials different from each other.

The conductor film forming the electrodes may be formed of, e.g., a polysilicon film; amorphous silicon film; metal films such as Ti, Pt, Ru, W, Cu, Ag or others; metal oxide films such as $RuO_x$, $IrO_2$; or metal nitride films such as TiN, WN or others.

Then, the inter-layer insulation film 58 in the cell array region surrounded by the annular dummy electrode 128 is selectively removed. It is preferable that in this removal a resist pattern for covering a region except at least the cell array region is formed, and the inter-layer insulation film 58 is removed by isotropic wet etching.

The wet etching is used because in anisotropic etching, such as dry etching, the etching advances gradually from the upper surface of the inter-layer insulation film 58 and accordingly takes a long time corresponding to a thickness of the inter-layer insulation film 58, and there is a risk that the upper surface of the storage electrode 46 is exposed during the etching and deformed. In addition, in a case that the storage electrode 46 is reversely tapered, the inter-layer insulation film 58 may remain there as a sidewall film.

The use of the wet etching allows all the inter-layer insulation film 58 in the cell array region to be removed by forming a resist pattern for exposing a part of the inter-layer insulation film 58 in the cell array region. Even in a case that a resist pattern 130, for example, shown in FIG. 46A is formed, all the inter-layer insulation film 58 in the cell array region can be removed by the use of isotropic wet etching, which advances also horizontally because the inter-layer insulation film 58 is extended in a mesh all over the cell array region (FIG. 46B). Accordingly, in the lithography step of forming the resist pattern 130, because it suffices that a pattern for exposing that of the inter-layer insulation film 58 at least in the cell array region, the patterning can be conducted only by rough alignment. Thus, the lithography step can be simplified.

Because the cell array region is surrounded by the annular dummy electrode 128, there is no location where the inter-layer insulation film 58 in the cell array region is connected to the inter-layer insulation film 58 outside the cell array region. Thus, the annular dummy electrode 128 functions as an etching stopper film, so that only that of the inter-layer insulation film 58 in the cell array region can be selectively removed (FIGS. 47A and 47B). Because of the silicon nitride film 120, which has hydrofluoric acid resistance, on the inter-layer insulation film 24, the inter-layer insulation film 24 is not etched by hydrofluoric acid.

The semiconductor device according to the present embodiment includes the annular dummy electrode 128 around the cell array region, and requires an accordingly additional area. Actually, however, a region for the annular dummy electrode 128 is too much narrower than that for the cell array region to affect integration of the semiconductor device. In forming a storage electrode 46 that of a pattern of the storage electrode at the peripheral edge of a cell array is often deformed by peripheral affection in a lithography step, and for the prevention of this, a dummy pattern is often provided. In this case, the dummy pattern is provided by the annular dummy electrode 128, whereby the effect of the present embodiment can be achieved by suppressing area increase of the pattern.

Then, a silicon nitride film is formed by, e.g., CVD method, and the surface of the silicon nitride film is oxidized in wet atmosphere to form the dielectric film 52 of, e.g., an about 0.1–4 nm-thick in oxide film thickness. The dielectric film 52 may be a dielectric film having a high dielectric constant of, in addition to the thus-formed silicon oxynitride film, e.g., $Ta_2O_5$, $SrBi_2Ta_2O_9$ (SBT), $BaSrTiO_3$ (BST) or others.

Next, an impurity-doped polycrystalline silicon film is deposited by, e.g. CVD method, to bury the polycrystalline silicon film in the gap between the storage electrode 46 and its adjacent one.

Subsequently the polycrystalline silicon film is patterned to form the opposed electrode 56 of the polycrystalline silicon film. A surface step formed by the opposed electrode 56 is small because the gap between the storage electrodes 46 is very narrow in the layout, and the polycrystalline silicon film may have a film thickness about a half the gap to fill the gap (FIG. 48A).

Figure 48B:
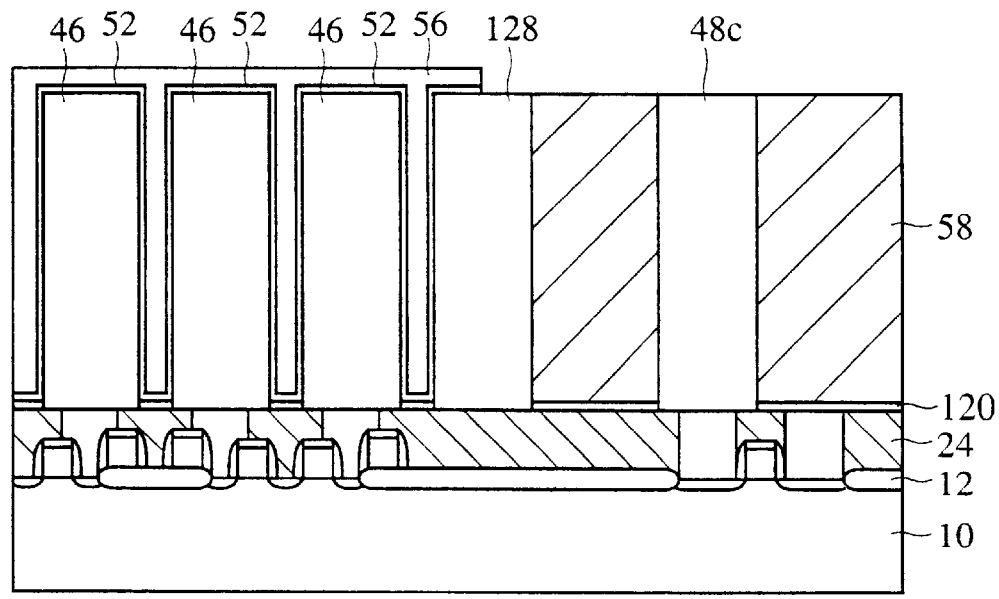

Then, in the same way as the semiconductor device according to, e.g., the third embodiment shown in FIG. 10, the pillar-shaped conductor 48 is replaced by a conducting material of low resistance (e.g., aluminum) to form the pillar-shaped conductor 48c (FIG. 48B). At this time the polycrystalline silicon film of the opposed electrode 56 may be replaced by the conducting material of low resistance.

Then, in the same way as the usual metallization process, an interconnection 60 connected to the opposed electrode 56 through the inter-layer insulation film 64 and an interconnection 62 connected to the pillar-shaped conductor 48c through the inter-layer insulation film 64 are formed. In forming the interconnection 60, 62, because the inter-layer insulation film 64 substantially ensures the flatness of the inter-layer insulation film 58, fine patterning can be conducted with a small depth of focus to open the contact holes for connecting the interconnections 60, 62 and the interconnections 60, 62 (FIG. 49).

Thus, a 1-transistor, 1-capacitor DRAM can be fabricated.

As described above, according to the present embodiment, the openings are formed after the inter-layer insulation film 58 having good global flatness is formed, and the conducting film is buried in the openings to form the storage electrode 46, and the contact plug (the pillar-shaped conductor 48) of the peripheral circuit, whereby the inter-layer insulation film 58 can have more improved surface flatness than the inter-layer insulation film formed in a case where the storage electrode and the contact plugs are formed prior to the formation of the inter-layer insulation film 58.

The storage electrode 46 and the contact plug of the peripheral circuit (the pillar-shaped conductor 48) are formed in the same step, whereby the fabrication process can be shortened, and low fabrication costs can be obtained.

Because of the annular dummy electrode 128 surrounding the cell array region, even in a case where the inter-layer insulation film 58 is formed before, the inter-layer insulation film 58 in the cell array region is selectively removed to readily ensure a space for the opposed electrode 56 to be buried in.

In the present embodiment, to give priority to the global flatness of the inter-layer insulation film 58, the inter-layer insulation film 58 is formed, and then the conductor film is buried in the openings 122, 124, 126 formed in the inter-layer insulation film 58 to form the storage electrode 46, the pillar-shaped conductor 48 and the annular dummy electrode 128. However, in a device which does not require good global flatness, it is not essential that the inter-layer insulation film 58 is formed before.

As exemplified in FIGS. 50A and 50B, it is possible that the conductor film having the surface planarized is deposited and patterned to form the storage electrode 46, the pillar-shaped conductor 48 and the annular dummy electrode 128 (FIG. 50A), and the inter-layer insulation film 58 is buried in the gaps between them (FIG. 50B). According to the semiconductor device of the present embodiment, even in a case where the storage electrode 46, the annular dummy electrode 128 and the pillar-shaped conductor 48 are formed before the inter-layer insulation film 58 are formed, the same structure can be formed without increasing a number of the fabrication steps. In the process in which the inter-layer insulation film 58 is formed after, the method for fabricating the semiconductor device according to, e.g., the first embodiment is used, whereby it is not necessary to selectively remove the inter-layer insulation film in the cell array region, and accordingly the annular dummy electrode 128 is not essential.

Global flatness depends on a planarization technique and a device layout, and accordingly it is preferable to select a fabrication process suitable to them.

Figure 51:
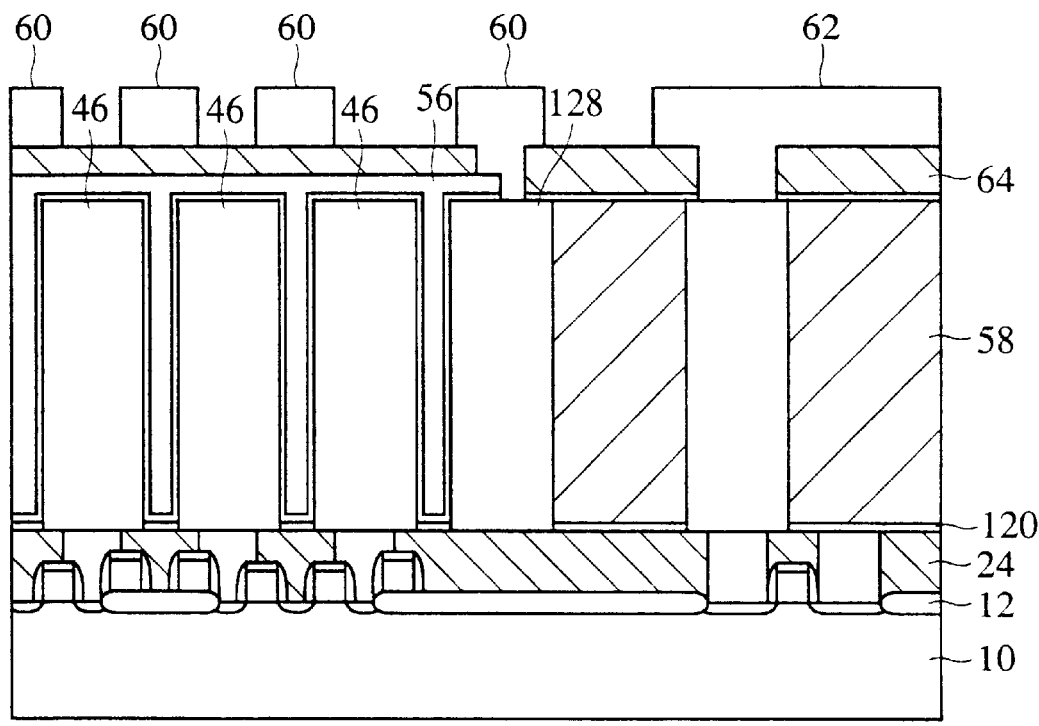
FIG. 51 is a diagrammatic sectional view of the semiconductor device according to the modification of the fourteenth embodiment of the present invention, which shows a structure thereof.
Figure 52:
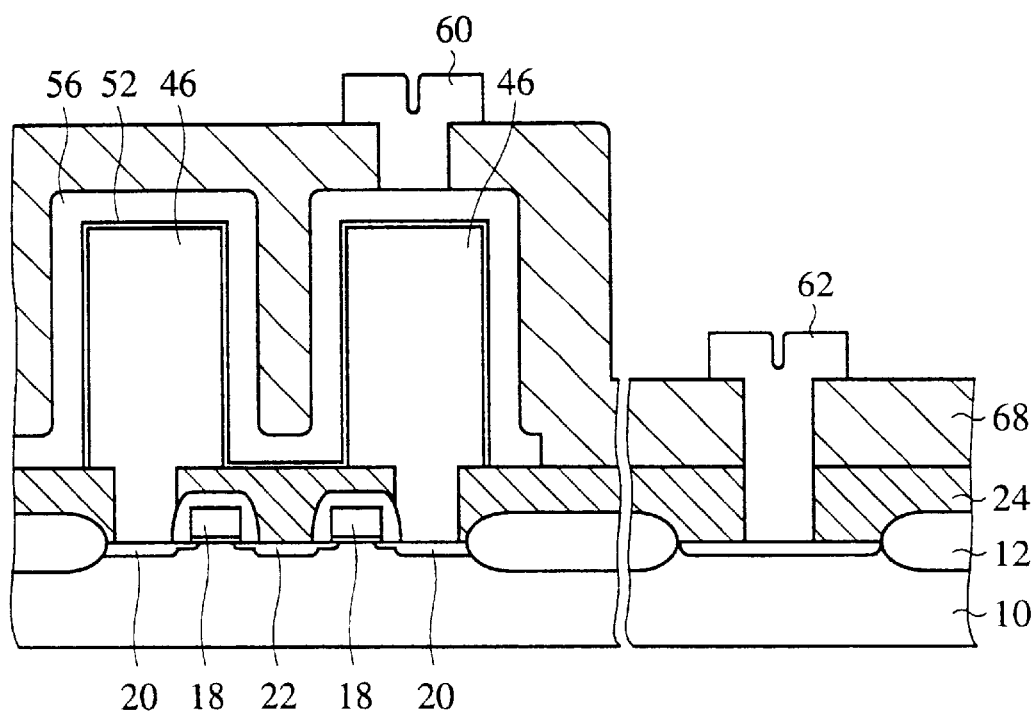
FIG. 52 is a diagrammatic sectional view of a conventional semiconductor device, which shows a structure thereof (Part 1).
Figure 53:
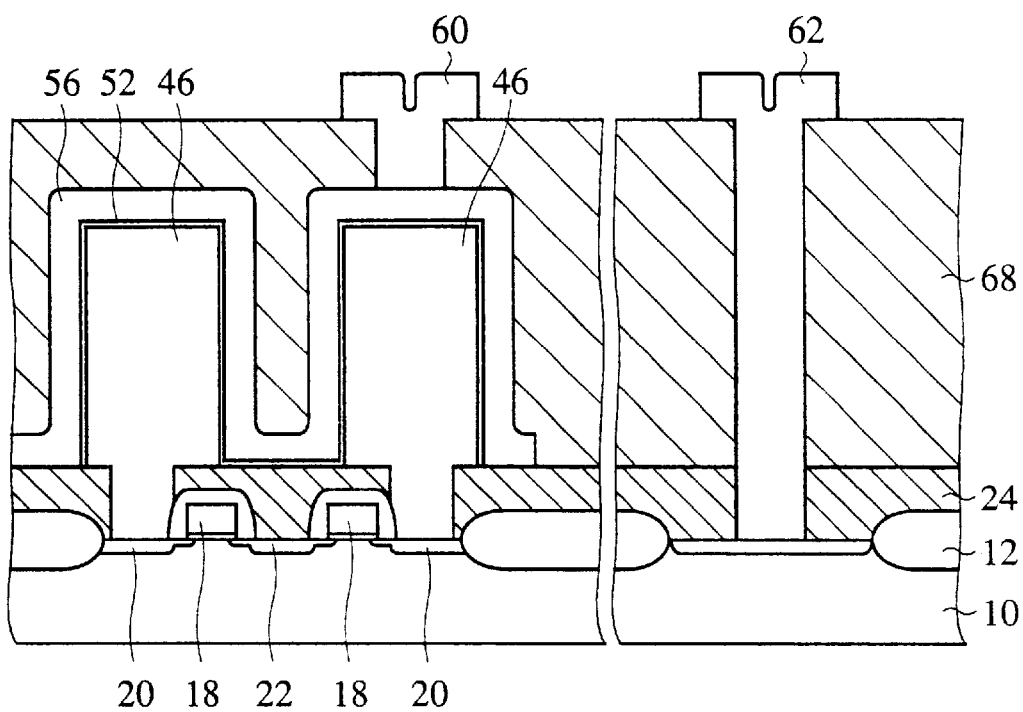
FIG. 53 is a diagrammatic sectional view of a conventional semiconductor device, which shows a structure thereof (Part 2).

In the semiconductor device according to the present embodiment, because the annular dummy electrode 128 has a floating potential as shown in FIG. 43, there is a risk that a capacitor may generate between the opposed electrode 56 and its adjacent one. To prevent such capacitor it is preferable that the annular dummy electrode 128 and the opposed electrode 56 are maintained at the same potential. As exemplified in FIG. 51, it is possible to connect the opposed electrode 56 and the annular dummy electrode 128 with each other by the interconnection 60 connected to the opposed electrode 56.

In the present embodiment, the resist pattern 120 is used as a mask for removing the inter-layer insulation film 58 in the cell array region, but an insulation film having resistance to an etchant for the inter-layer insulation film 58 may be used as the mask. A laminated film of such insulation film and a resist pattern may be used as the mask.

What is claimed is:

1. A method for fabricating a semiconductor device comprising the steps of:

forming a first conducting film on a base substrate;

forming a cap film on the first conducting film;

patterning the cap film and the first conducting film to form pillar-shaped storage electrodes having top surfaces covered with the cap film;

forming a capacitor dielectric film on the pillar-shaped storage electrodes;

forming a second conducting film on the capacitor dielectric film; and etching the second conducting film until the capacitor dielectric film in regions overlapping the top surfaces of the pillar-shaped storage electrodes is exposed to form an opposed electrode of the second conducting film on outer sidewalls of the pillar-shaped storage electrodes interposing the capacitor dielectric film therebetween, the opposed electrode being formed between the adjoining storage electrodes.

2. A method for fabricating a semiconductor device comprising the steps of:

forming a first conducting film on a base substrate;

patterning the first conducting film to form pillar-shaped storage electrodes of the first conducting film in a first region of the base substrate and a first pillar-shaped conductor of the first conducting film in a second region of the base substrate;

forming a dielectric film on the pillar-shaped storage electrodes;

forming a second conducting film on the dielectric film;

etching regions of the second conducting film overlapping top surfaces of the pillar-shaped storage electrodes to form an opposed electrode of second conducting film on sidewalls of the pillar-shaped storage electrodes interposing the dielectric film; and forming a first interconnection electrically connected to the base substrate through the first pillar-shaped conductor.

3. A method for fabricating a semiconductor device according to claim 2, wherein in the steps of forming the opposed electrode, a sidewall film of the second conducting film is further formed on a sidewall of the first pillar-shaped conductor.

4. A method for fabricating a semiconductor device according to claim 2, further comprising, after the step of forming the opposed electrode, the steps of:

depositing a first insulation film; and planarly removing the first insulation film until the top surfaces of the pillar-shaped storage electrodes and a top surface of the first pillar-shaped conductor are exposed.

5. A method for fabricating a semiconductor device according to claim 4, further comprising, after the step of forming the first insulation film, the step of:

removing the sidewall film to form a cavity between the first insulation film and the first pillar-shaped conductor.

6. A method for fabricating a semiconductor device according to claim 4, further comprising, after the step of forming the first conducting film, the step of forming a cap film on the first conducting film, wherein in the step of patterning the first conducting film, the cap film and the first conducting film are patterned to form the pillar-shaped storage electrodes and the first pillar-shaped conductor having the top surfaces covered with the cap film; and in the step of removing the first insulation film, the first insulation film is removed until a tip surface of the cap film is exposed.

7. A method for fabricating a semiconductor device according to claim 6 further comprising, after the step of removing the first insulation film, the step of:

removing the cap film on the first pillar-shaped conductor to expose the first pillar-shaped conductor.

8. A method for fabricating a semiconductor device according to claim 6, further comprising, after the step of removing the first insulation film, the steps of:

depositing a second insulation film; and forming a first opening opened on the first pillar-shaped conductor in the second insulation film; and removing the cap film on the first pillar-shaped conductor in the first opening to expose the first pillar-shaped conductor.

9. A method for fabricating a semiconductor device according to claim 8, wherein in the step of patterning the first conducting film, a second pillar-shaped conductor of the first conducting film which is not electrically connected to the base substrate and spaced from the pillar-shaped storage electrodes by a prescribed interval is formed in a third region adjacent to the first region; and in the step of forming the first opening, a second opening is further formed in the second insulation film on the opposed electrode near the second pillar-shaped conductor.

10. A method for fabricating a semiconductor device according to claim 8, wherein in the step of forming the first opening, the first opening including an interconnection groove is formed; and in the step of forming the first interconnection, the first interconnection is buried in the first opening.

11. A method for fabricating a semiconductor device according to claim 9, wherein a formation of the first opening and the second opening in the step of forming the opening and a removal of the cap film in the step of removing the cap film are conducted with one resist pattern as a mask.

12. A method for fabricating a semiconductor device according to claim 6, further comprising, after the step of removing the first insulating film, the steps of:

depositing a second insulation film; and forming a first opening opened on the opposed electrodes in the second insulation film.

13. A method for fabricating a semiconductor device according to claim 6, further comprising, after the step of removing the first insulation film, the step of:

chemically or thermally treating a surface of the opposed electrode to form a second insulation film on the surface of the opposed electrode.

14. A method for fabricating a semiconductor device according to claim 13, in which in the step of patterning the first conducting film, a second pillar-shaped conductor of the first conducting film spaced from the pillar-shaped storage electrodes at a prescribed interval and not electrically connected to the base substrate is further formed in a third region adjacent to the first region; and which further comprises, after the step of forming the second insulation film, the step of forming a first opening formed in the second insulation film on the opposed electrode near the second pillar-shaped conductor.

15. A method for fabricating a semiconductor device according to claim 6, wherein in the step of forming the first interconnection, a second interconnection connected to the opposed electrode is further formed.

16. A method for fabricating a semiconductor device according to claim 2, further comprising, after the step of pattering the first conducting film, the step of:

forming a third conducting film on the sidewalls of the pillar-shaped storage electrodes.

17. A method for fabricating a semiconductor device according to claim 2, further comprising, after the step of forming the pillar-shaped storage electrode and prior to the step of forming the first interconnection, the step of:

replacing the first conducting film forming the first pillar-shaped conductor by a third conducting film having a lower resistance value than the first conducting film.

18. A method for fabricating a semiconductor device according to claim 17, wherein in the step of replacing the first conducting film, the first conducting film of polycrystalline silicon film is exposed to a $WF_6$ gas to replace the first conducting film with a third conducting film formed of tungsten film.

19. A method for fabricating a semiconductor device comprising the steps of:

sequentially depositing a first conducting film and a second conducting film on a base substrate;

patterning the second conducting film and the first conducting film to form a pillar-shaped body of the first conducting film and the second conducting film laid the latter on the former in a first region of the base substrate and a first pillar-shaped conductor of the first conducting film and the second conducting film laid the latter on the former electrically connected to a second region of the substrate;

forming a first sidewall film of a third conducting film on a sidewall of the pillar-shaped body and a second sidewall film of the third conducting film on a sidewall of the first pillar-shaped conductor;

selectively removing the second conducting film forming the pillar-shaped body to form a crown-shaped storage electrode formed of the first conducting film and the first sidewall film;

forming a dielectric film on the crown-shaped storage electrode;

forming an opposed electrode of a fourth conducting film on the crown-shaped storage electrode interposing the dielectric film therebetween; and forming a first interconnection electrically connected to the base substrate through the first pillar-shaped conductor.

20. A method for fabricating a semiconductor device according to claim 19, further comprising, after the step of forming the pillar-shaped conductor and prior to the step of forming the first interconnection, the step of:

replacing the first conducting film forming the first pillar-shaped conductor by a third conducting film having a lower resistance value than the first conducting film.

21. A method for fabricating a semiconductor device according to claim 19, further comprising, after the step of forming the first conducting film, the steps of forming a cap film on the first conducting film, in which in the step of patterning the second conducting film and the first conducting film, the cap film and the first conducting film are patterned to form the first pillar-shaped conductor having a top surface covered with the cap film; and which further comprises, after the opposed electrode forming step, the steps of:

depositing a first insulation film;

planarly removing the first insulation film until a top surface of the cap film is exposed; and removing the cap film on the first pillar-shaped conductor to expose the first pillar-shaped conductor.

22. A method for fabricating a semiconductor device according to claim 21, wherein in the step of forming the cap film, the cap film including a fifth conducting film formed on the second conducting film and a mask film formed on the fifth conducting film is formed, the fifth conducting film having substantially the same etching characteristics as the first conducting film, and the mask film being for a mask for processing the second conducting film and the first conducting film; and in the step of removing the cap film, the mask film is removed to expose the fifth conducting film on the first pillar-shaped conductor.

23. A method for fabricating a semiconductor device according to claim 21, further comprising, after the step of removing the first insulation film, the steps of:
depositing a second insulation film; and
forming in the second insulation film a first opening formed on the first pillar-shaped conductor,
in the step of removing the cap film, the cap film exposed in the first opening is removed.

24. A method for fabricating a semiconductor device according to claim 23, wherein
in the step of forming the first interconnection, a second interconnection connected to the opposed electrode is further formed.

25. A method for fabricating a semiconductor device according to claim 23, wherein
in the step of forming the first opening, the first opening including an interconnection groove is formed; and
in the step of forming the first interconnection, the first interconnection is buried in the first opening.

26. A method for fabricating a semiconductor device according to claim 23, wherein
in the step of patterning the second conducting film and the first conducting film, a second pillar-shaped conductor of a first conducting film and a second conducting film laid the latter on the former spaced from the crown-shaped storage electrode by a prescribed interval and not connected electrically to the base substrate is formed in a third region adjacent to the first region; and
in the step of forming the first opening, a second opening opened on the opposed electrode near the second pillar-shaped conductor is further formed in the second insulation film.

27. A method for fabricating a semiconductor device according to claim 26, wherein
a formation of the first opening and the second opening in the step of forming the opening and a removal of the cap film in the step of removing the cap film are conducted with one resist pattern as a mask.

28. A method for fabricating a semiconductor device according to claim 23, wherein
in the step of forming the first interconnection, a second interconnection connected to the opposed electrode is further formed.

29. A method for fabricating a semiconductor device comprising the steps of:
forming an insulation film on a base substrate;
forming a first opening and a second opening in the insulation film, the first opening being formed in a first region of the base substrate, and the second opening being formed in a second region of the base substrate;
forming a storage electrode buried in the first opening and a first pillar-shaped conductor buried in the second opening, the storage electrode and the first pillar-shaped conductor being not extended over the insulation film;

removing the insulation film in the first region without removing the insulation film in the second region and to expose a sidewall of the storage electrode;
forming a dielectric film on the storage electrode;
forming an opposed electrode on the storage electrode interposing the dielectric film; and
forming a first interconnection electrically connected to the base substrate through the first pillar-shaped conductor.

30. A method for fabricating a semiconductor device according to claim 29, wherein
in the stet of forming the first opening and the second opening, a third opening is further formed in the insulation film, the third opening being formed in an annular region adjacent to the first region and surrounding the same;
in the step forming the storage electrode, an annular dummy electrode is formed buried in the third opening; and
in the step of removing the insulation film, the insulation film in the first region is selectively removed with the annular dummy electrode as a stopper.

31. A method for fabricating a semiconductor device according to claim 30, wherein
in the step of forming the first opening, the second opening and the third opening, the first opening, the second opening and the third opening are concurrently formed, and
in the step of forming the storage electrode, the first pillar-shaped conductor and the annular dummy electrode, the storage electrode, the first pillar-shaped conductor and the annular dummy electrode are formed of the same conducting layer.

32. A method for fabricating a semiconductor device according to claim 30,
further comprising, prior to the step of removing the insulation film, the step of:
forming a mask member on the insulation film exposing at least a partial region of the insulation film in the first region;
wherein in the step of removing the insulation film, the insulation film is removed with the mask member, as a mask.

33. A method for fabricating a semiconductor device according to claim 30, wherein
in the step of removing the insulation film, the insulation film is removed by wet etching, in which etching isotropically advances.

34. A method for fabricating a semiconductor device according to claim 29, further comprising, after the step of forming the storage electrode and prior to the step of forming the first interconnection, the step of:
replacing a first conducting film forming the first pillar-shaped conductor by a second conducting film having a lower resistance value than the first conducting film.

* * * * *